(12) United States Patent
Sato et al.

(10) Patent No.: US 7,671,609 B2
(45) Date of Patent: Mar. 2, 2010

(54) SHEET-LIKE PROBE, METHOD OF PRODUCING THE PROBE, AND APPLICATION OF THE PROBE

(75) Inventors: Katsumi Sato, Chuo-ku (JP); Kazuo Inoue, Chuo-ku (JP); Hitoshi Fujiyama, Chuo-ku (JP); Mutsuhiko Yoshioka, Chuo-ku (JP); Hisao Igarashi, Chuo-ku (JP)

(73) Assignee: JSR Corporation, Tokyo (JP)

( * ) Notice: Subject to any disclaimer, the term of this patent is extended or adjusted under 35 U.S.C. 154(b) by 604 days.

(21) Appl. No.: 11/587,485

(22) PCT Filed: Apr. 26, 2005

(86) PCT No.: PCT/JP2005/007935

§ 371 (c)(1),
(2), (4) Date: Jan. 29, 2007

(87) PCT Pub. No.: WO2005/103730

PCT Pub. Date: Nov. 3, 2005

(65) Prior Publication Data

US 2007/0200574 A1      Aug. 30, 2007

(30) Foreign Application Priority Data

Apr. 27, 2004    (JP)    .............................. 2004-132151

(51) Int. Cl.
*G01R 31/02*    (2006.01)
(52) U.S. Cl. ...................................... 324/754
(58) Field of Classification Search ......... 324/754–765; 439/482; 29/852
See application file for complete search history.

(56) References Cited

U.S. PATENT DOCUMENTS

| 4,292,261 A | 9/1981 | Kotani et al. |
| 6,215,321 B1 * | 4/2001 | Nakata ........................ 324/754 |

(Continued)

FOREIGN PATENT DOCUMENTS

JP            51-93393           8/1976

(Continued)

*Primary Examiner*—Ha Tran T Nguyen
*Assistant Examiner*—Arleen M Vazquez
(74) *Attorney, Agent, or Firm*—Oblon, Spivak, McClelland, Maier & Neustadt, L.L.P.

(57) ABSTRACT

A sheet-like probe has a porous film. In the sheet-like probe, a contact film is penetratingly supported at each position of through-holes formed in the porous film, and a peripheral edge of the contact film and the porous film are integrated such that a flexible resin insulation layer is included in a fine hole of the porous film. Electrode structure bodies are supported in a penetrating manner in the insulation layer. Each electrode structure body includes a surface electrode section exposed to the front surface of the insulation layer and projecting from the front surface of the insulation layer, a back surface electrode section exposed to the back surface of the insulation layer, a short-circuit section continuously extending from the base end of the front surface electrode section, penetrating the insulation layer in its thickness direction, and connected to the back surface electrode section, a holding section extending outward, along the front surface of the insulation layer, from the base end section of the front surface electrode section, and a supporting body supporting the insulation layer.

7 Claims, 40 Drawing Sheets

U.S. PATENT DOCUMENTS

| | | | |
|---|---|---|---|
| 6,305,230 B1 * | 10/2001 | Kasukabe et al. | 73/855 |
| 7,129,730 B2 * | 10/2006 | Liu et al. | 324/758 |
| 7,391,227 B2 * | 6/2008 | Inoue et al. | 324/754 |
| 2004/0070413 A1 * | 4/2004 | Kasukabe et al. | 324/754 |

FOREIGN PATENT DOCUMENTS

| | | |
|---|---|---|
| JP | 53-147772 | 12/1978 |
| JP | 61-250906 | 11/1986 |
| JP | 7-231019 | 8/1995 |
| JP | 11-204177 | 7/1999 |
| JP | 11-326378 | 11/1999 |
| JP | 2001 208776 | 8/2001 |
| JP | 2002 076074 | 3/2002 |
| JP | 2002-196018 | 7/2002 |
| JP | 2002-324600 | 11/2002 |
| JP | 2003-92317 | 3/2003 |
| JP | 2003 092317 | 3/2003 |
| JP | 2004-172589 | 6/2004 |

* cited by examiner (a)

(b)

(a)

(b)

SHEET-LIKE PROBE, METHOD OF PRODUCING THE PROBE, AND APPLICATION OF THE PROBE

TECHNICAL FIELD

The present invention relates to a sheet-like probe which is suitable for a probe apparatus to carry out an electrical connection to a circuit, a method of manufacturing the probe and an application thereof in an electrical inspection for a circuit such as an integrated circuit.

BACKGROUND ART

For example, in an electrical inspection for a wafer on which a large number of integrated circuits are formed or a circuit device such as an electronic component, for example, a semiconductor device, there has been used a probe for an inspection which has inspection electrodes arranged in accordance with a pattern corresponding to a pattern of electrodes to be inspected in a circuit device to be inspected.

Conventionally, there has been used a probe for an inspection in which the inspection electrodes formed by a pin or a blade are arranged.

However, in the case in which the circuit to be inspected is a wafer having a large number of integrated circuits formed thereon, it is necessary to arrange a large number of inspection electrodes when fabricating a probe for an inspection to inspect the wafer. Therefore, the probe for an inspection is very expensive. Moreover, in the case in which the pitch of the electrodes to be inspected is small, it is hard to carry out the fabrication of the probe for an inspection itself.

Furthermore, a warpage is generally generated on the wafer and the state of the warpage is also varied for each product (wafer) For this reason, it is practically hard to cause each of the inspection electrodes of the probe for an inspection to come in contact with a large number of electrodes to be inspected in the wafer stably and reliably.

For the above reasons, in recent years, there has been proposed a probe for an inspection which serves to inspect an integrated circuit formed on a wafer, comprising a circuit board for an inspection on which a plurality of inspection electrodes is formed in accordance with a pattern corresponding to a pattern of electrodes to be inspected on a surface, an anisotropically conductive sheet disposed on a surface of the circuit board for an inspection and a sheet-like probe in which a plurality of electrode structures extended to penetrate in a direction of a thickness thereof is arranged in a flexible insulating sheet (for example, see Patent Document 1).

FIG. 34 is an explanatory sectional view showing a structure according to an example of a conventional probe card comprising a circuit board 85 for an inspection, an anisotropically conductive sheet 80 and a sheet-like probe 90.

In the probe card, there is provided a circuit board 85 for an inspection having a large number of inspection electrodes 86 formed in accordance with a pattern corresponding to a pattern of electrodes to be inspected in a circuit device to be inspected over a surface, and a sheet-like probe 90 is disposed on the surface of the circuit board 85 for an inspection through the anisotropically conductive sheet 80.

The anisotropically conductive sheet 80 has a pressurizing conducting portion exhibiting a conductivity in only a direction of a thickness or exhibiting the conductivity in only the direction of the thickness when a pressurization is carried out in the direction of the thickness. There have been known the anisotropically conductive sheets having various structures. For example, Patent Document 2 and the like have disclosed an anisotropically conductive sheet obtained by uniformly dispersing a metal particle in an elastomer (which will be hereinafter referred to as a "dispersion type anisotropically conductive sheet").

Moreover, Patent Document 3 and the like have disclosed an anisotropically conductive sheet obtained by unevenly distributing a conductive magnetic particle into an elastomer, thereby forming a large number of conductive portions extended in a direction of a thickness and an insulating portion for mutually insulating them (which will be hereinafter referred to as an "an uneven distribution type anisotropically conductive sheet"). Furthermore, Patent Document 4 and the like have disclosed the uneven distribution type anisotropically conductive sheet in which a step is formed between a surface of a conducting portion and an insulating portion.

The sheet-like probe 90 has a flexible insulating sheet 91 formed of a resin, for example, and has such a structure that a plurality of electrode structures 95 extended in a direction of a thickness is disposed on the insulating sheet 91 in accordance with a pattern corresponding to a pattern of electrodes to be inspected in a circuit device to be inspected.

Each of the electrode structures 95 has such a structure that a projected surface electrode portion 96 exposed from a surface of the insulating sheet 91 and a plate-shaped back electrode portion 97 exposed from a back of the insulating sheet 91 are integrally coupled through a short circuit portion 98 extended to penetrate through the insulating sheet 91 in a direction of a thickness thereof.

Such a sheet-like probe 90 is generally manufactured in the following manner.

First of all, a laminate material 90A obtained by forming a metal layer 92 over a surface of the insulating sheet 91 is prepared as shown in FIG. 35(a) and a through hole 98H penetrating in a direction of a thickness is formed on the insulating sheet 91 as shown in FIG. 35(b).

As shown in FIG. 35(c), subsequently, a resist film 93 is formed on the metal layer 92 of the insulating sheet 91, and furthermore, an electrolytic plating treatment is carried out by setting the metal layer 92 to be a common electrode. Consequently, the through hole 98H of the insulating sheet 91 is filled with a metal deposit so that the short circuit portion 98 coupled integrally with the metal layer 92 is formed, and furthermore, a projected surface electrode portion 96 coupled integrally with the short circuit portion 98 is formed on a surface of the insulating sheet 91.

Then, the resist film 93 is removed from the metal layer 92, and furthermore, as shown in FIG. 35(d), a resist film 94A is formed on the surface of the insulating sheet 91 including the surface electrode portion 96 and a resist film 94B is formed on the metal layer 92 in accordance with a pattern corresponding to a pattern of a back electrode portion to be formed, thereby carrying out an etching treatment over the metal layer 92. As shown in FIG. 35(e), consequently, an exposed portion in the metal layer 92 is removed so that the back electrode portion 97 is formed. Thus, the electrode structure 95 is formed.

Thereafter, the resist film 94A formed on the insulating sheet 91 and the surface electrode portion 96 is removed, and furthermore, the resist film 93 formed on the back electrode portion 97 is removed. Consequently, the sheet-like probe 90 is obtained.

In the probe for an inspection, the surface electrode portion 96 of the electrode structure 95 in the sheet-like probe 90 is provided so as to be positioned on an electrode to be inspected in the wafer over a surface of the wafer, for example, in the circuit device to be inspected.

In this state, the wafer is pressed by the probe for an inspection. Consequently, the anisotropically conductive sheet 80 is pressed by the back electrode portion 97 of the electrode structure 95 in the sheet-like probe 90.

Consequently, a conducting path is formed in a direction of a thickness between the back electrode portion 97 and the inspection electrode 86 of the circuit board 85 for an inspection over the anisotropically conductive sheet 80. As a result, an electrical connection between the electrode to be inspected in the wafer and the inspection electrode 86 of the circuit board 85 for an inspection can be achieved.

Then, a predetermined electrical inspection is executed for the wafer in this state.

According to such a probe for an inspection, the anisotropically conductive sheet 80 is deformed according to the degree of the warpage of the wafer when the wafer is pressed by the probe for an inspection. Therefore, it is possible to reliably achieve an excellent electrical connection for each of a large number of electrodes to be inspected in the wafer.

However, the probe for an inspection has the following problems.

In a process for forming the short circuit portion 98 and the surface electrode portion 96 in the method of manufacturing the sheet-like probe 90 described above, a plated layer formed by the electrolytic plating grows isotropically. As shown in FIG. 36, therefore, a distance W from a peripheral edge of the surface electrode portion 96 to that of the short circuit portion 98 is equivalent to a projection height h of the surface electrode portion 96 in the surface electrode portion 96 which is obtained.

Accordingly, a diameter R of the surface electrode portion 96 which is obtained exceeds a double of the projection height h and is considerably great.

For this reason, in the case in which the electrode to be inspected in the circuit device to be inspected is minute and is disposed at a very small pitch, a distance between the adjacent electrode structures 95 cannot be maintained sufficiently. As a result, in the sheet-like probe 90 which is obtained, the flexibility of the insulating sheet 91 is lost. For this reason, it is hard to achieve a stable electrical connection to the circuit device to be inspected.

In the electrolytic plating treatment, moreover, it is actually difficult to supply a current having an even current density distribution to the whole surface of the metal layer 92. Due to the uneven current density distribution, a growth speed of a plated layer is varied for each through hole 98H of the insulating sheet 91. Therefore, a great variation is generated in the projection height h of the surface electrode portion 96 which is formed and the distance W from the peripheral edge of the surface electrode portion 96 to that of the short circuit portion 98, that is, the diameter R.

In the case in which the projection height h of the surface electrode portion 96 has a great variation, it is hard to carry out a stable electrical connection to the circuit device to be inspected. On the other hand, in the case in which the diameter of the surface electrode portion 96 has a great variation, there is a possibility that the adjacent surface electrode portions 96 might be short-circuited.

Therefore, as a means for solving the above described problems, there is means for reducing the projection height h of the surface electrode portion 96 and for reducing the diameter of the surface electrode portion 96 which is thus obtained. That is a means for reducing a diameter r of the short circuit portion 98 (which indicates the smallest length in the case in which a sectional shape is not circular), that is, a diameter of the through hole 98H of the insulating sheet 91 to reduce a diameter of the surface electrode portion 96. In a sheet-like probe obtained by the former means, however, it is hard to reliably achieve a stable electrical connection to the electrode to be inspected.

On the other hand, it is hard to carry out the formation itself of the short circuit portion 98 and the surface electrode portion 96 through the electrolytic plating treatment by the latter means.

In order to solve such problems, there have been proposed sheet-like probes obtained by disposing a large number of electrode structures having a tapered surface electrode portion which has a smaller diameter from a base end toward a tip respectively in Patent Document 5 and Patent Document 6.

The sheet-like probe described in the Patent Document 5 is manufactured in the following manner.

As shown in FIG. 37(a), there is prepared a laminate material 90B obtained by forming a resist film 93A and a surface side metal layer 92A on a surface of an insulating sheet 91 in this order and laminating a back side metal layer 92B on a back face of the insulating sheet 91.

As shown in FIG. 37(b), then, there is formed a through hole communicating with each of the back side metal layer 92B, the insulating sheet 91 and the resist film 93A in the laminate material 90B and extended in a direction of a thickness.

Consequently, a concave portion 90K for forming an electrode structure which has a tapered configuration adapted to a short circuit portion and a surface electrode portion in an electrode structure to be formed is provided on a back face of the laminate material 90B.

As shown in FIG. 37(c), subsequently, a plating treatment is carried out by setting the surface side metal layer 92A in the laminate material 90B to be an electrode so that the concave portion 90K for forming an electrode structure is thus filled with a metal to form a surface electrode portion 96 and a short circuit portion 98.

Then, the back side metal layer 92B in the laminate material is subjected to an etching treatment and is thus removed partially. Consequently, a back electrode portion 97 is formed as shown in FIG. 37(d). Thus, the sheet-like probe 90 is obtained.

Moreover, the sheet-like probe described in the Patent Document 6 is manufactured in the following manner.

As shown in FIG. 38(a), there is prepared a laminate material 90C obtained by forming a surface side metal layer 92A on a surface of an insulating sheet material 91A having a greater thickness than an insulating sheet in a sheet-like probe to be formed and laminating a back side metal layer 92B on a back face of the insulating sheet material 91A.

As shown in FIG. 38(b), then, there is formed a through hole communicating with each of the back side metal layer 92B and the insulating sheet material 91A in the laminate material 90C and extended in a direction of a thickness. Consequently, a concave portion 90K for forming an electrode structure which has a tapered configuration adapted to a short circuit portion and a surface electrode portion in an electrode structure to be formed is provided on a back face of the laminate material 90C.

By carrying out a plating treatment with the surface side metal layer 92A in the laminate material 90C set to be an electrode, subsequently, the concave portion 90K for forming an electrode structure is thus filled with a metal to form a surface electrode portion 96 and a short circuit portion 98 as shown in FIG. 38(c).

Subsequently, the surface side metal layer 92A in the laminate material 90C is removed, and furthermore, the insulating sheet material 91A is subjected to an etching treatment, thereby removing a surface side portion of the insulating sheet. As shown in FIG. 38(d), thus, the insulating sheet material 91 having a predetermined thickness is formed and the surface electrode portion 96 is exposed.

Then, the back side metal layer 92B is subjected to the etching treatment so that the back electrode portion 97 is formed. Thus, the sheet-like probe 90 is obtained as shown in FIG. 38(e).

According to such a sheet-like probe 90, the surface electrode portion 96 is tapered. Therefore, the surface electrode portion 96 having a small diameter and a great projection height can be formed in a state in which a distance from the surface electrode portion 96 of an adjacent electrode structure is maintained sufficiently. Furthermore, each of the surface electrode portions 96 of the electrode structure 95 is formed by setting, as a cavity, the concave portion 90K for forming an electrode structure which is provided on the laminate material. Consequently, it is possible to obtain the electrode structure 95 having a small variation in the projection height of the surface electrode portion 96.

Moreover, as shown in FIG. 39, a plate ring-shaped support plate 99 formed of ceramics, for example, is provided in the peripheral edge portion of the insulating sheet 91 of such a sheet-like probe 90 in order to support the insulating sheet 91 with the rigidity thereof. As shown in FIG. 40, a support plate 99 and the insulating sheet 91 are bonded and fixed by an adhesive 100.

Patent Document 1: Japanese Laid-Open Patent Publication No. 1995-231019
Patent Document 2: Japanese Laid-Open Patent Publication No. 1976-93393
Patent Document 3: Japanese Laid-Open Patent Publication No. 1978-147772
Patent Document 4: Japanese Laid-Open Patent Publication No. 1986-250906
Patent Document 5: Japanese Laid-Open Patent Publication No. 1999-326378
Patent Document 6: Japanese Laid-Open Patent Publication No. 2002-196018
Patent Document 7: Japanese Laid-Open Patent Publication No. 2004-172589

DISCLOSURE OF THE INVENTION

Problems to be Solved by the Invention

In these sheet-like probes, however, the diameter of the surface electrode portion in the electrode structure is equal to or smaller than the diameter of the short circuit portion, that is, the diameter of the through hole formed on the insulating sheet. Therefore, the electrode structure slips from the back face of the insulating sheet. Consequently, it is hard to actually use the sheet-like probe.

In order to solve the problem, for example, there has been proposed a sheet-like probe which has a holding portion on the surface electrode portion side in the electrode structure described in the Patent Document 7 and prevents the electrode structure from slipping from the back face of the insulating sheet.

The sheet-like probe described in the Patent Document 7 is manufactured in the following manner.

As shown in FIG. 41(a), there is prepared a laminate material including five layers formed by a surface side metal layer 92A, an insulating sheet 11, a first back side metal layer 92C, an insulating layer 18B and a second back side metal layer 92B.

As shown in FIG. 41(b), an opening portion 92H is provided on the second back side metal layer 92B in the laminate material 90C and the insulating layer 18B is subjected to etching through the opening portion 92H so that a through hole is provided on the insulating layer 18B.

Next, the etching is carried out over the first back side metal layer 92C exposed from the bottom portion of the through hole of the insulating layer 18B, thereby exposing the insulating sheet 11 from the bottom portion of the through hole.

Then, the insulating sheet 11 is subjected to the etching via the through hole of the first back side metal layer 92C, thereby exposing the surface side metal layer 92A from the bottom portion of the through hole.

Thus, the metal layer and the resin layer (the insulating layer 18B and the insulating sheet 11) are mutually subjected to the etching, thereby forming a through hole communicating with each of the second back side metal layer 92B, the insulating layer 18B, the first back side metal layer 92C and the insulating sheet 11 and extended in a direction of a thickness. Thus, a concave portion 90K for forming an electrode structure having a tapered configuration adapted to a short circuit portion 98 and a surface electrode portion 96 of an electrode structure 95 to be formed is provided on the back face of the laminate material 90C.

Subsequently, a plating treatment is carried out by setting the surface side metal layer 92A in the laminate material 90C as an electrode. As shown in FIG. 41(c), consequently, the concave portion 90K for forming an electrode structure is filled with a metal to form the surface electrode portion 96 and the short circuit portion 98.

Then, the surface side metal layer 92A in the laminate material 90C is removed, and the insulating sheet 11 is subjected to the etching treatment and is thus removed to expose the first back side metal layer 92C (see FIG. 41(d)).

Thereafter, the first back side metal layer 92C is subjected to the etching treatment to form a holding portion 92D, and the second back side metal layer 92B is subjected to the etching treatment and is thus removed partially, thereby forming the back electrode portion 97 and a support portion 92E. As shown in FIG. 41(e), thus, the sheet-like probe 90 is obtained.

In the sheet-like probe shown in the Patent Documents 5, 6, and 7 described above, furthermore, the back face of the laminate material 90C is provided with the concave portion 90K for forming an electrode structure which has a tapered configuration adapted to the short circuit portion and the surface electrode portion in the electrode structure to be formed. Therefore, a tip diameter 92T of the concave portion 90K for forming an electrode structure is smaller than a diameter of an opening portion 92H formed on the back face of the laminate material 90C.

Accordingly, it is also necessary to increase the diameter of the opening portion 92H to be formed on the back side in order to obtain the same tip diameter 92T with an increase in a thickness of the insulating sheet.

In the case in which a sheet-like probe having an electrode structure in a high density at a fine pitch is to be manufactured, therefore, the diameter of the opening portion 92H cannot be increased because of the necessity of maintaining an insulating portion 92N between the adjacent opening portions 92H on the back side of the laminate material 90C when the thickness of the insulating sheet is increased as shown in FIG. 38(e). For this reason, in some cases in which the thickness of the insulating sheet is increased, the tip diameter 92T of the concave portion 90K for forming an electrode structure is decreased so that the concave portion 90K for forming an electrode structure which does not come in contact with the surface side metal layer 92A is formed.

In some cases in which the concave portion 90K for forming an electrode structure does not sufficiently come in contact with the surface side metal layer 92A, thus, the metal cannot be filled by the plating and the number of the electrode structures is insufficient so that a sheet-like probe which is hard to use is produced.

When the diameter of the tip portion of the electrode structure is reduced, moreover, there is a tendency that the tip portion is worn out and becomes defective due to repetitive use and a variation in the height of the electrode structure is thus increased. For this reason, it is also necessary to prevent the tip diameter of the tip portion or the diameter of a base end from being excessively decreased in respect of a strength of the electrode structure.

Furthermore, it is also necessary to regulate the diameter of the tip portion depending on a material of the electrode structure.

In the method of manufacturing the sheet-like probe, however, the diameter of the tip portion is regulated depending on the diameter of the opening portion on the back side. The regulation of the diameter of the opening portion on the back side is limited by the thickness of the laminate material. In the manufacture of a very small sheet-like probe in a high density at a fine pitch, particularly, it is hard to constitute an electrode structure having a desirable diameter of a tip portion in some cases.

In recent years, for an electrical inspection of a large wafer in which many electrodes to be inspected are disposed at a fine pitch, for example, a wafer having a diameter of 8 inches or more in which 5000 electrodes to be inspected or more or 10000 electrodes to be inspected or more in some cases are formed is subjected to the electrical inspection. In such a case, electrodes to be inspected have a pitch of 160 µm or less.

For inspecting such a wafer, there must be used a sheet-like probe having a large area corresponding to the wafer and in which 5000 or 10000 electrode structures or more are disposed at a pitch of 160 µm or less.

As a pitch of an electrode to be inspected becomes finer as described above, a thickness of an anisotropically conductive sheet of a probe card becomes smaller. For instance, in the case in which a thickness of the anisotropically conductive sheet is 100 µm, an absorbing power of a variation in the height of a probe card and a wafer due to an elasticity is 20 µm, that is 20% of the thickness.

A variation in the height exists in an electrode to be inspected in a wafer, an electrode structure of a sheet-like probe, and an anisotropically conductive sheet. In addition, a variation in the height also exists in an adhesive 100 disposed between an insulating sheet 91 and a ring-shaped support plate 99 in the sheet-like prove shown in FIG. 40.

More specifically, as shown in FIG. 40, an adhesive 100 exists between an insulating sheet 91 and a ring-shaped support plate 99, and a thickness of the adhesive 100 is 50 µm or larger for instance.

In the case in which the ring-shaped support plate 99 is bonded to the insulating sheet 91, the adhesive 100 such as a thermosetting adhesive is coated by a thickness of the range of 50 to 100 µm, and the ring-shaped support plate 99 and the insulating sheet 91 are overlaid to each other. A metal plate for pressurizing is then laminated from the upper side, and the adhesive 100 is cured while pressurization is carried out. However, if an excessive pressure is applied, the adhesive is extremely pressed out of the support plate 99.

In the case in which a thickness of the adhesive 100 is 50 µm for instance and there is a variation in the height of approximately 10% of the thickness, a variation in the height of the adhesive 100 is 5 µm.

For instance, in the case in which a variation in the height of an electrode to be inspected in a wafer is 5 µm, a variation in the height of an electrode structure of a sheet-like probe is 5 µm, and there is a variation in the thickness of an anisotropically conductive sheet and a variation in the height of the peripheral edge portion of a sheet-like probe due to the above adhesive 100, a variation in the height of a probe card and a wafer cannot be absorbed due to an elasticity for the above described anisotropically conductive sheet having a small thickness. Even in the case in which pressurization is carried out, it is hard to obtain a conductivity in each of many electrodes (10000 electrodes or more for instance) to be inspected in a wafer.

Moreover, even if a conductivity can be obtained, a large pressurizing power is required for a conductivity, thereby causing an electrode to be inspected in a wafer and an electrode structure of a sheet-like probe to be easily damaged.

The present invention has been made in consideration of the circumstances described above.

It is a first object of the present invention to provide a sheet-like probe in which an electrode structure including a surface electrode portion having a small diameter can be formed and a stable electrical connecting state can be reliably achieved for a circuit device having an electrode formed at a small pitch, and furthermore, the electrode structure does not slip from an insulating layer so that a high durability can be obtained.

It is a second object of the present invention to provide a sheet-like probe comprising an electrode structure having an insulating layer in a great thickness and a surface electrode portion in a small diameter which can reliably achieve a stable electrical connecting state for a circuit device having an electrode formed at a small pitch and has a high durability.

It is a third object of the present invention to provide a method capable of manufacturing a sheet-like probe which can form an electrode structure including a surface electrode portion having a small variation in a projection height, can reliably achieve a stable electrical connecting state for a circuit device having an electrode formed at a small pitch, and furthermore, can prevent the electrode structure from slipping from an insulating layer and can obtain a high durability.

It is a fourth object of the present invention to provide a sheet-like probe in which a variation in the height can be reduced for the sheet-like probe that is used for carrying out an electrical inspection for a plurality of integrated circuits formed on a wafer in a state of the wafer and that is provided with a ring-shaped support plate in the peripheral edge portion of the sheet-like probe.

It is a fifth object of the present invention to provide a method of manufacturing a sheet-like probe which can regulate a tip diameter and a base end diameter of a surface electrode portion into a desirable diameter in a sheet-like probe formed by an insulating layer having a great thickness.

It is a sixth object of the present invention to provide a probe card comprising the sheet-like probe.

It is a seventh object of the present invention to provide an apparatus for inspecting a circuit device which comprises the probe card.

Means for Solving the Problems

A sheet-like probe according to the present invention comprises:

an insulating layer;

a plurality of electrode structures disposed on the insulating layer apart from each other in a planar direction thereof and extended to penetrate in a direction of a thickness of the insulating layer; and a perforated film, wherein a contact film is supported to penetrate in each position of a plurality of through holes formed in the perforated film;

the perforated film and the peripheral edge portion of the contact film are integrated with each other in such a manner that the insulating layer made of a flexible resin is included in a fine hole of the perforated film; and a plurality of electrode structures is supported to penetrate through the insulating layer, and each of the electrode structures including:

a surface electrode portion exposed from a surface of the insulating layer and projected from the surface of the insulating layer;

a back electrode portion exposed from a back face of the insulating layer;

a short circuit portion extended to penetrate through the insulating layer in a direction of a thickness thereof continuously from a base end of the surface electrode portion and coupled to the back electrode portion;

a holding portion extended outward along the surface of the insulating layer continuously from the base end portion of the surface electrode portion; and a support material for supporting the insulating layer.

The sheet-like probe according to the present invention is characterized in that the perforated film is provided with a ring-shaped support plate bonded and fixed to a peripheral edge portion thereof, and the perforated film and the ring-shaped support plate are bonded and fixed by an adhesive impregnated into the perforated film in a contact state thereof with each other.

The sheet-like probe according to the present invention is characterized in that the perforated film is a mesh or a non woven fabric made of an organic fiber.

The sheet-like probe according to the present invention is characterized in that the sheet-like probe is used for carrying out an electrical inspection for a plurality of integrated circuits formed on a wafer in a state of the wafer.

The present invention provides a method of manufacturing a sheet-like probe comprising the steps of:

preparing a laminate material having at least an insulating sheet, a surface side metal layer formed on a surface of the insulating sheet; and a first back side metal layer formed on a back face of the insulating sheet, forming a through hole mutually communicating with the first back side metal layer and the insulating sheet in the laminate material and extended in a direction of a thickness, thereby providing a concave portion for forming a surface electrode portion on a back face of the laminate material;

carrying out a plating treatment over the laminate material by using the surface side metal layer as an electrode to fill a metal in the concave portion for forming a surface electrode portion, thereby forming a surface electrode portion projected from a surface of an insulating layer, and then forming an insulating layer on a back side of the laminate material and a second back side metal layer formed on a surface of the insulating layer;

providing a concave portion for forming a short circuit portion mutually communicating with the second back side metal layer and the insulating layer in the laminate material and having a bottom face from which the surface electrode portion is exposed;

carrying out the plating treatment over the laminate material by using the surface side metal layer as an electrode to fill a metal in the concave portion for forming a short circuit portion, thereby forming a short circuit portion extended to penetrate through the insulating layer in a direction of a thickness thereof continuously from a base end of the surface electrode portion;

then carrying out an etching treatment over the second back side metal layer, thereby forming a back electrode portion;

removing the surface side metal layer and the insulating sheet, thereby exposing the surface electrode portion and the first back side metal layer; and thereafter carrying out the etching treatment over the first back side metal layer, thereby forming a holding portion extended outward along the surface of the insulating sheet continuously from the base end portion of the surface electrode portion.

The method of manufacturing a sheet-like probe according to the present invention is characterized in that the through hole of the insulating sheet in the concave portion for forming a surface electrode portion is formed to have a diameter which is gradually reduced from the back face of the insulating sheet toward the surface thereof.

The method of manufacturing a sheet-like probe according to the present invention is characterized in that the insulating sheet of the laminate material which is to be used consists of a polymer material which can be etched, and the through hole of the insulating sheet in the concave portion for forming a surface electrode portion is formed by etching.

The method of manufacturing a sheet-like probe according to the present invention is characterized in that the through hole of the insulating layer in the concave portion for forming a short circuit portion is formed to have a diameter which is gradually reduced from the back face of the insulating layer toward the surface thereof.

The method of manufacturing a sheet-like probe according to the present invention is characterized in that the insulating layer of the laminate material which is to be used consists of a polymer material which can be etched, and the through hole of the insulating layer in the concave portion for forming a short circuit portion is formed by etching.

The method of manufacturing a sheet-like probe according to the present invention is characterized by the steps of:

filling a metal in the concave portion for forming a surface electrode portion, thereby forming a surface electrode portion projected from the surface of the insulating layer;

then superposing the sheet-like perforated film having a flexibility and provided with a through hole for forming the electrode structure; and forming the insulating layer on the perforated film and the second back side metal layer provided on the surface of the insulating layer.

The method of manufacturing a sheet-like probe according to the present invention is characterized by comprising the step of removing the insulating layer in the outer edge portion of the perforated film by an etching.

The method of manufacturing a sheet-like probe according to the present invention is characterized by comprising the steps of:

removing the insulating layer in the outer edge portion of the perforated film by an etching;

then superposing the exposed portion of the perforated film and the ring-shaped support plate for supporting the perforated film;

impregnating an adhesive into the perforated film in order to reach the interface with the ring-shaped support plate by dropping or coating the adhesive on the surface of the perforated film side of the obtained laminate material;

bonding the perforated film and the ring-shaped support plate by curing the adhesive; and forming an electrode structure supported to penetrate through the perforated film in the face of the perforated film.

The present invention provides a probe card for electrically connecting a circuit device to be an inspecting object to a tester, comprising:

a circuit board for an inspection which has a plurality of inspection electrodes formed thereon corresponding to an electrode to be inspected in the circuit device to be the inspecting object;

an anisotropically conductive connector disposed on the circuit board for an inspection; and the sheet-like probe which is disposed on the anisotropically conductive connector.

The probe card according to the present invention is characterized in that the circuit device to be the inspecting object is a wafer having a large number of integrated circuits formed thereon, and the anisotropically conductive connector includes:

a frame plate having a plurality of openings formed thereon corresponding to an electrode region on which electrodes to be inspected in all or a part of integrated circuits formed on a wafer to be the inspecting object are disposed; and an anisotropically conductive sheet disposed to close each of the openings of the frame plate.

The present invention provides a probe card for electrically connecting a circuit device to be an inspecting object to a tester, comprising:

a circuit board for an inspection which has a plurality of inspection electrodes formed thereon corresponding to an electrode to be inspected in the circuit device to be the inspecting object;

an anisotropically conductive connector disposed on the circuit board for an inspection; and a sheet-like probe manufactured by the method described above which is disposed on the anisotropically conductive connector.

The probe card according to the present invention is characterized in that the circuit device to be the inspecting object is a wafer having a large number of integrated circuits formed thereon, and the anisotropically conductive connector includes:

a frame plate having a plurality of openings formed thereon corresponding to an electrode region on which electrodes to be inspected in all or a part of integrated circuits formed on a wafer to be the inspecting object are disposed; and an anisotropically conductive sheet disposed to close each of the openings of the frame plate.

An apparatus for inspecting a circuit device according to the present invention is characterized by having the probe card.

The present invention provides a method of inspecting a wafer comprising the steps of:

electrically connecting each integrated circuit of a wafer having a plurality of integrated circuits formed thereon to a tester through the probe card described above; and electrically inspecting the integrated circuit.

Effect of the Invention

According to the sheet-like probe in accordance with the present invention, the electrode structure is provided with the holding portion extended outward along the surface of the insulating layer continuously from the base end portion of the surface electrode portion. Even if the surface electrode portion has a small diameter, therefore, the electrode structure can be prevented from slipping from the insulating layer so that a high durability can be obtained.

Moreover, it is possible to form the surface electrode portion having a small diameter. Consequently, a distance between the adjacent surface electrode portions can be maintained sufficiently. Therefore, the flexibility of the insulating layer can be exhibited sufficiently. As a result, it is also possible to reliably achieve a stable electrical connecting state for a circuit device having an electrode formed at a small pitch.

According to the sheet-like probe in accordance with the present invention, even if an inspecting object is a wafer having a large area in a diameter of 8 inches or more or a circuit device having a very small pitch of an electrode to be inspected, it is possible to reliably prevent a positional shift of the electrode structure from the electrode to be inspected due to a change in a temperature. Consequently, it is possible to stably maintain an excellent electrical connecting state.

According to the sheet-like probe in accordance with the present invention, the perforated film and the ring-shaped support plate are fixed to each other in a state that no adhesive layer is disposed between those in practice. Therefore, it is possible to reduce a variation in the height of the sheet-like probe.

Accordingly, an electrical conductivity between each of electrodes to be inspected in the circuit device such as an integrated circuit formed on a wafer and an inspection electrode of an inspection device can be ensured by a low pressurizing power, thereby preventing electrodes to be inspected and the electrode structure of the sheet-like probe from being damaged.

According to the sheet-like probe in accordance with the present invention, even in the case in which the inspecting object is a wafer having a large area in a diameter of 8 inches or more or a circuit device having a very small pitch of an electrode to be inspected, for example, it is possible to reliably prevent the positional shift of the electrode structure from the electrode to be inspected due to a change in a temperature in a burn-in test. Consequently, it is possible to stably maintain an excellent electrical connecting state.

According to the method of manufacturing a sheet-like probe in accordance with the present invention, the concave portion for forming a surface electrode portion is previously formed in the laminate material having the insulating sheet and the surface electrode portion is formed by setting, as a cavity, the concave portion for forming a surface electrode portion. Consequently, it is possible to obtain a surface electrode portion having a small diameter and a small variation in a projection height.

The insulating layer is provided after the surface electrode portion is formed, and the concave portion for forming a short circuit portion is formed on the insulating layer and the short circuit portion is formed by setting, as a cavity, the concave portion for forming a short circuit portion. Therefore, it is possible to set the diameter of the tip of the short circuit portion to be smaller than that of the base end of the tip portion, thereby constituting the electrode structure.

As compared with a method of once forming the concave portion for forming the tip portion and the short circuit portion into the insulating layer, accordingly, it is possible to form the back side electrode portion to be small also in case of an insulating layer having a great thickness.

As a result, it is possible to easily manufacture a sheet-like probe having an electrode structure in a high density at a fine pitch.

The concave portion for forming a tip portion and the concave portion for forming a short circuit portion are separately provided on the insulating layer. Therefore, it is possible to optionally set the shape of the concave portion for forming a tip portion and that of the concave portion for forming a short circuit portion.

Consequently, it is also possible to increase the diameter of the base end of the short circuit portion without increasing the diameter of the short circuit portion. Thus, it is possible to manufacture a sheet-like probe in which an electrode structure having a large diameter of a base end and a small diameter of a tip in a surface electrode portion and having a small diameter of a back electrode portion is provided and a thickness of an insulating sheet is great.

Moreover, the first back side metal layer formed on the surface of the insulating layer is subjected to an etching treatment. Consequently, it is possible to reliably form a holding portion extended outward along the surface of the insulating layer continuously from the base end portion of the surface electrode portion.

Even if the surface electrode portion has a small diameter, therefore, the electrode structure can be prevented from slipping from the insulating layer but has a high durability.

Furthermore, the insulating layer is supported by the support material. Even if an inspecting object is a wafer having a large area in a diameter of 8 inches or more or a circuit device having a very small pitch of the electrode to be inspected, therefore, it is possible to reliably prevent the positional shift of the electrode structure from the electrode to be inspected due to a change in a temperature in a burn-in test. Accordingly, it is possible to manufacture a sheet-like probe capable of stably maintaining an excellent electrical connecting state.

According to the probe card in accordance with the present invention, the sheet-like probe described above is provided. Therefore, it is also possible to reliably achieve a stable electrical connecting state for a circuit device having an electrode formed at a small pitch. Furthermore, it is possible to prevent the electrode structure in the sheet-like probe from slipping off and to stably maintain an excellent electrical connecting state in a burn-in test also in the case in which an inspecting object is a wafer having a large area in a diameter of 8 inches or more or a circuit device having a very small pitch of the electrode to be inspected. Consequently, a high durability can be obtained.

According to the apparatus for inspecting a circuit device in accordance with the present invention, the probe card described above is provided. Therefore, it is also possible to reliably achieve a stable electrical connecting state for a circuit device having an electrode formed at a small pitch. In addition, also in the case in which a large number of circuit devices are to be inspected, it is possible to execute an inspection having a high reliability for a long period of time.

Figure 1:
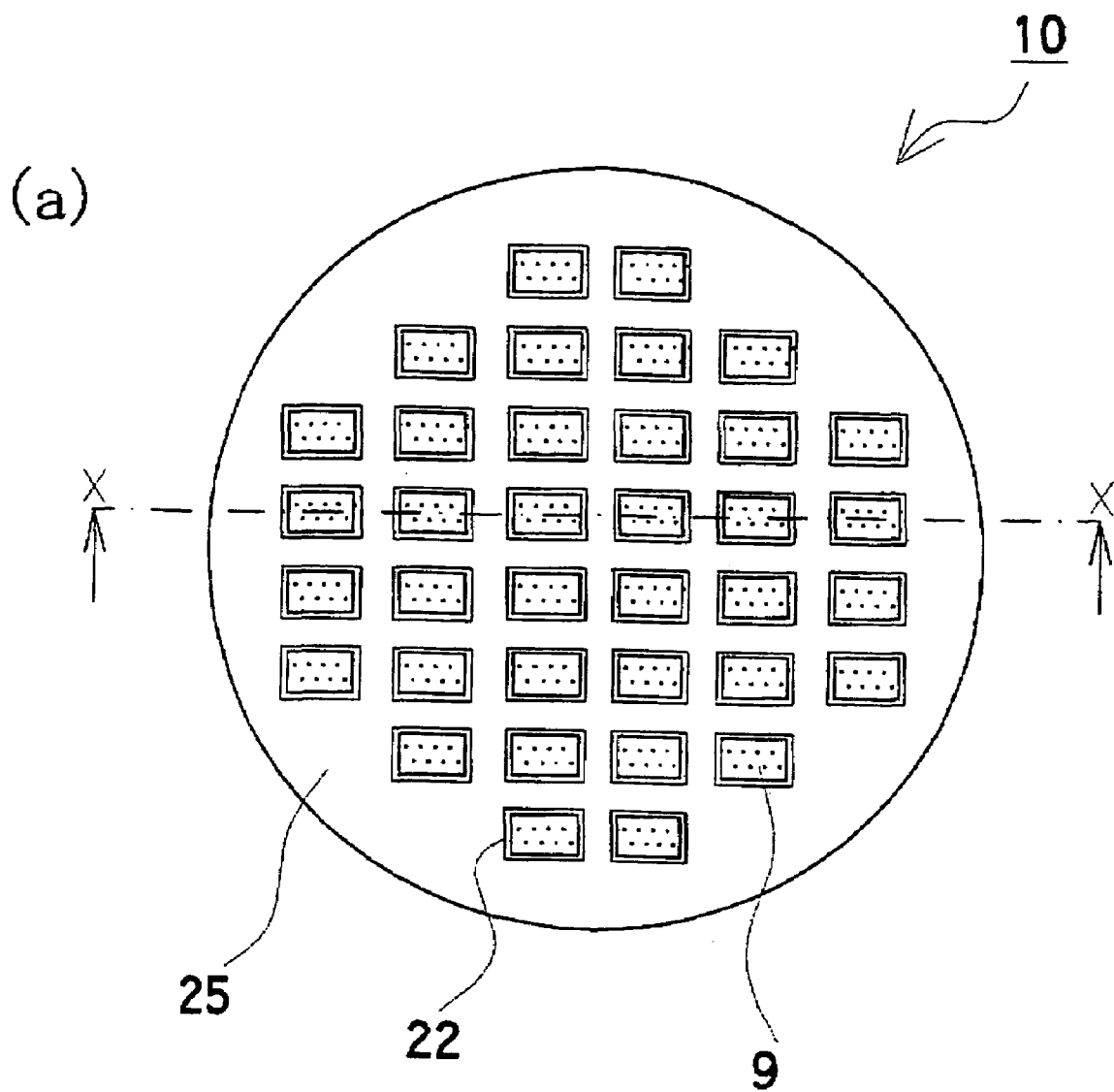
FIG. 1 is a view showing another embodiment of a sheet-like probe according to the present invention, FIG. 1(a) being a plan view and FIG. 1(b) being a sectional view taken along an X-X line.
Figure 1:
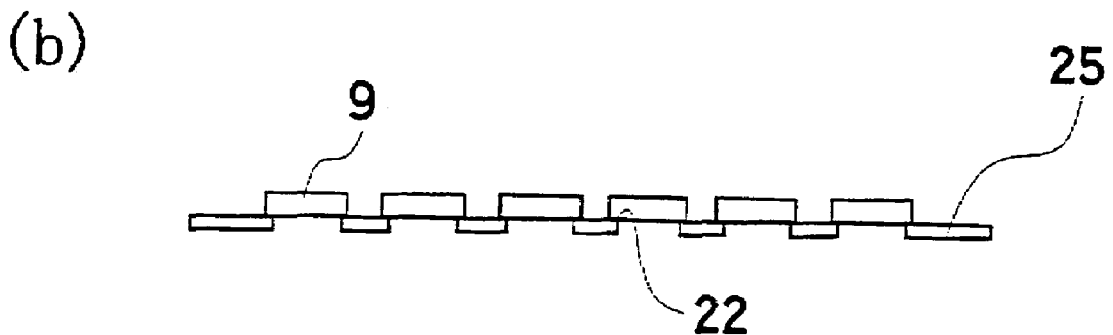

| EXPLANATION OF THE LETTERS OR NUMERALS | |
|---|---|
| 1 | probe card |
| 2 | support member |
| 3 | pressurizing plate |
| 4 | wafer mounting table |
| 5 | heater |
| 6 | wafer |
| 7 | electrode to be inspected |
| 8 | adhesive |
| 8a | non-cured adhesive |
| 9 | contact film |
| 10 | sheet-like probe |
| 10A | laminate material |
| 10B | laminate material |
| 10C | laminate material |
| 10K | concave portion for forming surface electrode portion |
| 11 | insulating sheet |
| 11H | through hole |
| 12A | resist film |
| 12B | resist film |
| 12H | pattern hole |
| 13A | resist film |
| 13H | pattern hole |
| 14A | resist film |
| 14B | resist film |
| 15 | electrode structure |
| 16 | surface electrode portion |
| 16A | surface side metal layer |
| 17 | back electrode portion |
| 17A | second back side metal layer |
| 17E | resist film |
| 17H | pattern hole |
| 18 | short circuit portion |
| 18B | insulating layer |
| 18H | through hole |

| -continued | |
|---|---|
| EXPLANATION OF THE LETTERS OR NUMERALS | |
| 18K | concave portion for forming short circuit portion |
| 19 | holding portion |
| 19A | first back side metal layer |
| 19H | pattern hole |
| 20 | circuit board for inspection |
| 21 | inspection electrode |
| 22 | support portion |
| 24 | perforated film |
| 25 | support material |
| 26 | opening portion |
| 27 | elastic polymer impregnating portion |
| 28A | resist film |
| 28H | pattern hole |
| 29A | resist film |
| 29B | resist film |
| 29H | pattern hole |
| 29K | pattern hole |
| 30 | anisotropically conductive connector |
| 31 | frame plate |
| 32 | opening |
| 33 | air inflow hole |
| 35 | anisotropically conductive sheet |
| 36 | conducting portion |
| 37 | insulating portion |
| 38 | projected portion |
| 40A | protective film |
| 50 | guide pin |
| 75 | resin impregnated perforated film sheet |
| 80 | anisotropically conductive sheet |
| 85 | circuit board for inspection |
| 86 | inspection electrode |
| 90 | sheetlike probe |
| 90A | laminate material |
| 90B | laminate material |
| 90C | laminate material |
| 90K | concave portion for forming electrode structure |
| 91 | insulating sheet |
| 91A | insulating sheet material |
| 92 | metal layer |
| 92A | surface side metal layer |
| 92B | second back side metal layer |
| 92C | first back side metal layer |
| 92H | opening portion |
| 92N | insulating portion |
| 92T | tip diameter |
| 93 | resist film |
| 93A | resist film |
| 94A | resist film |
| 94B | resist film |
| 95 | electrode structure |
| 96 | surface electrode portion |
| 97 | back electrode portion |
| 98 | short circuit portion |
| 98H | through hole |
| 99 | support plate |
| 100 | adhesive |
| 101 | plate-shaped support material |
| 102 | support portion |
| A | electrode region to be inspected |
| L | integrated circuit |
| P | conductive particle |
| Q | magnetic core particle |
| d | thickness |
| d1 | thickness |
| d2 | thickness |
| h | projection height |
| R | diameter |
| R1 | diameter |
| R2 | diameter |
| R3 | diameter |
| R4 | diameter |
| R5 | diameter |
| R6 | diameter |
| W | distance |

BEST MODE FOR CARRYING OUT THE INVENTION

Embodiments of the present invention will be described below in detail.

<Sheet-Like Probe>

Figure 2:
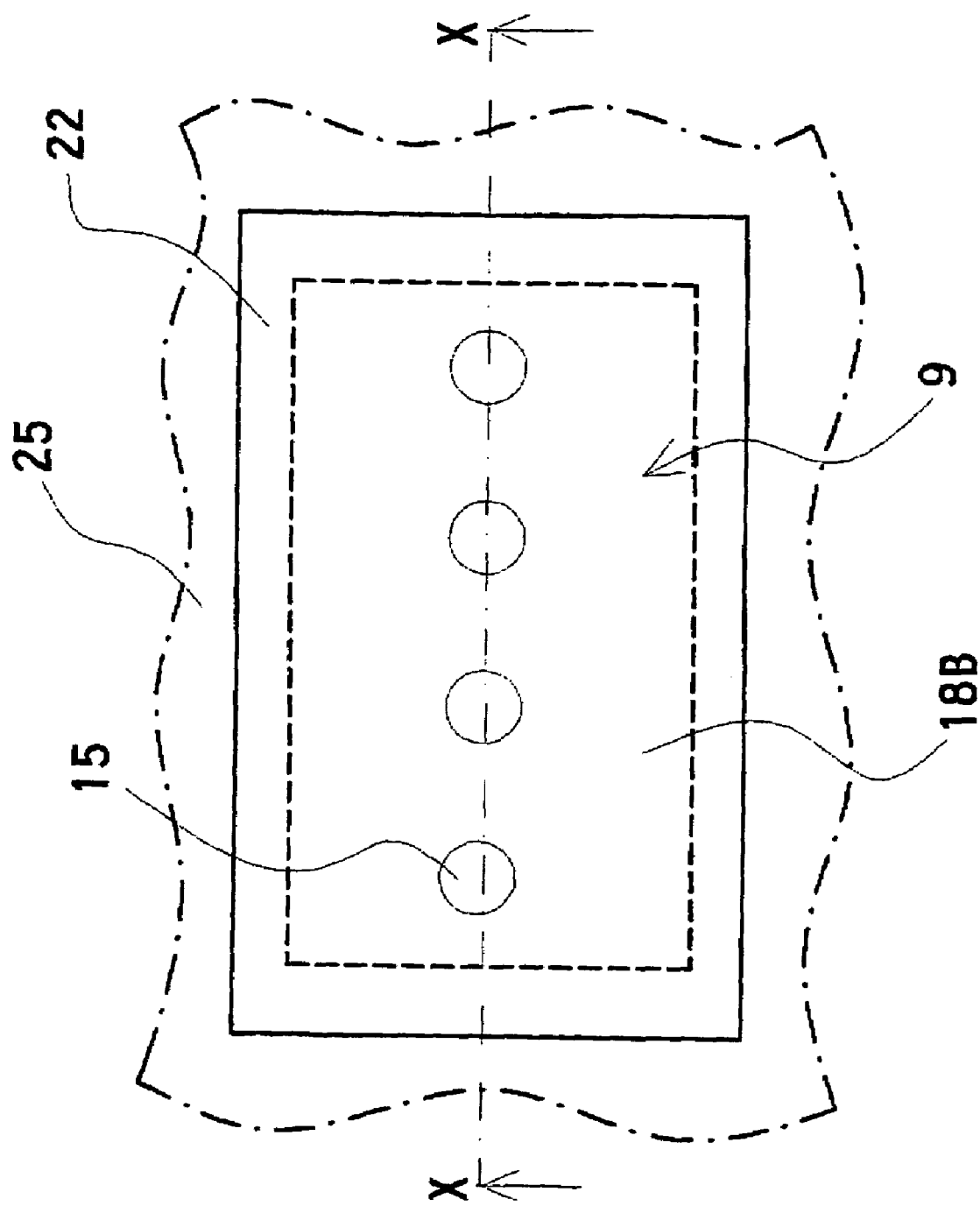
FIG. 2 is a plan view showing an enlarged contact film in the sheet-like probe of FIG. 1.
Figure 3:
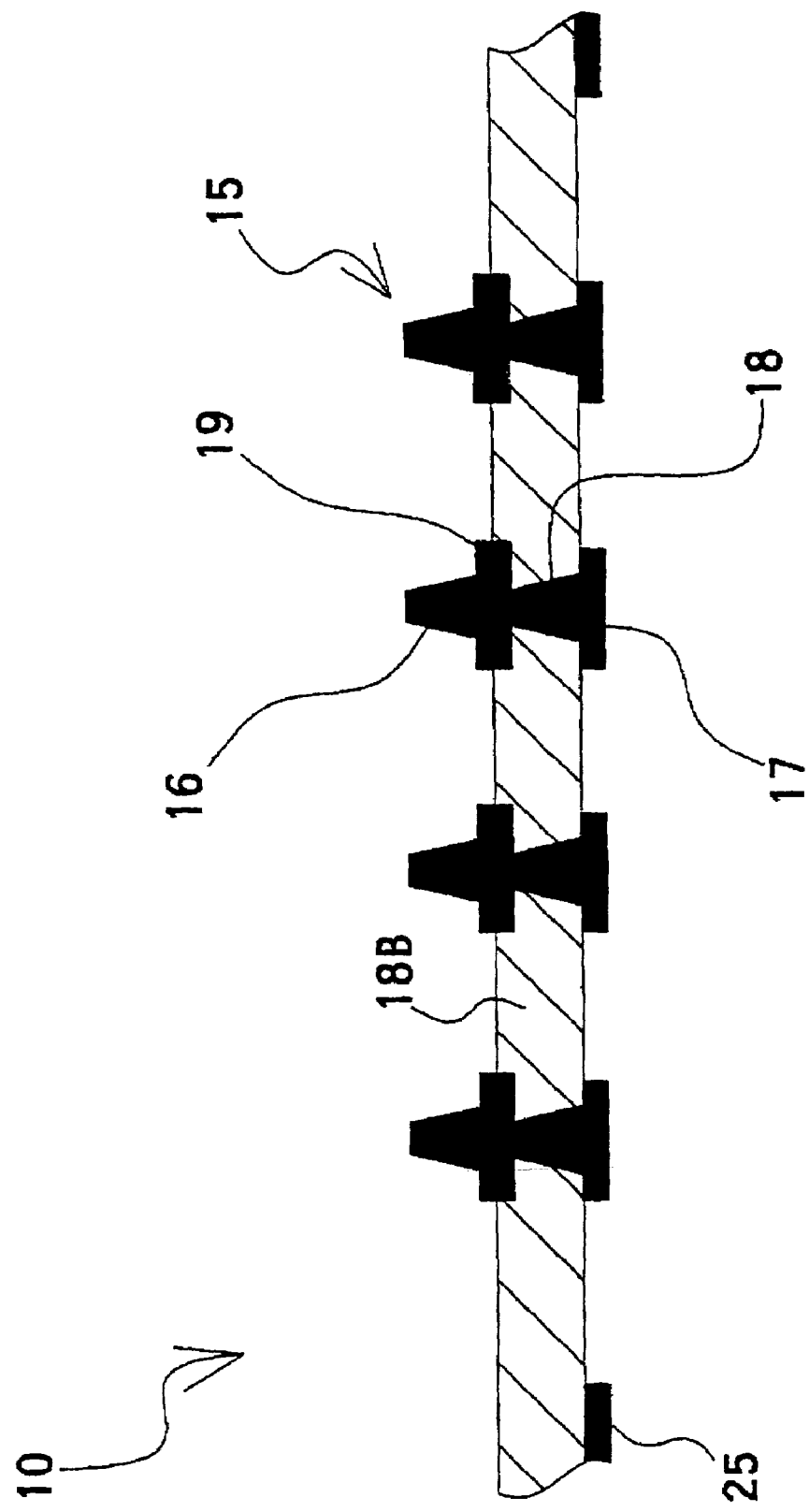
FIG. 3 is an explanatory sectional view showing a structure of the sheet-like probe according to the present invention.
Figure 4:
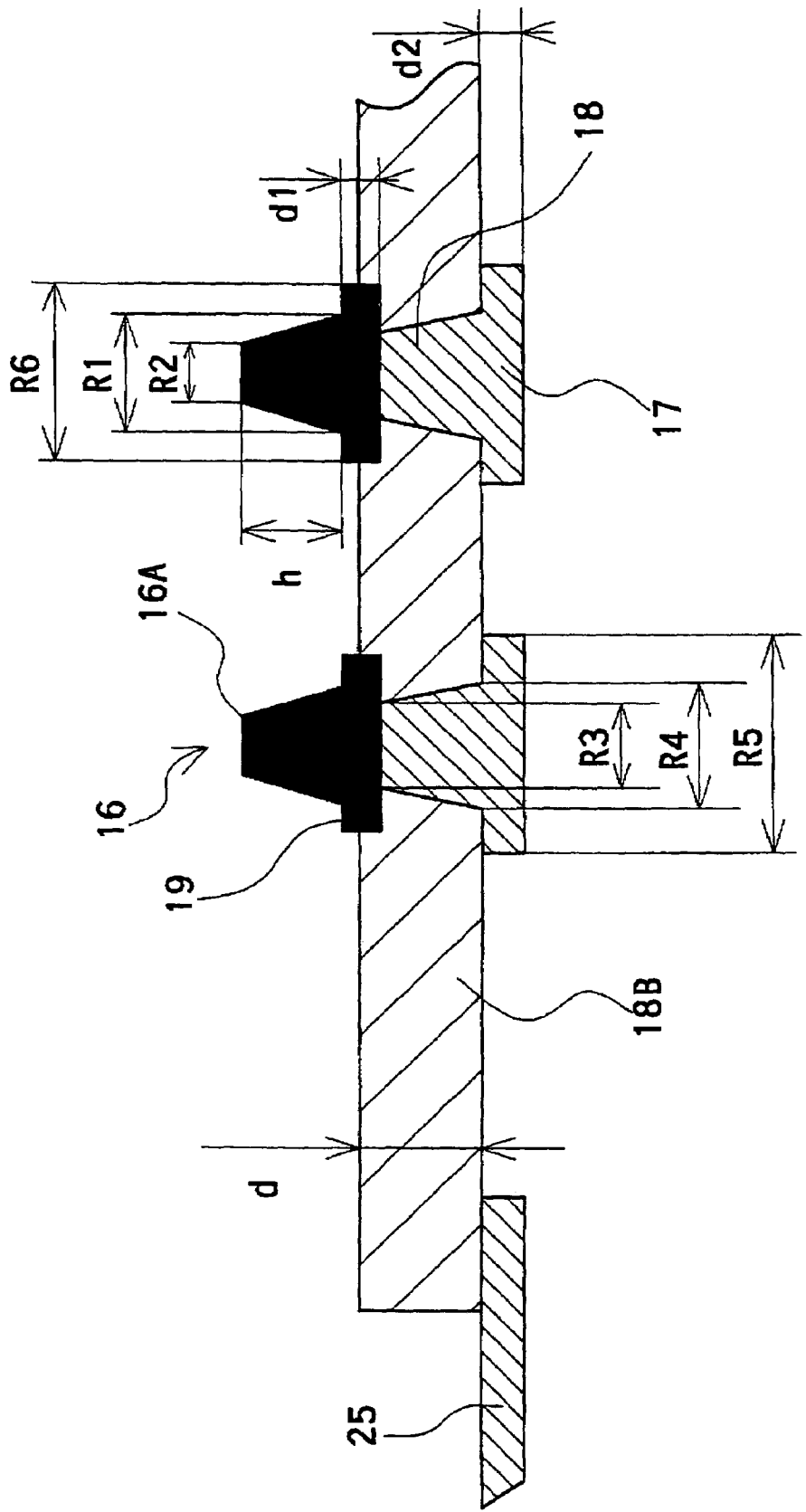
FIG. 4 is an explanatory sectional view showing an enlarged electrode structure in the sheet-like probe according to the present invention.

FIG. 1 is a view showing another embodiment of a sheet-like probe according to the present invention, FIG. 1(*a*) being a plan view and FIG. 1(*b*) being a sectional view taken along an X-X line, FIG. 2 is a plan view showing an enlarged contact film in the sheet-like probe of FIG. 1, FIG. 3 is an explanatory sectional view showing a structure of the sheet-like probe according to the present invention, and FIG. 4 is an explanatory sectional view showing an enlarged electrode structure in the sheet-like probe according to the present invention.

A sheet-like probe 10 according to the present embodiment is used for carrying out an electrical inspection for each integrated circuit in a state of a wafer for a wafer having a size of 8 inches or the like in which a plurality of integrated circuits is formed.

As shown in FIG. 1(*a*), the sheet-like probe 10 has a support material 25 having a through hole formed in each position corresponding to each integrated circuit on a wafer to be an object to be inspected and a contact film 9 is disposed in the through hole.

The contact film 9 is supported on the support material 25 at a support portion 22 provided around the through hole of the metal frame plate 25.

As shown in FIG. 1(*b*), the support portion 22 is provided with the contact film 9 formed by an insulating layer over the support material 25 and the contact film 9 is supported by the support material 25.

The contact film 9 has such a structure that an electrode structure 15 is formed to penetrate through a soft insulating layer 18B as shown in FIG. 2.

More specifically, a plurality of electrode structures 15 extended in a direction of a thickness of the insulating layer 18B is disposed apart from each other in a planar direction of the insulating layer 18B in accordance with a pattern corresponding to the electrode to be inspected in the wafer to be an inspecting object.

As shown in FIG. 3, moreover, each of the electrode structures 15 is constituted by a projected surface electrode portion 16 which is exposed from a surface of the insulating layer 18B and projected from the surface of the insulating layer 18B, a rectangular plate-shaped back electrode portion 17 exposed from a back face of the insulating layer 18B, a short circuit portion 18 extended to penetrate in the direction of the thickness of the insulating layer 18B continuously from a base end of the surface electrode portion 16 and coupled to the back electrode portion 17, and a circular ring plate-shaped holding portion 19 which is radially extended outward along the surface of the insulating layer 18B continuously from a peripheral surface of the base end portion of the surface electrode portion 16.

In the electrode structure 15 according to this example, the surface electrode portion 16 is linked to the short circuit portion 18 and is tapered to have a smaller diameter from the base end toward a tip, and is thus formed wholly like a truncated cone. Furthermore, the short circuit portion 18 linked to the base end of the surface electrode portion 16 is tapered to have a smaller diameter from the back face of the insulating layer 18B toward the surface thereof.

As shown in FIG. 4, moreover, a diameter R1 of the base end of the surface electrode portion 16 is larger than a diameter R3 of one of ends of the short circuit portion 18 linked to the base end.

The insulating layer 18B is not particularly restricted if it is a soft layer having an insulating property. For example, it is possible to use a resin sheet formed of a polyimide resin, a liquid crystal polymer, polyester, a fluorine type resin or the like, a sheet obtained by impregnating a fiber woven cloth with the resin, and the like. A material which can be etched, particularly, polyimide is preferable in that a through hole for forming the short circuit portion 18 can easily be provided by etching.

Moreover, a thickness d of the insulating layer 18B is not particularly restricted if the insulating layer 18B is soft, and is preferably 5 to 100 μm and is more preferably 10 to 50 μm.

The support material 25 is provided integrally with the insulating layer 18B and may be provided on the surface of the insulating layer 18B in a lamination state on the insulating layer 18B and may be included as an intermediate layer in the insulating layer 18B.

The support material 25 is provided apart from the electrode structure 15, and the electrode structure 15 and the support material 25 are coupled to each other through the insulating layer 18B. Therefore, the electrode structure 15 and the support material 25 are electrically insulated from each other.

According to a method of manufacturing the sheet-like probe 10 which will be described below, moreover, the support material 25 is formed by removing a part of a second back side metal layer 17A.

For a metal constituting the second back side metal layer 17A to be the support material 25, it is possible to use iron, copper, nickel, titanium, their alloy or alloy steel. In the manufacturing method which will be described below, iron-nickel alloy steel such as a 42 alloy, invar or kovar, copper, nickel and their alloy are preferable in that the second back side metal layer 17A can be easily separated and divided into the support material 25 and the back electrode portion 17 by an etching treatment.

For the support material 25, moreover, a coefficient of linear thermal expansion is preferably equal to or smaller than $3\times10^{-5}$/K, is more preferably $-1\times10^{-7}$ to $1\times10^{-5}$/K, and is particularly preferably $-1\times10^{-6}$ to $8\times10^{-6}$/K.

Specific examples of a material for constituting the support material 25 include an alloy or alloy steel, for example, an invar type alloy such as invar, an elinvar type alloy such as elinvar, super-invar, kovar or a 42-alloy.

A thickness of the support material 25 is preferably 3 to 150 μm and is more preferably 5 to 100 μm.

In some cases in which the thickness is excessively small, a necessary strength cannot be obtained as a support material for supporting the sheet-like probe. On the other hand, in some cases in which the thickness is excessively great, it is hard to carry out a separation and division into the support material 25 and the back electrode portion 17 through the second back side metal layer 17A by an etching treatment in the manufacturing method which will be described below.

Figure 11:
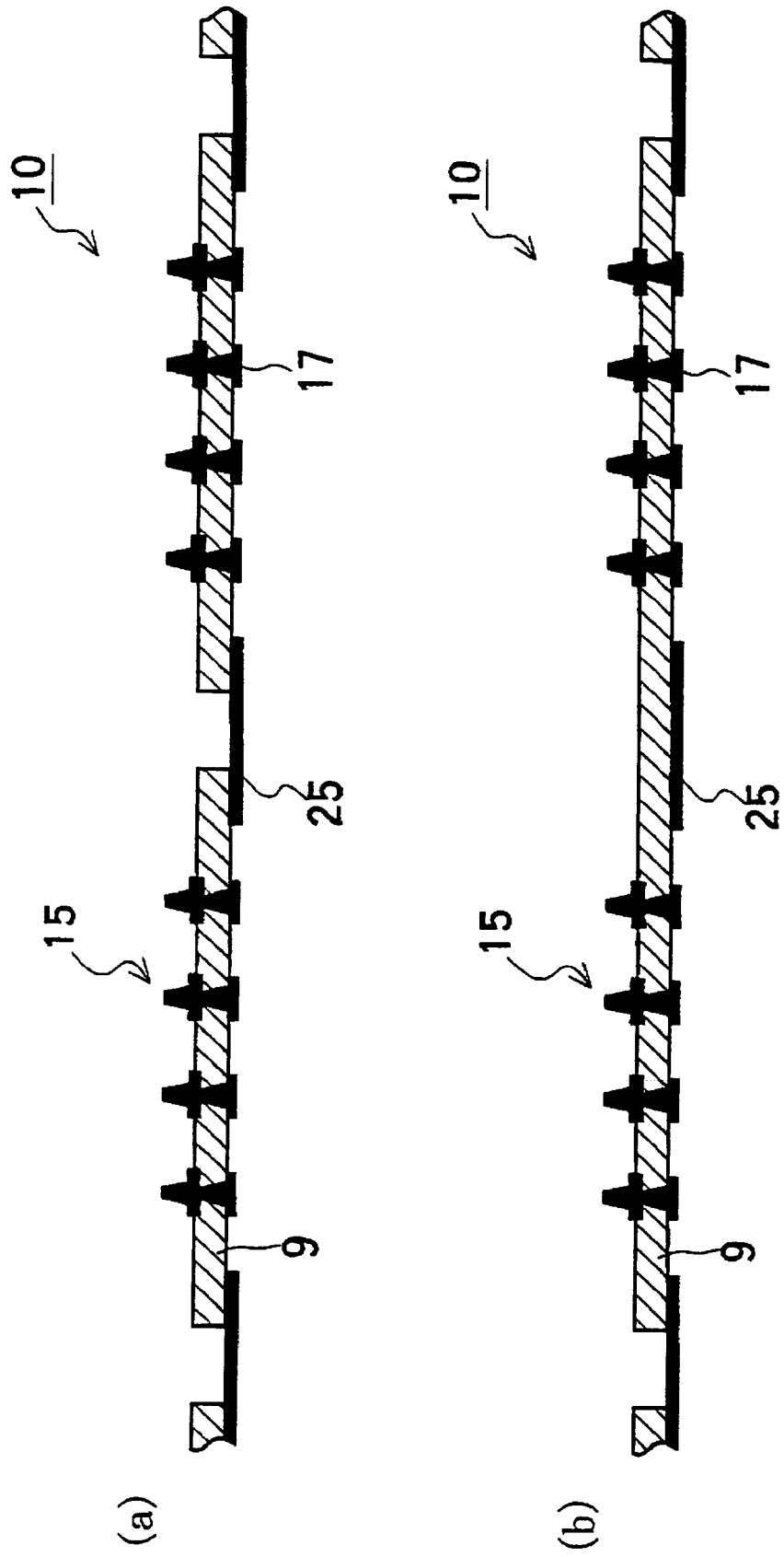
FIG. 11 is a sectional view showing a further embodiment of the sheet-like probe according to the present invention.

Moreover, the insulating sheet may be separated into a large number of contact films 9 to be supported on the support material 25 through the etching or the like as shown in FIGS. 11(*a*) and (*b*).

In this case, the soft contact films 9 for holding the electrode structures 15 in opening portions 26 of the support materials 25 are disposed independently of each other (FIG. 11(*a*)) and partially independently of each other (FIG. 11(*b*)).

As shown in FIGS. 11(*a*) and (*b*), each of the contact films 9 has the soft insulating layer 18B. In the insulating layer 18B, a plurality of electrode structures 15 extended in the direction of the thickness of the insulating layer 18B and formed of a metal is disposed apart from each other in the planar direction of the insulating layer 18B in accordance with a pattern corresponding to a pattern of an electrode to be inspected in an electrode region of a wafer to be an inspecting object. Furthermore, the contact film 9 is provided to be positioned in the opening portion of the support material 24.

For a metal constituting the electrode structure 15, it is possible to use nickel, copper, gold, silver, palladium, iron or the like. Moreover, the electrode structure 15 may be wholly formed of a single metal, may be formed of an alloy containing two kinds of metals or more or may be formed by laminating two kinds of metals or more, and the surface electrode portion 16 and the short circuit portion 18 may be constituted by different metals from each other.

Moreover, a metal coated film having a chemical stability and a high conductivity, for example, gold, silver, palladium or the like may be formed on the surfaces of the surface electrode portion 16 and the back electrode portion 17 in the electrode structure 15 in order to prevent the electrode portion from being oxidized and to obtain an electrode portion having a small contact resistance.

In the electrode structure 15, a ratio (R2/R1) of a diameter R2 in a tip to the diameter R1 of the base end of the surface electrode portion 16 is preferably 0.11 to 0.9 and is more preferably 0.15 to 0.6.

By satisfying such conditions, it is possible to reliably obtain a stable electrical connecting state for the circuit device even if the circuit device to be connected has a minute electrode having a small pitch.

Furthermore, the diameter R1 of the base end of the surface electrode portion 16 is preferably 30 to 70% of the pitch of the electrode structure 15 and is more preferably 35 to 60%.

In addition, a ratio h/R1 of a projection height h to the diameter R1 in the base end of the surface electrode portion 16 is preferably 0.2 to 0.8 and is more preferably 0.25 to 0.6.

By satisfying such conditions, it is possible to easily form the electrode structure 15 in a pattern corresponding to the pattern of the electrode and to obtain a stable electrical connecting state for the circuit device still more reliably even if the circuit device to be connected has a minute electrode having a small pitch.

The diameter R1 of the base end of the surface electrode portion 16 is set in consideration of the conditions described above and a diameter of an electrode to be connected, and is 30 to 80 μm, for example, and is more preferably 30 to 60 μm.

The projection height h of the surface electrode portion 16 is preferably 12 to 50 μm and is more preferably 15 to 30 μm in that a stable electrical connection to the electrode to be connected can be achieved.

Moreover, it is sufficient that an outside diameter R5 of the back electrode portion 17 is larger than a diameter R4 on a back side of the insulating layer 18B in the short circuit portion 18 coupled to the back electrode portion 17 and is smaller than the pitch of the electrode structure 15, the outside diameter R5 is preferably as large as possible. Consequently, it is possible to reliably achieve a stable electrical connection to an anisotropically conductive sheet, for example.

Furthermore, a thickness d2 of the back electrode portion 17 is preferably 10 to 80 μm and is more preferably 12 to 60 μm in that a strength is sufficiently high and an excellent repetitive durability can be obtained.

In addition, a ratio R3/R4 of the diameter R3 on the surface side of the insulating layer 18B to the diameter R4 on the back side of the insulating layer 18B of the short circuit portion 18 is preferably 0.2 to 1 and is more preferably 0.3 to 0.9.

Moreover, the diameter R3 on the surface side of the insulating layer 18B of the short circuit portion 18 is preferably 10 to 50% of the pitch of the electrode structure 15 and is more preferably 15 to 45%.

Furthermore, a diameter R6 of the holding portion 19 is preferably 30 to 70% of the pitch of the electrode structure 15 and is more preferably 40 to 60%.

In addition, a thickness d1 of the holding portion 19 is preferably 3 to 50 μm and is more preferably 4 to 40 μm.

Figure 5:
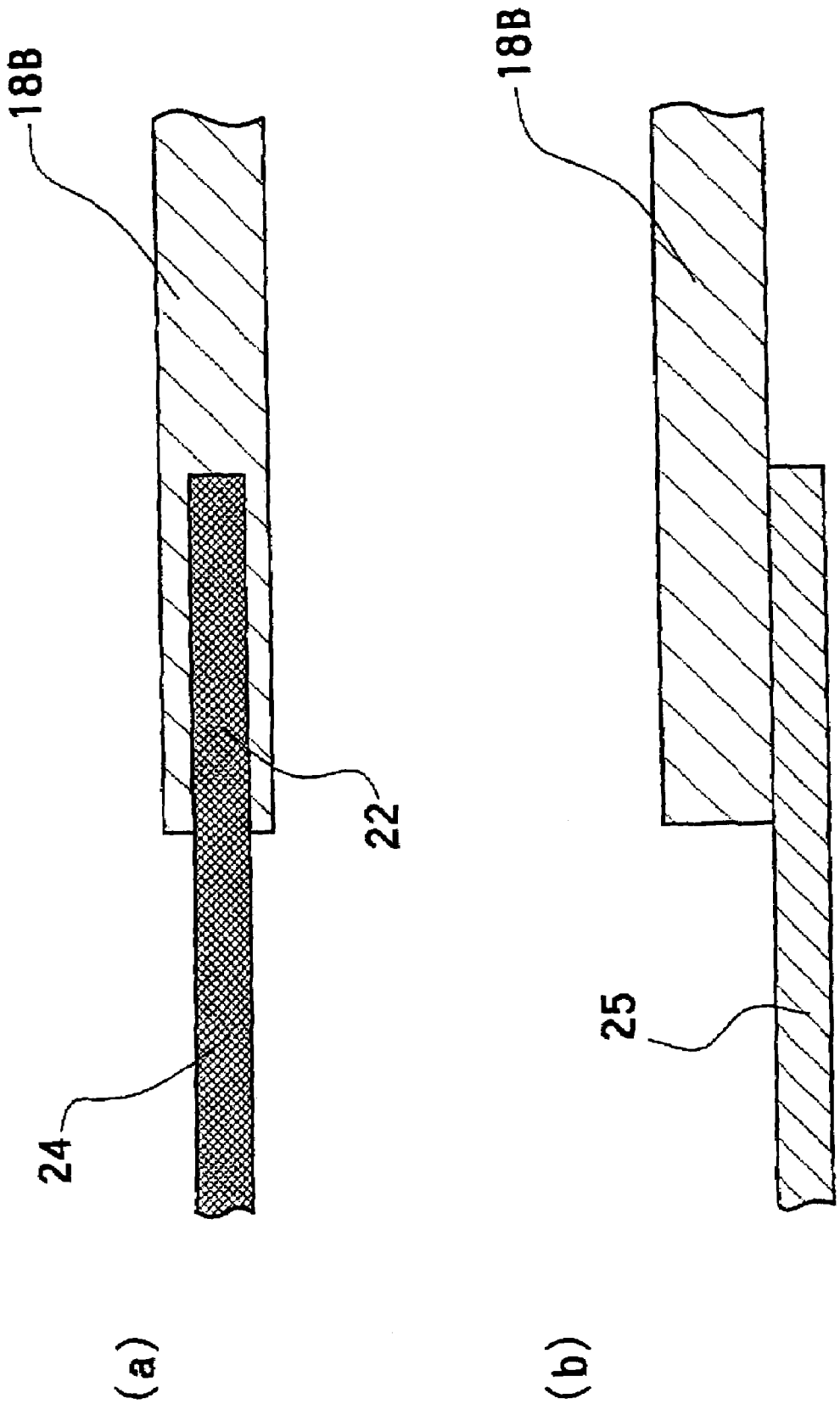
FIG. 5(a) is a sectional view showing a support portion of the contact film in the sheet-like probe according to the present invention and FIG. 5(b) is a sectional view showing the case in which a plate-shaped support material is used as a support material and an insulating layer is supported on a surface thereof.

Moreover, the sheet-like probe 10 according to the present invention can also employ a structure in which the perforated film 24 is provided in the insulating layer 18B in addition to a structure in which the insulating layer 18B is supported by the support material 25 as shown in FIG. 5, and this structure is shown in FIGS. 6 to 9.

A method of manufacturing the sheet-like probe 10 according to the present invention shown in FIGS. 6 to 9 will be described later in detail and there is employed a basically identical structure except for a difference in a configuration for supporting the insulating layer 18B by the support material 25 or the perforated film 24.

The sheet-like probe 10 has the perforated film 24 having a through hole formed in each position corresponding to each integrated circuit over a wafer to be an object to be an inspected, and the contact film 9 is disposed in the through hole.

The contact film 9 is supported on the perforated film 24 through the support portion 22 in the peripheral portion of the through hole of the perforated film 24.

Figure 6:
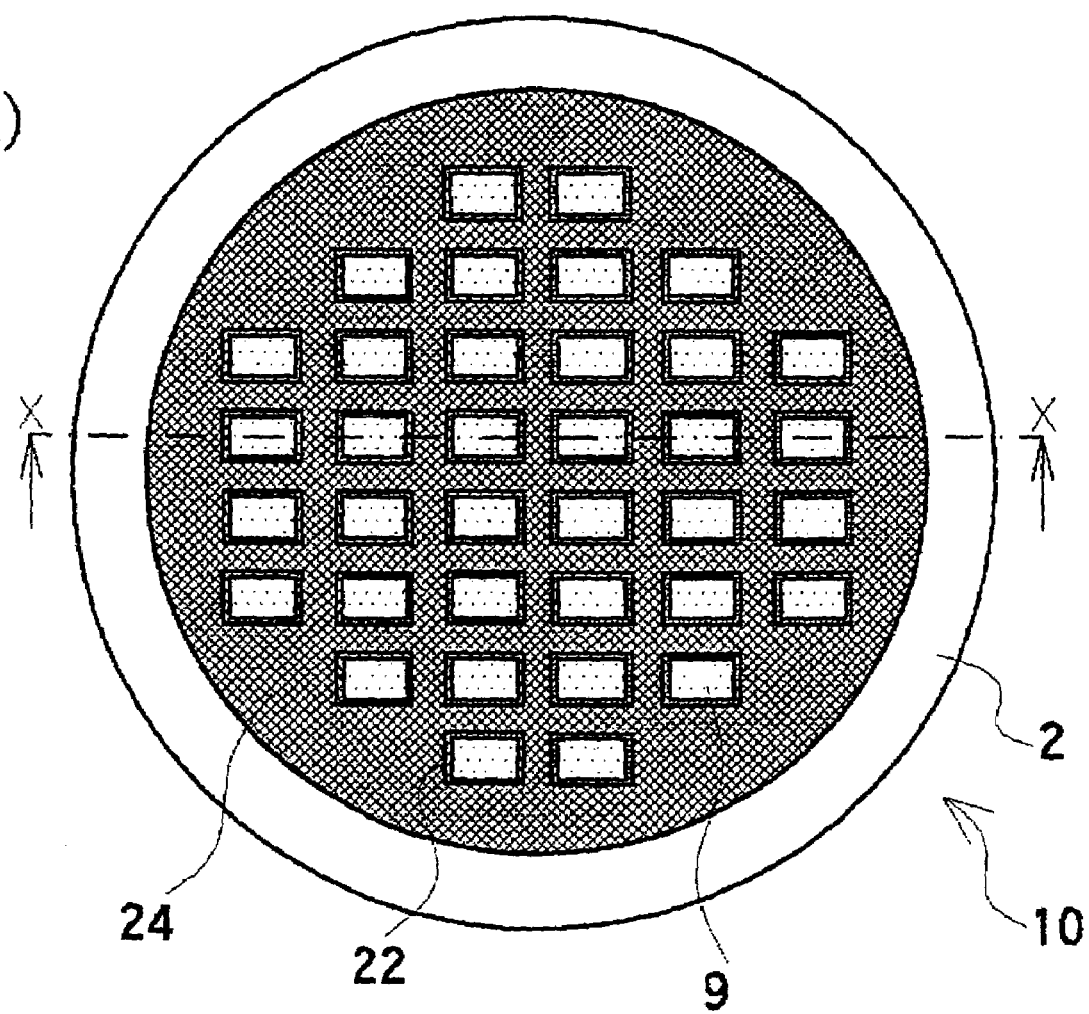
FIG. 6 is a view showing yet another embodiment of the sheet-like probe according to the present invention, FIG. 6(a) being a plan view and FIG. 6(b) being a sectional view taken along an X-X line.
Figure 6:
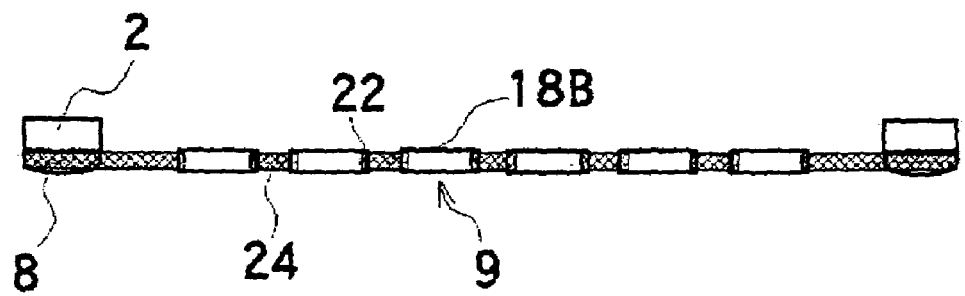
Figure 7:
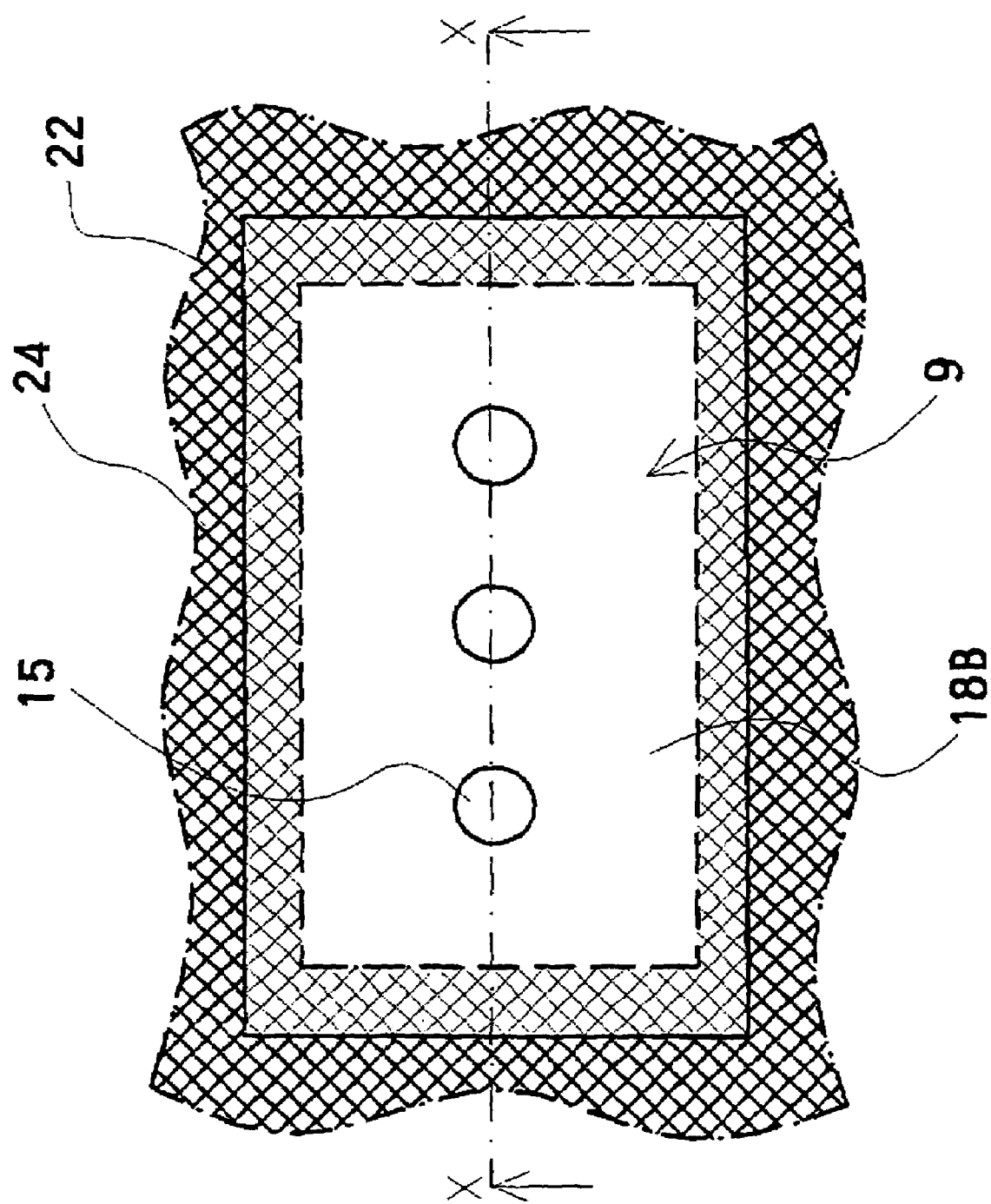
FIG. 7 is a plan view showing an enlarged contact film in the sheet-like probe of FIG. 6.
Figure 8:
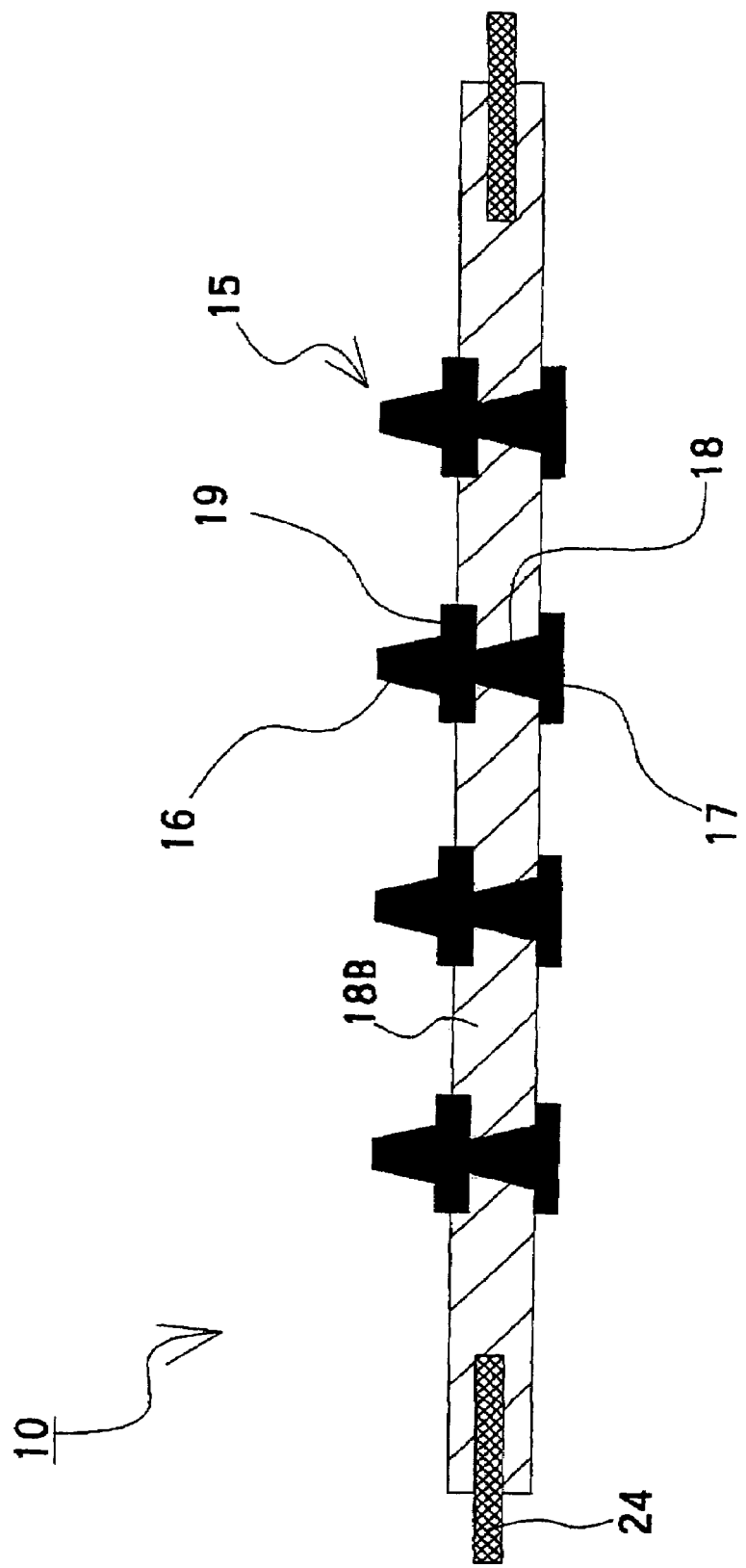
FIG. 8 is an explanatory sectional view showing a structure of the sheet-like probe according to the present invention.
Figure 9:
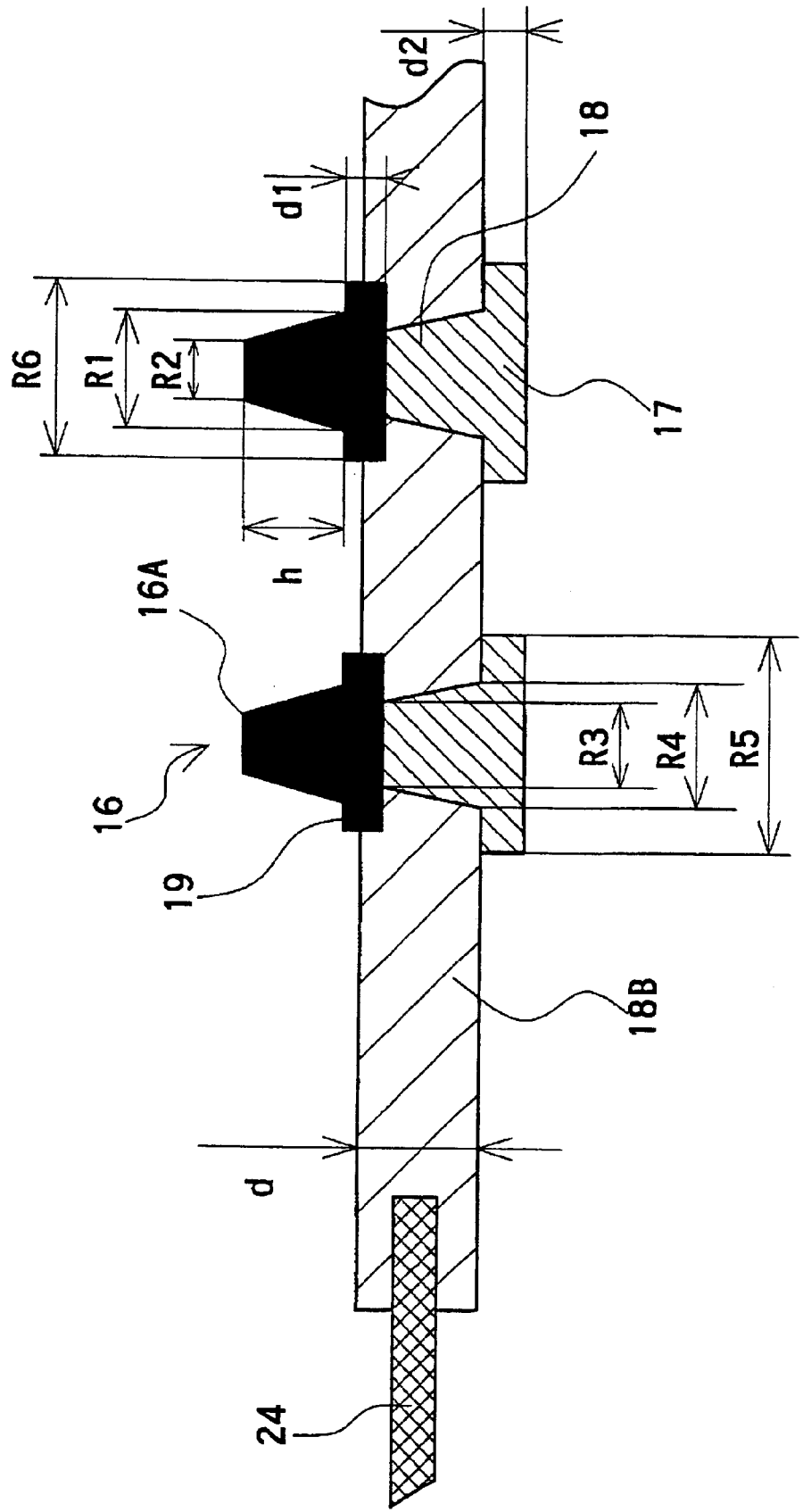
FIG. 9 is an explanatory sectional view showing an enlarged electrode structure in the sheet-like probe according to the present invention.

As shown in FIG. 6(*b*), for the support portion 22, there is formed an integrated structure in which the insulating layer 18B formed of a resin is inserted into the perforated film 24, and the contact film 9 is supported at the integrated portion.

Figure 12:
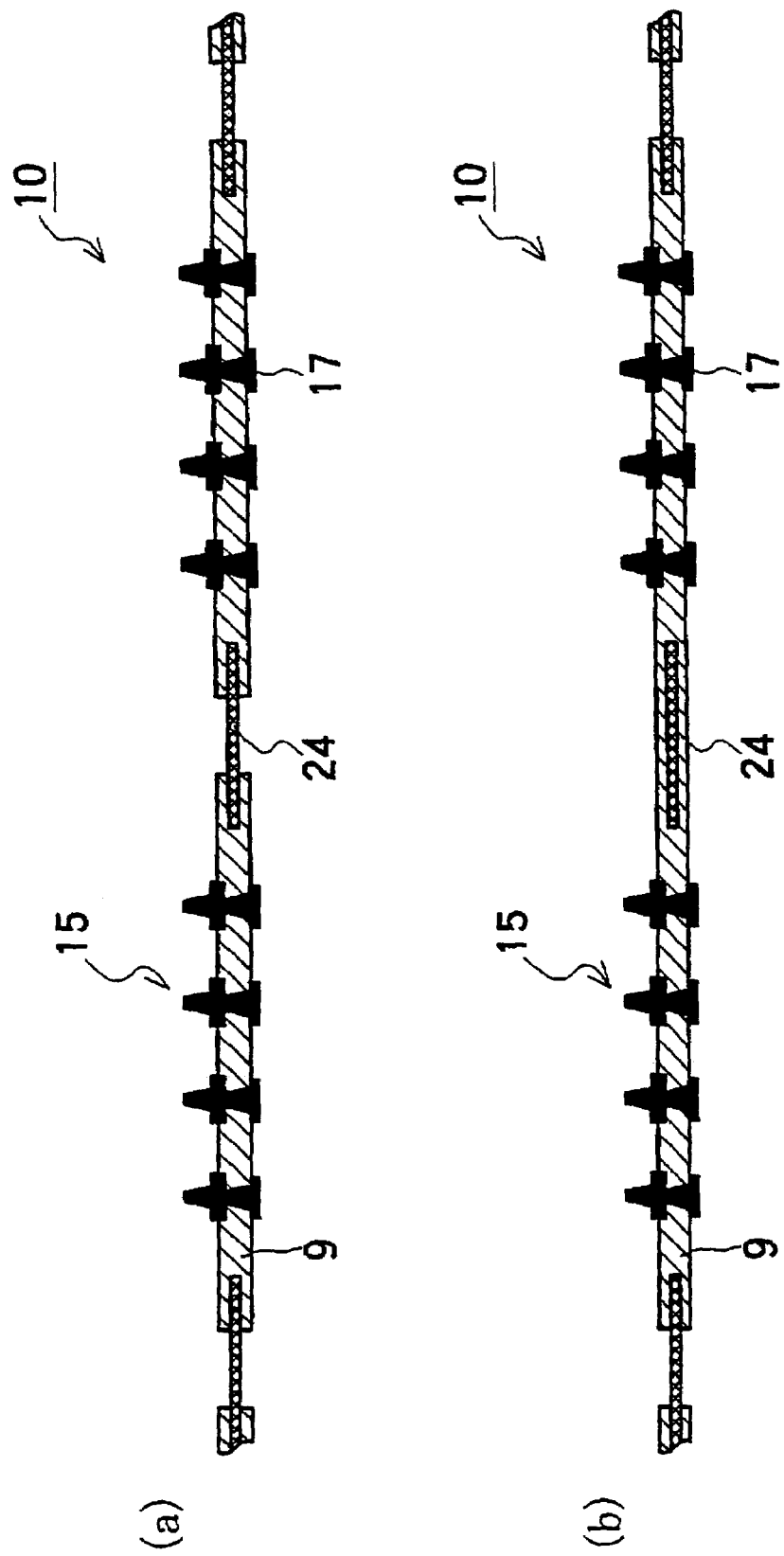
FIG. 12 is a sectional view showing a further embodiment of the sheet-like probe according to the present invention.

In such a sheet-like probe 10, the soft contact films 9 holding the electrode structures 15 in respective opening portions of the contact films may be disposed independently of each other (FIG. 12(*a*)) or partially independently of each other (FIG. 12(*b*)).

Figure 13:
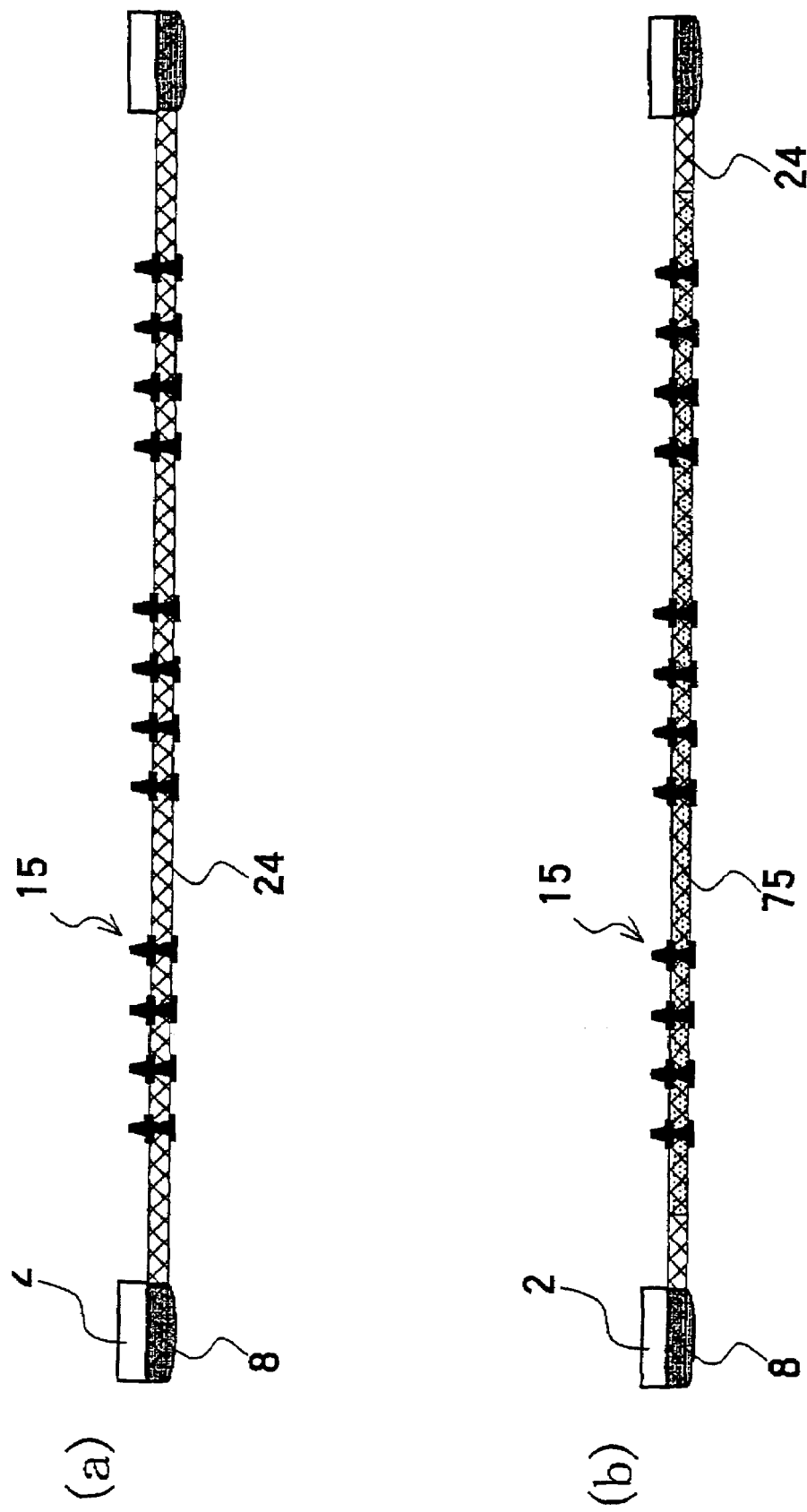
FIG. 13 is a sectional view showing a further embodiment of the sheet-like probe according to the present invention.

As described above, in addition to a structure in which the contact film 9 is formed, the sheet-like probe according to the present invention can also employ another structure in which the perforated film 24 is provided, for instance, a structure in which the electrode structure 15 is directly supported to penetrate through the perforated film 24 as shown in FIG. 13(*a*), or the electrode structure 15 is supported to penetrate through a resin impregnated perforated film sheet 75 in which an elastic polymer substance is impregnated to the perforated film 24 except for the peripheral edge portion thereof as shown in FIG. 13(*b*).

A method of fabricating the above described electrode structure 15 in the sheet-like probe is described in Japanese Laid-Open Patent Publication No. 1999-204177 and Japanese Laid-Open Patent Publication No. 2003-92317.

A plate ring-shaped support plate 2 with a rigidity is provided in the peripheral edge portion of the sheet-like probe 10.

In such a sheet-like probe 10, the plate ring-shaped support plate 2 is bonded and fixed to the perforated film 24 through an adhesive 8 as shown in FIG. 6(*b*).

A material of the ring-shaped support plate 2 includes a metal material having low thermal expansion, for example, an invar type alloy such as invar or super-invar, an elinvar type alloy such as elinvar, kovar, a 42-alloy or the like and a ceramics material such as alumina, silicon carbide or silicon nitride.

By supporting the sheet-like probe 10 with the rigidity of the support plate 2, a hole formed on the frame plate is engaged with a guide pin provided on a probe card which will be described below, for example. Consequently, it is possible to easily align the electrode structure 15 provided in the contact film 9 of the sheet-like probe 10 with an electrode to be inspected in an object to be inspected or a conducting portion of an anisotropically conducive connector.

Moreover, the support plate 2 and a peripheral step portion provided in a peripheral edge portion of the probe card are fitted each other in the probe card. Consequently, it is possible to easily align the electrode structure 15 provided in the contact film 9 of the sheet-like probe 10 with an electrode to be inspected in an object to be inspected or a conducting portion of an anisotropically conducive connector.

Also in case of repetitive use in an inspection, furthermore, it is possible to reliably prevent sticking to the object to be inspected and a positional shift from a predetermined position of the electrode structure 15.

As the perforated film 24 of the sheet-like probe of a type in which the insulating layer 18B is supported by the perforated film 24 as shown in FIGS. 6 to 9, a perforated film with flexibility such as a mesh or a non woven fabric made of an organic fiber can be used.

As an organic fiber for forming a mesh or a nonwoven fabric, for instance, a fluororesin fiber such as an aramide fiber, a polyethylene fiber, a polyacrylate fiber, a nylon fiber, and a polytetrafluoroethylene fiber, and a polyester fiber can be mentioned.

For instance, a mesh made of a synthetic fiber with a fiber diameter in the range of 15 to 100 µm and a diameter of a mesh opening in the range of 20 to 200 µm can be used. In addition, a membrane filter made of polytetrafluoroethylene with a diameter of an opening in the range of 1 to 5 µm can also be used.

As the perforated film 24, a mesh made of a metal can also be used. As a metal for forming a mesh, for instance, a stainless steel and aluminum can be mentioned.

The sheet-like probe 10 using the perforated film 24 has a high fixing strength since the support portion 22 of the contact film 9 has the structure in which the perforated film 24 is integrated with the insulating layer 18B. Consequently, it is possible to obtain a high repetitive durability in an electrical inspection by means of an inspecting apparatus using the sheet-like probe 10.

On the other hand, for the sheet-like probe 10 using the support material 24 as shown in FIGS. 1 to 4, the insulating layer 18B is easy to be peeled as compared with the case using the perforated film 24 since the support portion 22 is a junction at the interface in the case in which the plate-shaped support material 24 made of a metal is used as a support material to support the insulating layer 18B on the surface thereof.

For this reason, it is preferable to properly select a method of supporting the insulating layer 18B in consideration of a manufacturing cost and the like.

Moreover, these sheet-like probes 10 comprise the support material 25 for supporting the insulating layer 18B in an inspection for a wafer and the ring-shaped support plate 2 in the outer edge portion of the perforated film 24, and the wafer can be thus inspected well.

Figure 10:
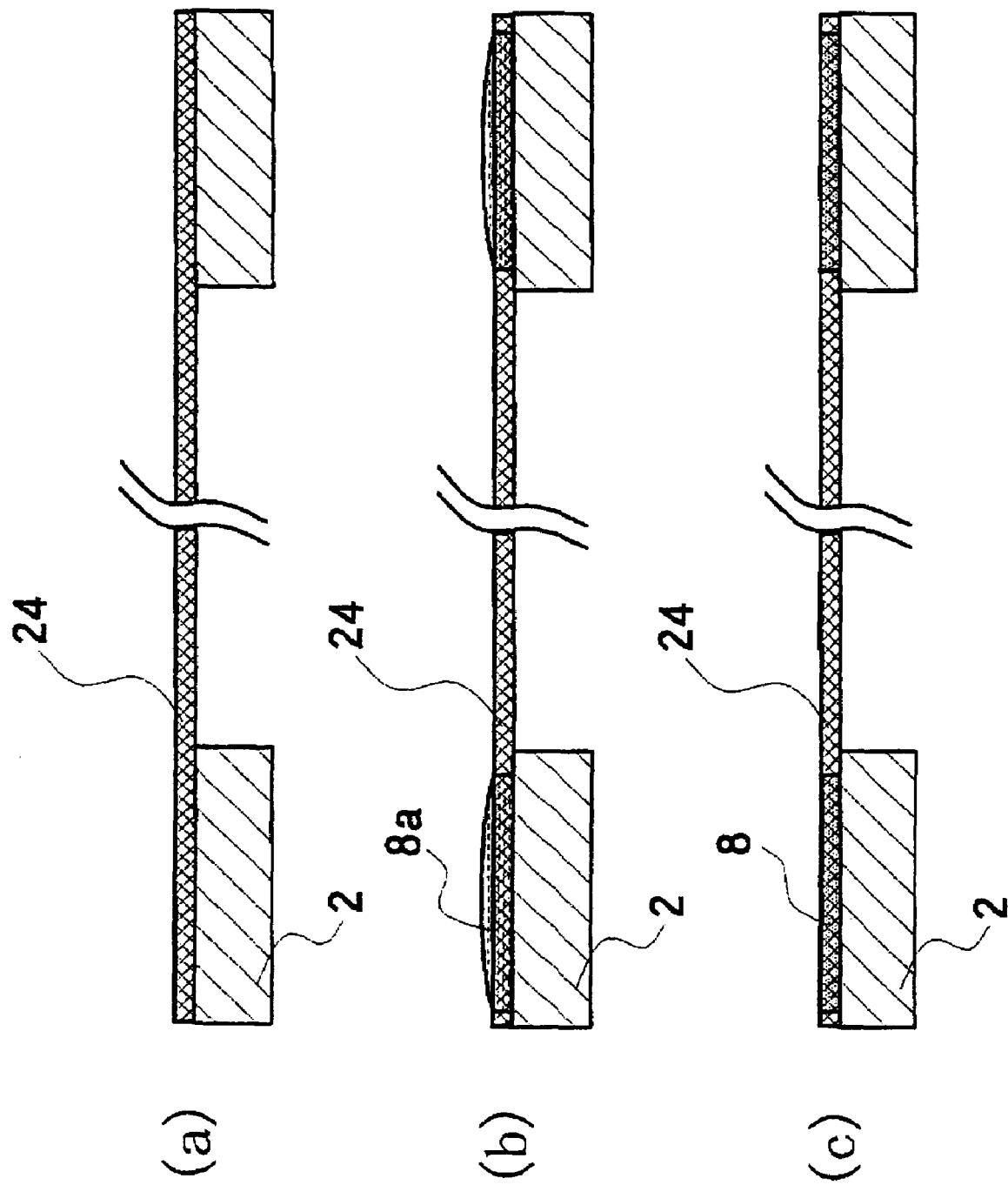
FIG. 10 is an explanatory sectional view showing a method of bonding a support plate in the sheet-like probe according to the present invention.

FIG. 10 shows the sheet-like probe 10 in which the insulating layer 18B is supported by the perforated film 24 as an example.

More specifically, as shown in FIG. 10, the perforated film 24 and the support plate 2 are superposed (FIG. 10(a)), a non-cured adhesive 8a is dropped or coated on the surface of the perforated film side of the obtained laminate material to impregnate the non-cured adhesive 8a into the perforated film 24 in order to reach the interface with the support plate 2 (FIG. 10(b)), and the perforated film 24 and the support plate 2 are bonded by curing the adhesive (FIG. 10(c)).

Consequently, as shown in the figure, the adhesive 8 is impregnated into the perforated film 24, and the perforated film 24 and the support plate 2 are fixed in the state in which the perforated film 24 and the support plate 2 directly come into contact with each other.

As the adhesive 8 for bonding the perforated film 24 and the support plate 2, for instance, an epoxy resin type adhesive, an urethane type adhesive, a silicon type adhesive, and a cyanoacrylate type adhesive can be mentioned.

<Method of Manufacturing Sheet-Like Probe>

A method of manufacturing the sheet-like probe 10 will be described below.

Referring to the method of manufacturing the sheet-like probe 10 having such a structure that the insulating layer 18B is supported on the support material 25, as shown in FIG. 14(a), first of all, there is prepared the laminate material 10A constituted by an insulating sheet 11, a surface side metal layer 16A formed on a surface of the insulating sheet 11 and a first back side metal layer 19A formed on a back face of the insulating sheet 11.

As for the insulating sheet 11, a total of a thickness of the insulating sheet 11 and that of the first back side metal layer 19A is assumed to be equivalent to a projection height of the surface electrode portion 16 in the electrode structure 15 to be formed.

Moreover, as for a material for constituting the insulating sheet 11 which has an insulating property and is flexible is not particularly restricted and it is possible to use a resin sheet formed by a polyimide resin, a liquid crystal polymer, polyester, a fluorine type resin or the like, a sheet obtained by impregnating a fiber woven cloth with the resin and the like, for example. A material which can be etched is preferable and polyimide is particularly preferable in that a through hole for forming the surface electrode portion 16 can easily be formed by etching.

If the insulating sheet 11 is flexible, moreover, a thickness of the insulating sheet 11 is not particularly restricted but is preferably 10 to 50 µm and is more preferably 10 to 25 µm.

For such a laminate material 10A, it is possible to use a laminated polyimide sheet obtained by laminating a metal layer formed of copper on both sides which has generally been put on the market, for example.

For the laminate material 10A, as shown in FIG. 14(b), a protective film 40A is laminated over a whole surface of the surface side metal layer 16A, and furthermore, a resist film 12A for etching, which has a plurality of pattern holes 12H formed in accordance with a pattern corresponding to a pattern of the electrode structure 15 to be formed, is provided on a surface of the first back side metal layer 19A.

For a material for forming the resist film 12A, it is possible to use various materials to be utilized as a photoresist for etching.

For the first back side metal layer 19A, subsequently, an etching treatment is carried out over a portion exposed through the pattern hole 12H of the resist film 12A and the portion is then removed. As shown in FIG. 14(c), consequently, a plurality of pattern holes 19H communicating with the pattern holes 12H of the resist film 12A is formed on the first back side metal layer 19A, respectively.

For the insulating sheet 11, then, the etching treatment is carried out over a portion exposed through each of the pattern holes 12H of the resist film 12A and each of the pattern holes 19H of the first back side metal layer 19A and the portion is thus removed. As shown in FIG. 15(a), consequently, the insulating sheet 11 is provided with a plurality of through holes 11H which communicates with the pattern holes 19H of the first back side metal layer 19A and is tapered to have smaller diameters from a back face of the insulating sheet 11 toward a surface thereof, respectively.

Consequently, a back face of the laminate material 10A is provided with a plurality of concave portions 10K for forming a surface electrode portion with which the pattern holes 19H of the first back side metal layer 19A and the through holes 11H of the insulating sheet 11 communicate, respectively.

In the foregoing, an etchant for carrying out the etching treatment over the first back side metal layer 19A is properly selected corresponding to a material for forming these metal layers. In the case in which these metal layers are formed of copper, for example, it is possible to use an iron(III) chloride solution.

Moreover, it is possible to use an amine type etchant, a hydrazine type solution, a potassium hydroxide solution and the like as an etchant for carrying out the etching treatment over the insulating sheet 11. By selecting etching treatment conditions, it is possible to form, on the insulating sheet 11, the tapered through hole 11H having a smaller diameter from a back face toward a surface.

Thus, the resist film 12A is removed from the laminate material 10A provided with the concave portion 10K for forming a surface electrode portion. Then, a resist film 13A for plating, which is provided with a plurality of pattern holes 13H in accordance with a pattern corresponding to a pattern of the holding portion 19 in the electrode structure 15 to be formed, is provided on the surface of the first back side metal layer 19A in the laminate material 10A as shown in FIG. 15(b).

While various materials utilized as a photoresist for plating can be used as a material forming the resist film 13A, a photosensitive dry film resist is preferable.

Subsequently, an electrolytic plating treatment is carried out over the laminate material 10A by using the surface side metal layer 16A as an electrode, and a metal is filled in each of the concave portions 10K for forming a surface electrode portion and each of the pattern holes 13H of the resist film 13A. As shown in FIG. 15(c), consequently, there are formed the surface electrode portions 16 and the holding portions 19 linked to a base end of each of the surface electrode portions 16 and extended outward along the back face of the insulating sheet 11. The holding portions 19 are maintained to be coupled to each other through the first back side metal layer 19A.

Thereafter, as shown in FIG. 16(a), the resist film 13A is removed, and as shown in FIG. 16(b), the insulating layer 18A is formed in order to cover the first back side metal layer 19A and the holding portion 19.

As shown in FIG. 16(c), the perforated film 24 provided with the specified opening portion is laminated on the insulating layer 18A formed in order to cover the first back side metal layer 19A and the holding portion 19 in such a manner that the holding portion 19 formed on the laminate material 10B is disposed in the opening portion.

Figure 17:
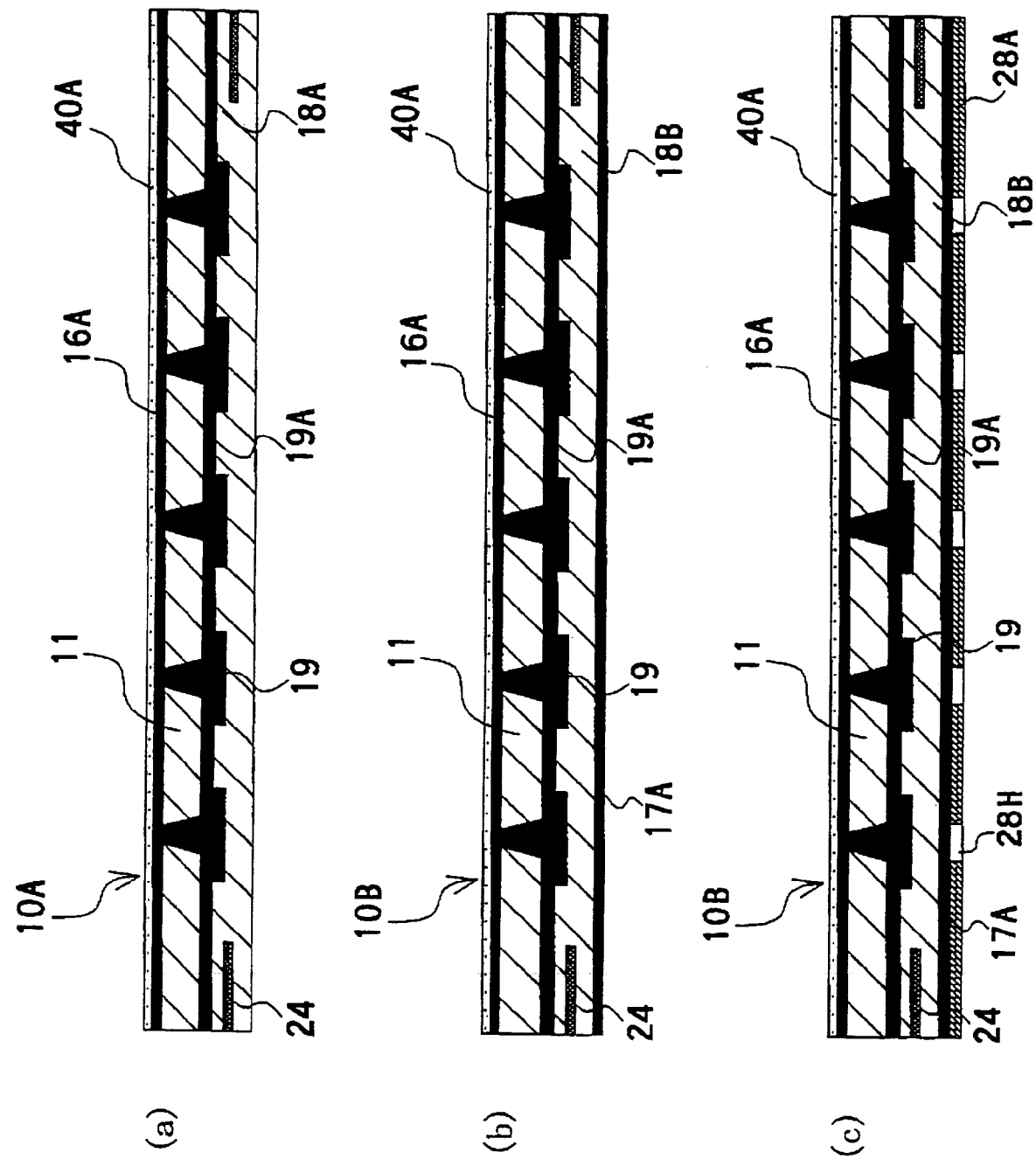
FIG. 17 is an explanatory sectional view showing the structure of the laminate material for manufacturing the sheet-like probe according to the present invention.

Thereafter, as shown in FIG. 17(a), the insulating layer 18A is formed on the perforated film 24 again so that the perforated film 24 is disposed in the insulating layer 18A.

For a material constituting the insulating layer 18B, furthermore, a polymer material which can be etched is used preferably and the polyimide is used more preferably.

It is possible to use, for the polyimide, (1) a photosensitive polyimide solution, a polyimide precursor solution, and liquid polyimide or varnish obtained by diluting a polyimide precursor or low-molecular polyimide with a solvent, (2) thermoplastic polyimide, (3) a polyimide film, and the like.

Since the photosensitive polyimide solution, the polyimide precursor solution and the liquid polyimide or varnish obtained by diluting a polyimide precursor or low molecular polyimide with a solvent have a low viscosity, particularly, they can be applied in a solution and are cured (polymerized) after the application. Consequently, a volume is reduced by the evaporation or polymerization of the solvent.

In the case in which the photosensitive polyimide solution, the polyimide precursor solution and the liquid polyimide or varnish obtained by diluting the polyimide precursor or the low-molecular polyimide with the solvent are used, it is preferable to apply them onto the laminate material 10A and to cure them, thereby forming the insulating layer 18B.

For the thermoplastic polyimide, moreover, it is possible to employ:

a method of dissolving the thermoplastic polyimide in a solvent to prepare a polyimide solution, applying the polyimide solution to the laminate material 10A and then evaporating the solvent to form the insulating layer 18B; or a method of laminating a thermoplastic polyimide film on the laminate material 10A and integrating the thermoplastic polyimide film with the laminate material 10A by heating and pressing, thereby forming the insulating layer 18B.

Furthermore, the polyimide film is dissolved by neither a heat nor a solvent and is thus stable. In the case in which such a polyimide film is used, it is possible to form the insulating layer 18A by:

a method of laminating the polyimide film on the laminate material 10A through the thermoplastic polyimide film and integrating them by heating and pressing;

a method of forming a polyimide layer in a semicuring state on the surface of the polyimide film through the photosensitive polyimide solution, the polyimide precursor solution, or the liquid polyimide or varnish obtained by diluting the polyimide precursor or the low-molecular polyimide with the solvent and then laminating the same polyimide layer on the laminate material 10A and curing and integrating them, or the like.

As shown in FIG. 17(b), moreover, the second back side metal layer 17A is formed on the insulating layer 18B. For the laminate material 10B, then, the resist film 28A for etching which has a plurality of pattern holes 28H formed in accordance with a pattern corresponding to the pattern of the electrode structure 15 to be formed, is provided on the surface of the second back side metal layer 17A as shown in FIG. 17(c).

For the insulating layer 18B according to the present invention, a resin having a flexibility is used.

If a material for forming the insulating layer 18B is a resin material having an electrical insulating property, there is no particular restriction. For example, a polyimide type resin, a liquid crystal polymer and a composite material thereof can be used.

For a material constituting the insulating layer 18B, polyimide which can easily form the support portion 22 integrated with the perforated film 24 and which can be easily etched is used preferably.

It is preferable to use, for forming the insulating layer by the polyimide, (1) a photosensitive polyimide solution, a polyimide precursor solution, and liquid polyimide or varnish obtained by diluting a polyimide precursor or low-molecular polyimide with a solvent, (2) thermoplastic polyimide, (3) a polyimide film, and the like, in order to form a resin layer.

According to such a sheet-like probe 10, the electrode structure 15 is provided with the holding portion 19 extended outward along the surface of the insulating layer 18B continuously from the base end portion of the surface electrode portion 16. Even if the surface electrode portion 16 has a small diameter, therefore, the holding portion 19 is maintained to be supported on the surface of the insulating layer 18B. Consequently, the electrode structure 15 can be prevented from slipping from a back face of the insulating layer 18B so that a high durability can be obtained.

Moreover, the surface electrode portion 16 having a small diameter is provided. Therefore, a distance between the adjacent surface electrode portions 16 is maintained sufficiently. Consequently, the flexibility of the insulating layer 18B can be exhibited fully. As a result, it is also possible to reliably achieve a stable electrical connecting state for a circuit device in which an electrode is formed at a small pitch.

For a material to form the resist film 28A, it is possible to use various materials to be utilized as a photoresist for etching.

Figure 18:
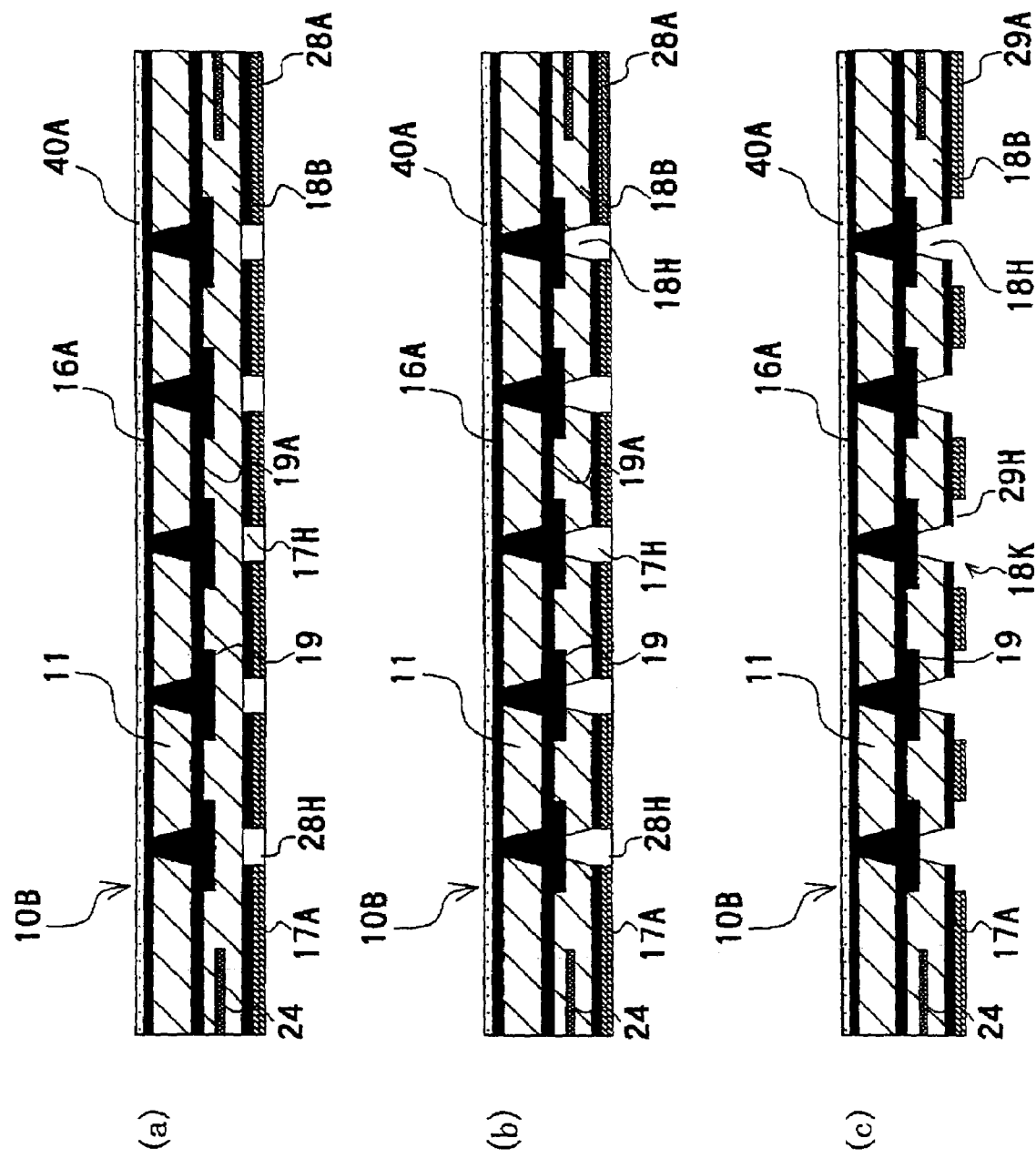
FIG. 18 is an explanatory sectional view showing the structure of the laminate material for manufacturing the sheet-like probe according to the present invention.

For the second back side metal layer 17A, subsequently, an etching treatment is carried out over a portion exposed through the pattern hole 28H of the resist film 28A and the portion is thus removed. As shown in FIG. 18(*a*), consequently, a plurality of pattern holes 17H communicating with the pattern holes 28H of the resist film 28A is formed on the second back side metal layer 17A, respectively.

For the insulating layer 18B, thereafter, the etching treatment is carried out over a portion exposed through each of the pattern holes 28H of the resist film 28A and each of the through holes 17H of the second back side metal layer 17A and the portion is thus removed. As shown in FIG. 18(*b*), consequently, the insulating layer 18B is provided with a plurality of tapered through holes 18H which communicates with the pattern holes 19H of the first back side metal layer 19A and has smaller diameters from a back face of the insulating layer 18B toward a surface thereof respectively, and has a bottom face from which the surface electrode portion 16 is exposed.

Consequently, the back face of the laminate material 10B is provided with a plurality of concave portions 18K for forming a short circuit portion with which the pattern holes 17H of the second back side metal layer 17A and the through holes 18H of the insulating layer 18B communicate, respectively.

In the foregoing, an etching agent for carrying out the etching treatment over the second back side metal layer 17A is properly selected depending on materials for constituting these metal layers.

As an etchant for carrying out the etching treatment over the insulating layer 18B, it is possible to use the etchant utilized for etching the insulating sheet 11.

The resist film 28A is removed from the laminate material 10B thus provided with the concave portion 18K for forming a short circuit portion. Thereafter, the resist film 29A for plating, which is provided with a plurality of pattern holes 29H in accordance with a pattern corresponding to the pattern of the back electrode portion 17 in the electrode structure 15 to be formed, is then provided on the surface of the second back side metal layer 17A in the laminate material 10B as shown in FIG. 18(*c*).

While various materials utilized as a photoresist for plating can be used as a material forming the resist film 29A, a dry film resist is preferable.

Figure 19:
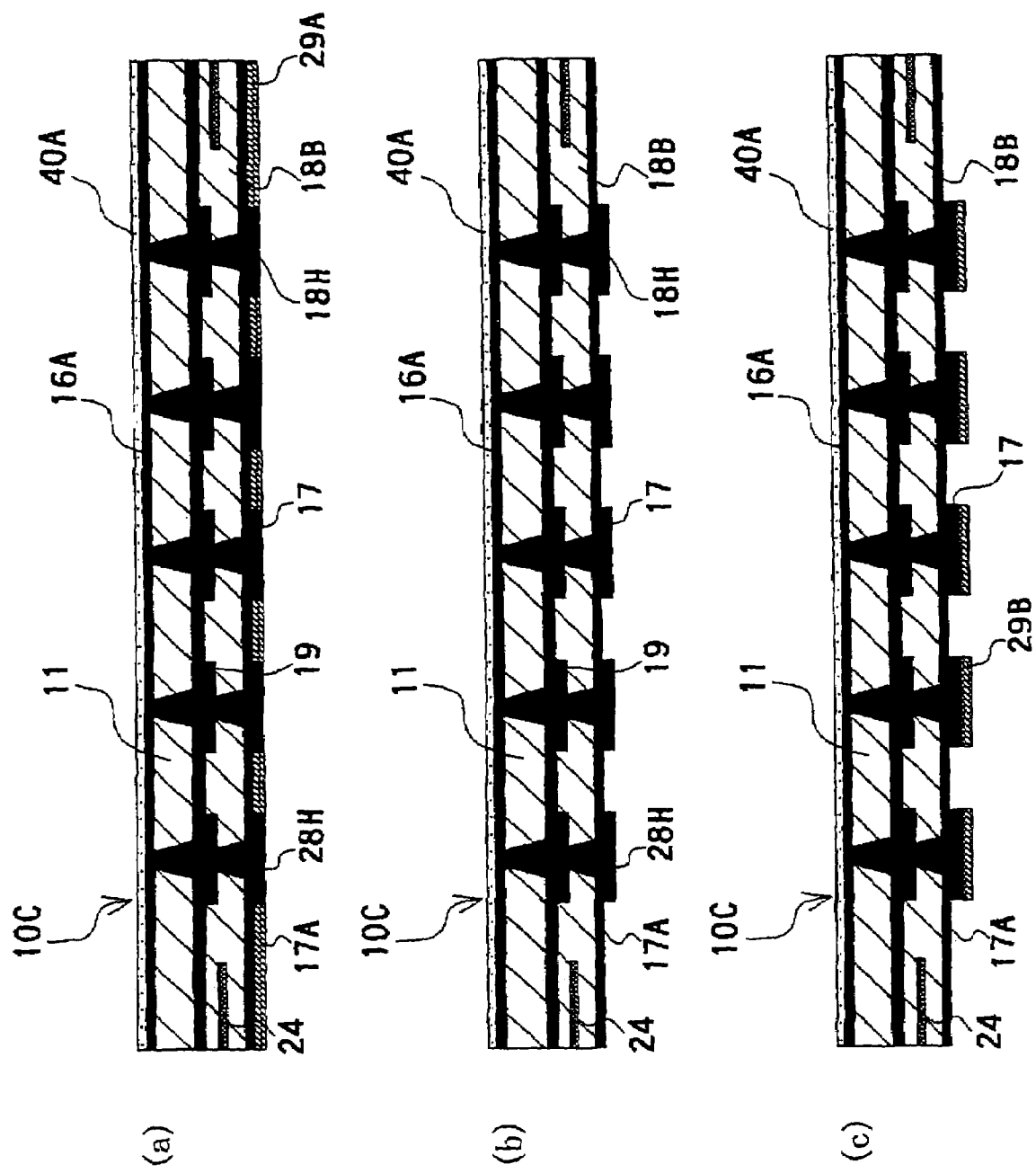
FIG. 19 is an explanatory sectional view showing another structure of the laminate material for manufacturing the sheet-like probe according to the present invention.

Subsequently, an electrolytic plating treatment is carried out over the laminate material 10B by using the surface side metal layer 16A as an electrode, and a metal is filled in each of the concave portions 18K for forming a short circuit portion and each of the pattern holes 29H of the resist film 29A. As shown in FIG. 19(*a*), consequently, there are formed the short circuit portions 18 linked to the base ends of the surface electrode portions 16 and extended to penetrate in a direction of a thickness thereof, and the back electrode portion 17 coupled to the back sides of the insulating layers 18B in the short circuit portions 18, thereby obtaining the laminate material 10C.

The back electrode portions 17 are coupled to each other through a second back side metal layer 17A.

As shown in FIG. 19(*b*), the resist film 29A is removed from the laminate material 10C in which the surface electrode portion 16, the holding portion 19, the short circuit portion 18 and the back electrode portion 17 are thus formed. As shown in FIG. 19(*c*), then, there is formed a patterned resist film 29B for etching which has a pattern hole 29K in accordance with a pattern corresponding to the portion of the second back side metal layer 17A to be removed.

For a material forming the resist film 29B, it is possible to use various materials utilized as a photoresist for etching.

Figure 20:
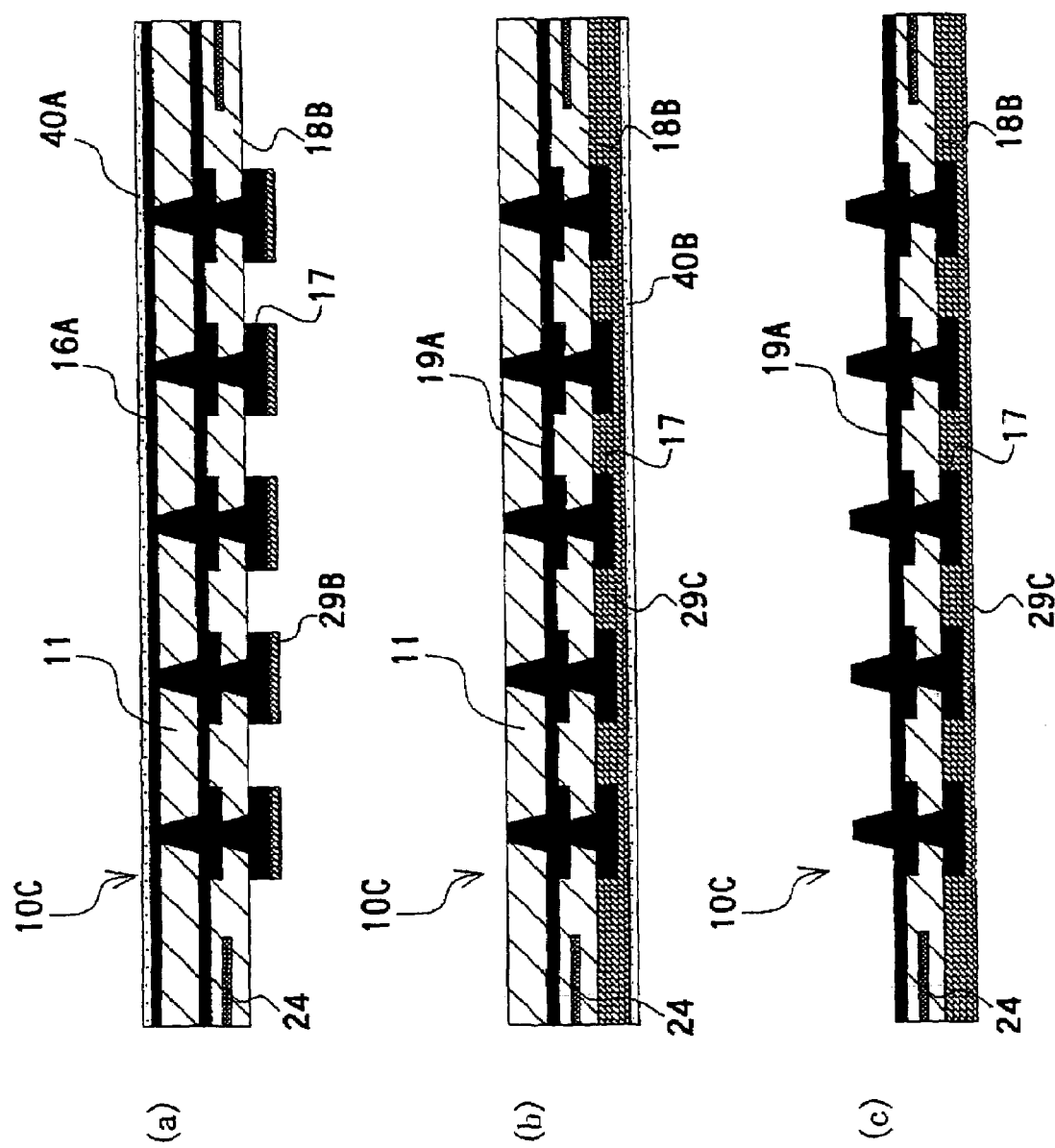
FIG. 20 is an explanatory sectional view showing yet another structure of the laminate material for manufacturing the sheet-like probe according to the present invention.

As shown in FIG. 20(*a*), furthermore, the second back side metal layer 17A is subjected to an etching treatment. Consequently, a plurality of back electrode portions 17 isolated from each other is formed.

As shown in FIG. 20(*b*), thereafter, the protective film 40A provided on the surface side metal layer 16A and the resist film 29B are removed from the laminate material 10C, the resist film 29C is formed in order to cover the insulating layer 18B and the back electrode portion 17, and the protective film 40B is laminated over a whole surface of the resist film 29C. Subsequently, the surface side metal layer 16A is subjected to an etching treatment, and the insulating sheet 11 is subjected to the etching treatment and a whole portion thereof is removed as shown in FIG. 20(*c*).

Figure 21:
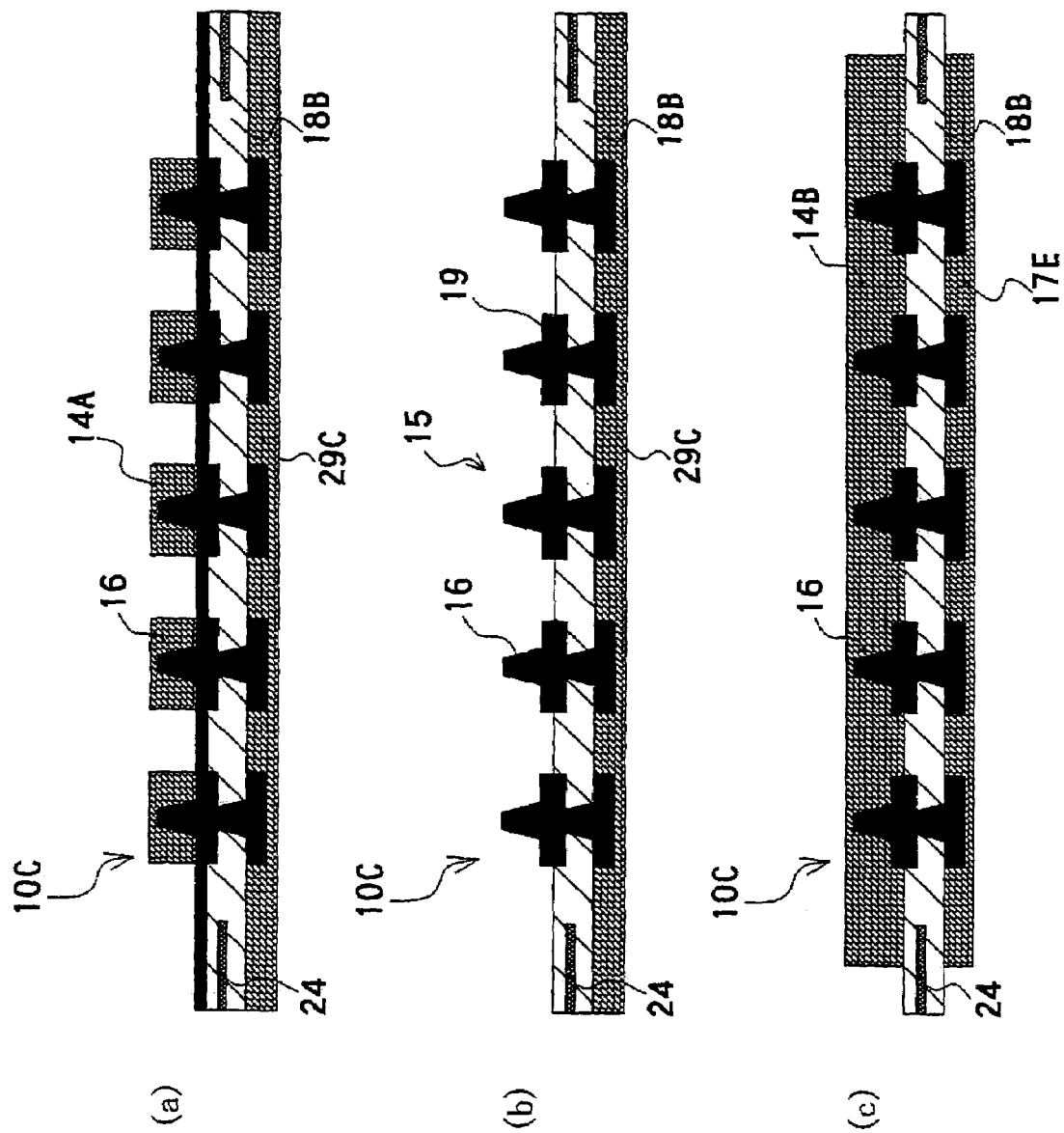
FIG. 21 is an explanatory sectional view showing a further structure of the laminate material for manufacturing the sheet-like probe according to the present invention.

As shown in FIG. 21(*a*), furthermore, the patterned resist film 14A for etching is formed in order to cover the surface electrode portion 16 and a portion to be the holding portion 19 in the first back side metal layer 19A.

Subsequently, a portion exposed after carrying out the etching treatment over the first back side metal layer 19A is removed so that the holding portion 19 is formed to be radially extended outward along the surface of the insulating layer 18B continuously from the peripheral surface of the base end portion of the surface electrode portion 16 as shown in FIG. 21(*b*). Consequently, the electrode structure 15 is formed.

Figure 22:
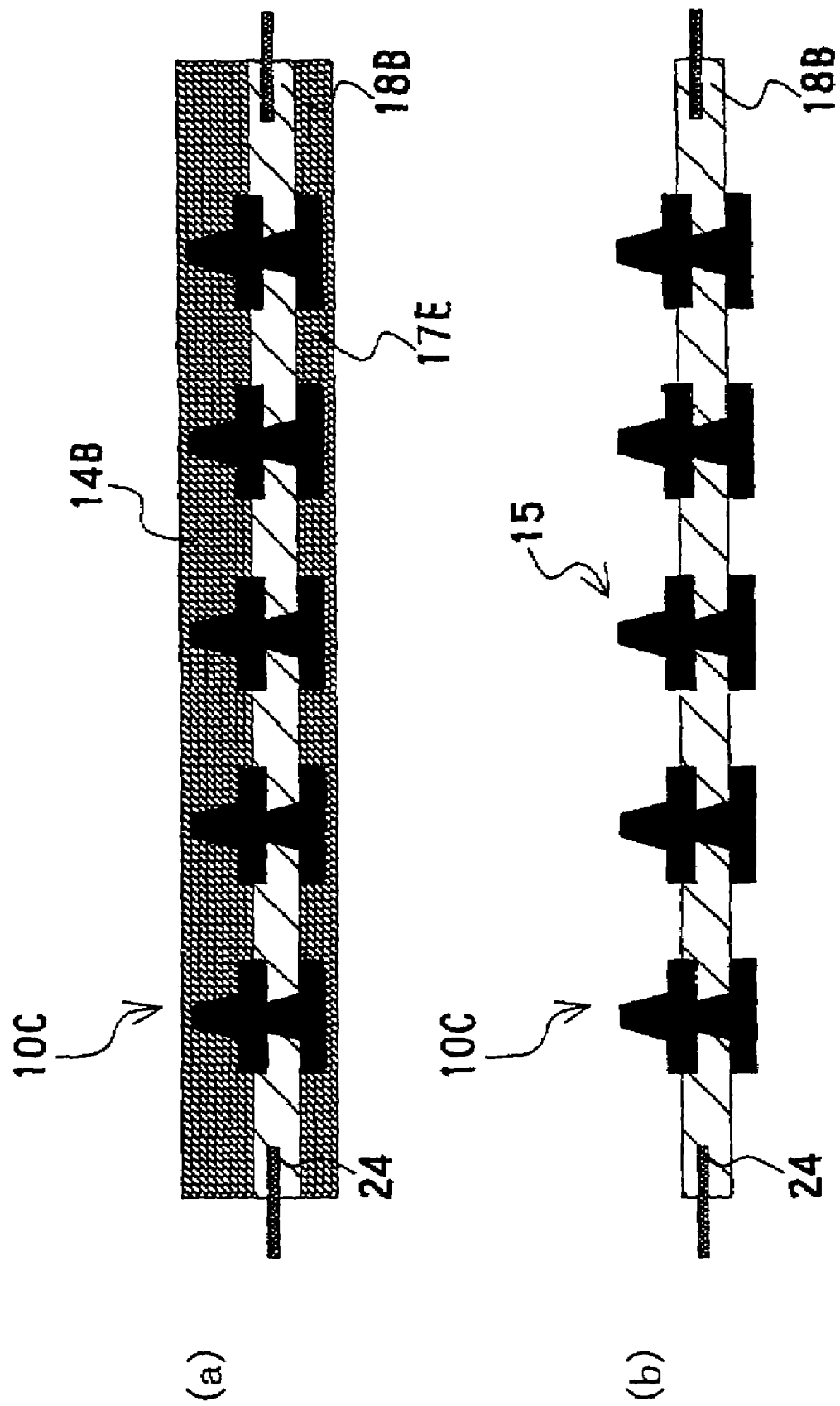
FIG. 22 is an explanatory sectional view showing a further structure of the laminate material for manufacturing the sheet-like probe according to the present invention.

As shown in FIG. 21(*c*), furthermore, the resist films 14B and 17E are formed on the upper and lower surfaces of the laminate material 10A in order to expose a part of the perforated film 24, and an etching treatment is carried out so that a part of the perforated film 24 is exposed as shown in FIG. 22(*a*).

As shown in FIG. 22(*b*), moreover, the resist films 14B and 17E are removed from the back face of the insulating layer 18B and the back electrode portion 17. Consequently, there is obtained the sheet-like probe 10.

According to the method described above, the concave portion 10K for forming a surface electrode portion is previously formed on the laminate material 10A having the insulating sheet 11 and the surface electrode portion 16 is formed by using, as a cavity, the concave portion 10K for forming a surface electrode portion. Therefore, there is obtained the surface electrode portion 16 which has a small diameter and a small variation in a projection height.

Moreover, the first back side metal layer 19A formed on the surface of the insulating sheet 11 is subjected to the etching treatment so that it is possible to reliably form the holding portion 19 extended outward along the surface of the insulating sheet continuously from the base end portion of the surface electrode portion 16. Therefore, it is possible to manufacture the sheet-like probe 10 having a high durability which can prevent the electrode structure 15 from slipping from the back face of the insulating layer 18B even if the surface electrode portion 16 has a small diameter.

According to the method of manufacturing the sheet-like probe 10 in accordance with the present invention, moreover, the concave portion 18K for forming a short circuit portion is formed on the laminate material 10B having the insulating layer 18B laminated integrally with the insulating sheet 11 provided with the surface electrode portion 16.

Furthermore, the short circuit portion 18 is formed by using, as a cavity, the concave portion 18K for forming a short circuit portion. Therefore, the concave portion 10K for forming a surface electrode portion and the concave potion 18K for forming a short circuit portion are formed individually. For the insulating layer 18B having a great thickness, therefore, it is also possible to reliably form the concave portion 18K for forming a short circuit portion which communicates with the surface electrode portion 16 and to form the electrode structure 15 in which the short circuit portion 18 has a great thickness.

Therefore, it is possible to reliably manufacture the sheet-like probe 10 constituted by the insulating layer 18B having a great thickness.

Moreover, it is also possible to obtain the sheet-like probe 10 by a method other than the methods described above. For example, a through hole in which the electrode structure 15 is disposed is formed on the insulating layer 18B and non-electrolytic plating is then carried out over the surface of the insulating layer 18B from the internal surface of the through hole. Thereafter, through hole plating is performed in a state in which a resist film provided with an opening pattern having a diameter that is equal to or larger than a diameter of the through hole in a position thereof is disposed on either side or both sides of the insulating layer 18B. Thus, the electrode structure 15 can be formed.

In this case, the projection height of the surface electrode portion 16 or the back electrode portion 17 is defined by a height of the resist film or the like.

<Probe Card and Apparatus for Inspecting Circuit Device>

Figure 23:
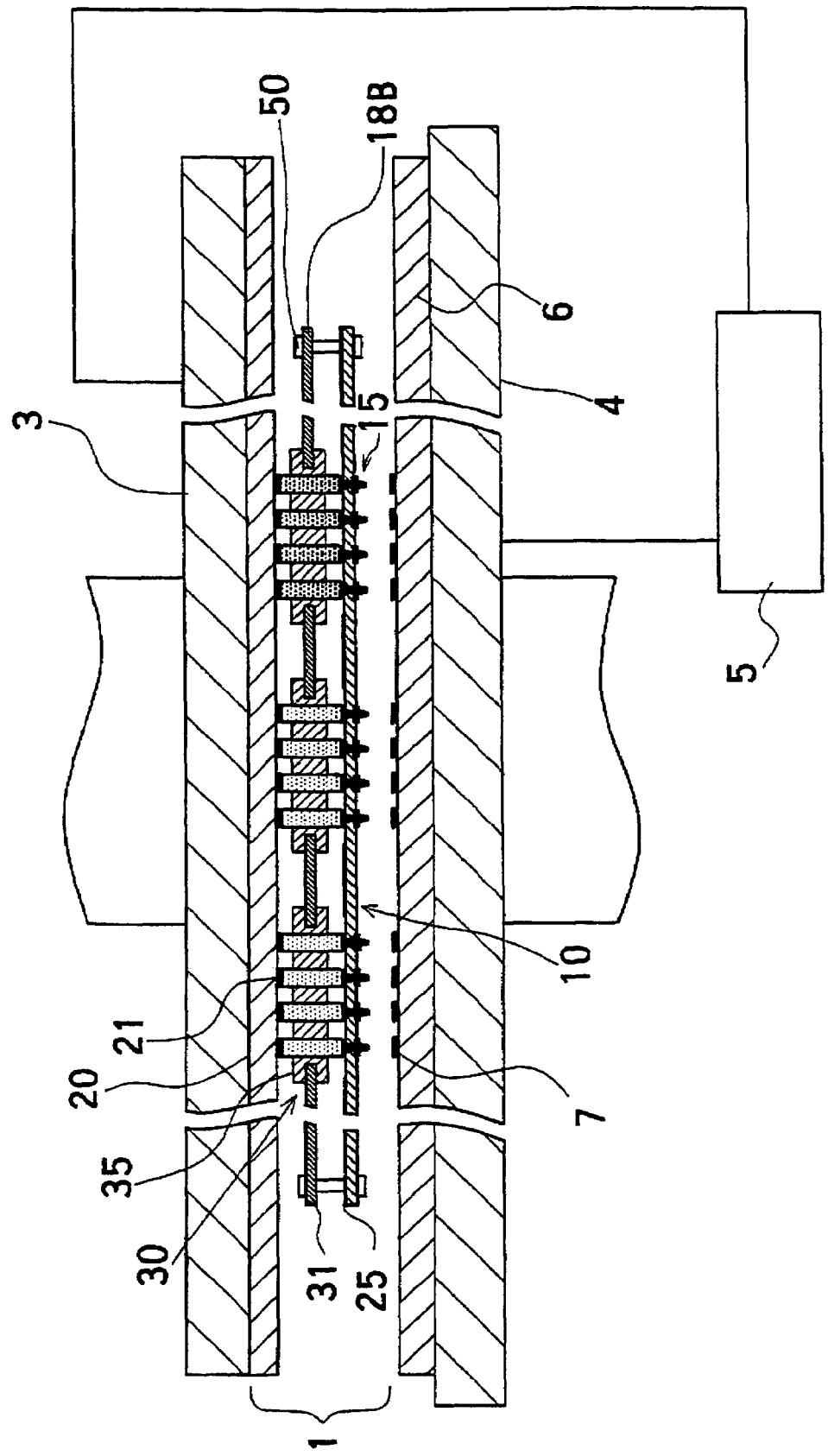
FIG. 23 is a sectional view showing an embodiment of an apparatus for inspecting a circuit device and a probe card to be used therein according to the present invention.

FIG. 23 is an explanatory sectional view showing a structure according to an example of an apparatus for inspecting a circuit device according to the present invention, and the apparatus for inspecting a circuit device serves to carry out an electrical inspection for an integrated circuit in a state of a wafer for each of the integrated circuits formed on the wafer.

The apparatus for inspecting a circuit device has a probe card 1 for carrying out an electrical connection of each of the electrodes 7 to be inspected in the wafer 6 which is a circuit device to be inspected and a tester (a sheet-like probe for supporting the insulating layer 18B on the support material 25).

Figure 26:
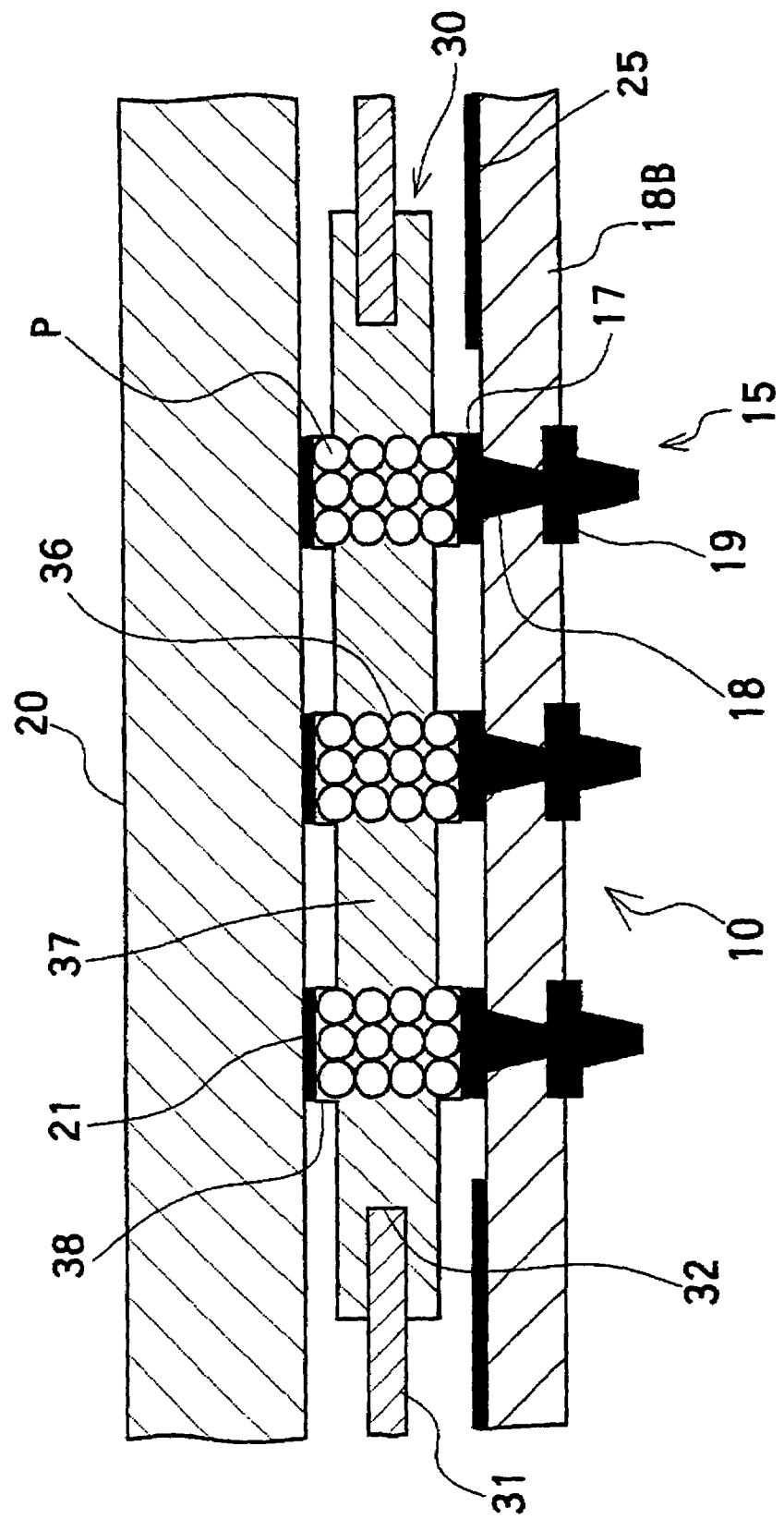
FIG. 26 is an explanatory sectional view showing the enlarged probe card in the inspecting apparatus illustrated in FIG. 24.
Figure 27:
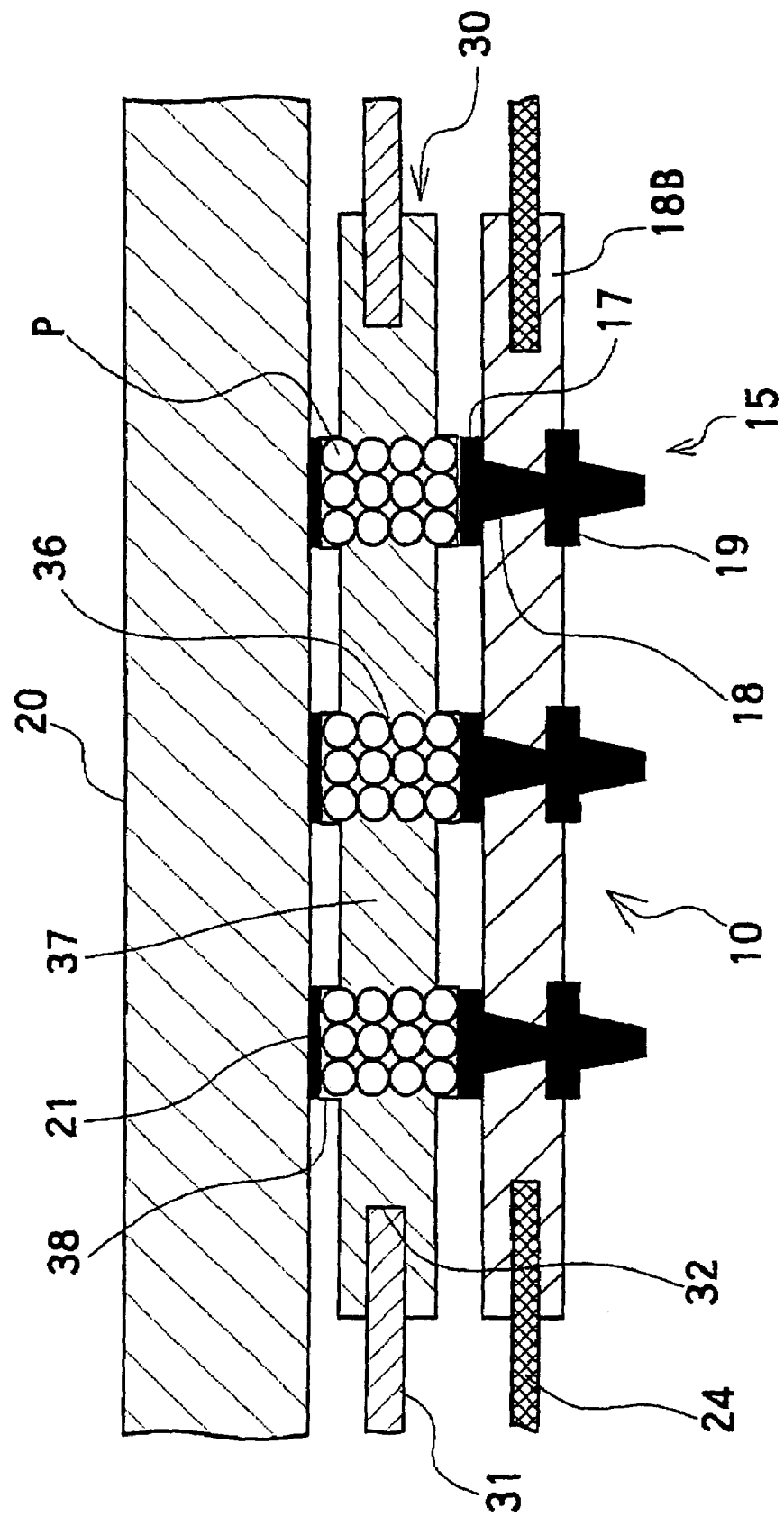
FIG. 27 is an explanatory sectional view showing the enlarged probe card in the inspecting apparatus illustrated in FIG. 25.

As shown in an enlarged view of FIG. 26, the probe card 1 has a circuit board 20 for an inspection which has a surface (a lower surface in the drawing) provided with a plurality of inspection electrodes 21 in accordance with the pattern corresponding to the pattern of the electrodes 7 to be inspected in all of the integrated circuits formed on the wafer 6.

Furthermore, the anisotropically conductive connector 30 is disposed on the surface of the circuit board 20 for an inspection. In addition, a surface (a lower surface in the drawing) of the anisotropically conductive connector 30 is provided with the sheet-like probe 10 having the structure shown in FIG. 1 in which a plurality of electrode structures 15 is disposed in accordance with the pattern corresponding to the pattern of the electrodes 7 to be inspected in all of the integrated circuits formed on the wafer 6.

The sheet-like probe 10 is held by a guide pin 50 in a state in which the anisotropically conductive connector 30, the electrode structure 15 and the conducting portion 36 are fixed to be coincident with each other.

Moreover, a pressurizing plate 3 for pressurizing the probe card 1 downward is provided on a back face (an upper face in the drawing) of the circuit board 20 for an inspection in the probe card 1. In addition, a wafer mounting table 4 for mounting the wafer 6 thereon is provided below the probe card 1 and a heater 5 is connected to each of the pressurizing plate 3 and the wafer mounting table 4.

Figure 24:
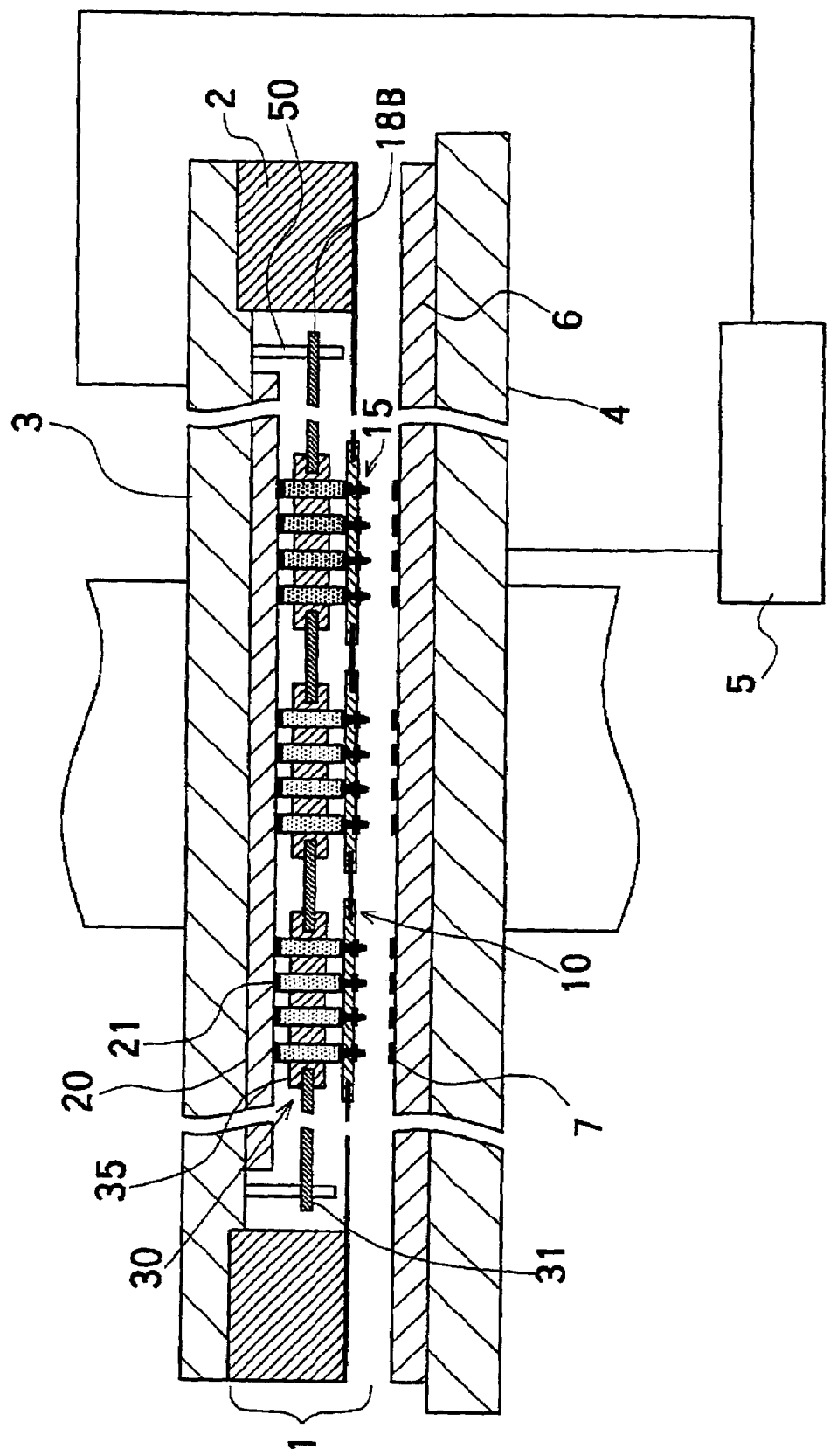
FIG. 24 is a sectional view showing another embodiment of the apparatus for inspecting a circuit device and the probe card to be used therein according to the present invention.

In the apparatus for inspecting the circuit device, moreover, in the case in which the sheet-like probe is provided with the insulating layer 18B supported on the perforated film 24, the sheet-like probe 10 is used in a state in which the support plate 2 is bonded to the outer edge portion of the perforated film 24 by an adhesive as shown in FIG. 24.

Figure 25:
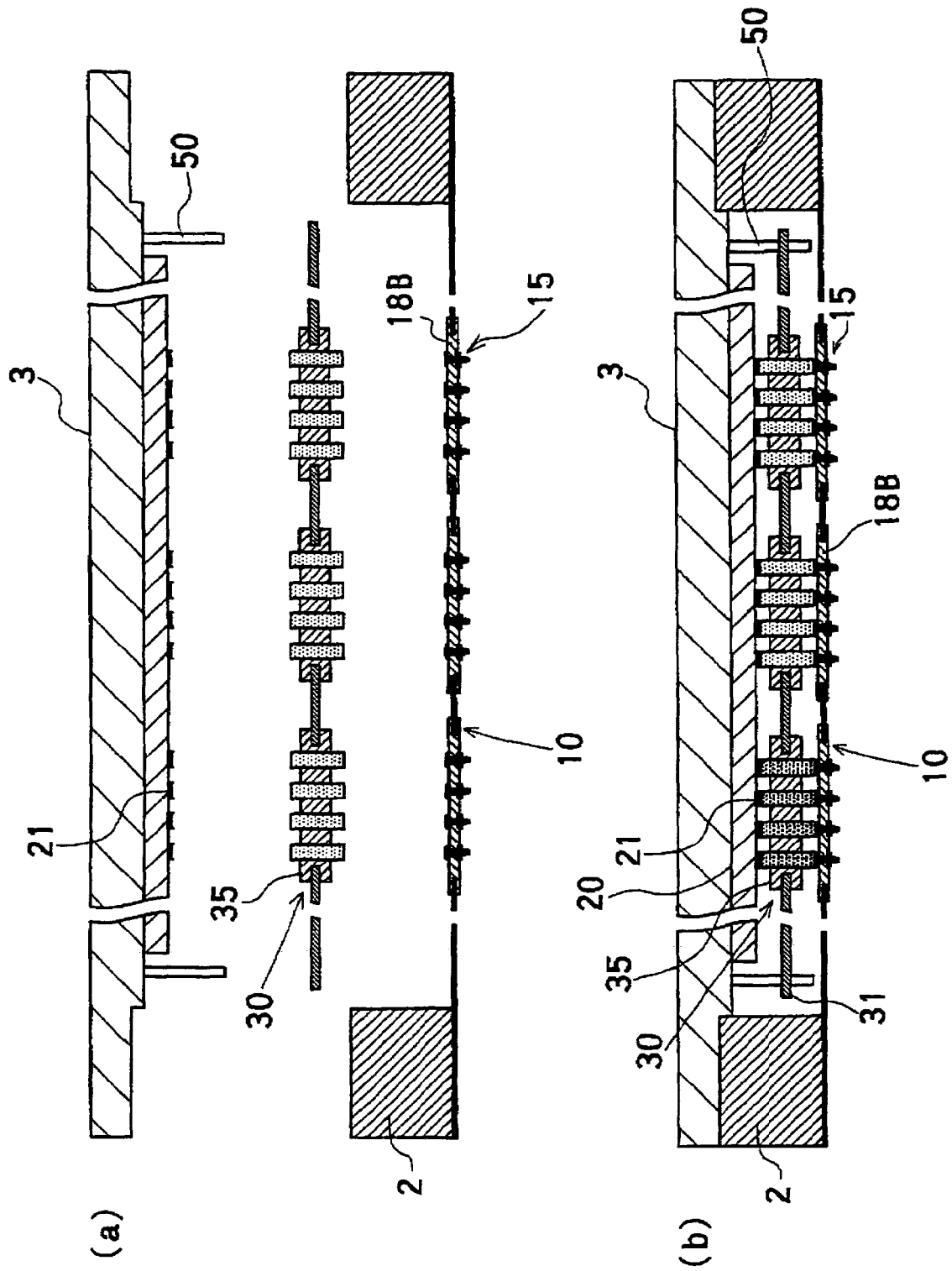
FIG. 25 is a sectional view showing each state brought before and after an assembly in the probe card of FIG. 24.

Furthermore, the apparatus for inspecting the circuit device has an exploded structure shown in FIGS. 25(a) and 25(b), and the guide pin 50 is fitted in a through hole formed on a frame plate 31 of the anisotropically conductive connector 30, thereby carrying out positioning.

In the sheet-like probe 10, moreover, the support plate 2 bonded to the outer edge portion of the perforated film 24 is fitted in the concave portion of the pressurizing plate 3 so that the positioning can be carried out.

For a board material constituting the circuit board 20 for an inspection, furthermore, it is possible to use various board materials which have been conventionally well-known and specific examples thereof include a composite resin material such as a glass fiber reinforcing type epoxy resin, a glass fiber reinforcing type phenol resin, a glass fiber reinforcing type polyimide resin or a glass fiber reinforcing type bismaleimide triazine resin, a ceramics material such as glass, silicon dioxide or alumina, and the like.

In the case in which an inspecting apparatus for carrying out a WLBI test is to be constituted, moreover, a coefficient of linear thermal expansion is preferably equal to or smaller than $3\times10^{-5}$/K, is more preferably $1\times10^{-7}$ to $1\times10^{-5}$/K, and is particularly preferably $1\times10^{-6}$ to $6\times10^{-6}$/K.

Specific examples of the board material include Pyrex (registered trademark) glass, quartz glass, alumina, beryllia, silicon carbide, aluminum nitride, boron nitride and the like.

Figure 28:
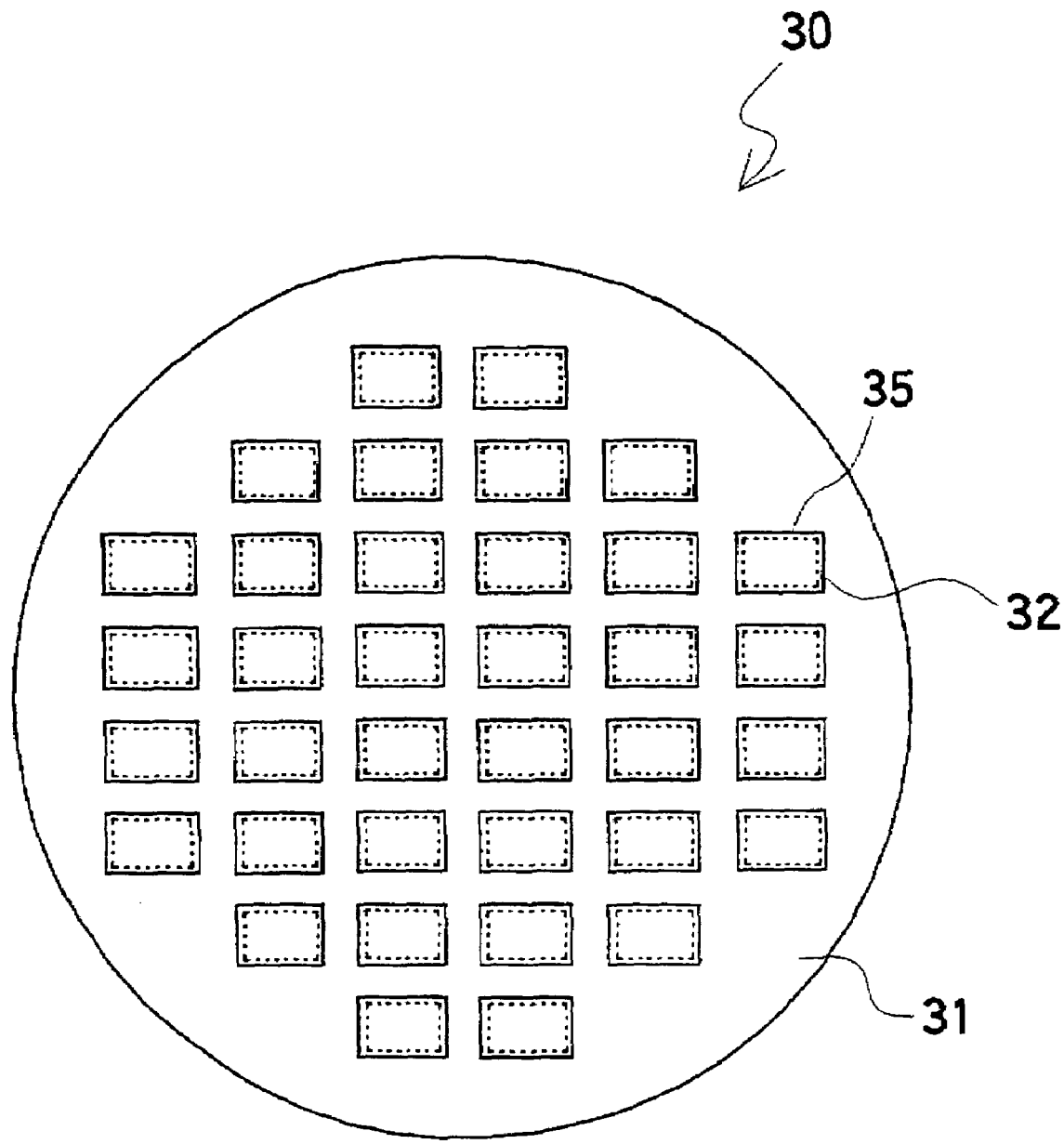
FIG. 28 is a plan view showing an anisotropically conductive connector in the probe card illustrated in FIGS. 26 and 29.

As shown in FIG. 28, the anisotropically conductive connector 30 is constituted by a frame plate 31 provided with a plurality of openings 32 corresponding to an electrode region in which the electrodes 7 to be inspected in all of the integrated circuits formed on the wafer 6 that is the circuit device to be inspected are disposed, and a plurality of anisotropically conductive sheets 35 disposed on the frame plate 31 in order to close one of the openings 32 and fixed to and supported on an opening edge portion of the frame plate 31.

A material for constituting the frame plate 31 is not particularly restricted if the frame plate 31 is not easily deformed and has such a rigidity that a shape thereof is maintained stably. For example, it is possible to use various materials such as a metal material, a ceramics material, a resin material and the like. In the case in which the frame plate 31 is constituted by the metal material, for example, an insulating coated film may be formed on the surface of the frame plate 31.

Specific examples of the metal material for constituting the frame plate 31 include a metal such as iron, copper, nickel, titanium or aluminum, an alloy or alloy steel obtained by combining at least two of them, and the like.

Specific examples of the resin material for constituting the frame plate 31 include a liquid crystal polymer, a polyimide resin and the like.

In the case in which the inspecting apparatus serves to carry out the WLBI (Wafer Level Burn-in) test, moreover, the material for constituting the frame plate 31 preferably has a coefficient of linear thermal expansion of $3 \times 10^{-5}$/K or less, more preferably $-1 \times 10^{-7}$ to $1 \times 10^{-5}$/K, and particularly preferably $1 \times 10^{-6}$ to $8 \times 10^{-6}$/K.

Specific examples of such a material include an alloy or alloy steel of a magnetic metal such as an invar type alloy such as invar, an elinvar type alloy such as elinvar, super-invar, kovar or a 42-alloy, and the like.

A thickness of the frame plate 31 is not particularly restricted if a shape thereof is maintained and the anisotropically conductive sheet 35 can be supported. A specific thickness is varied depending on a material and is preferably 25 to 600 μm and is more preferably 40 to 400 μm, for example.

Each of the anisotropically conductive sheets 35 is formed by an elastic polymer substance and is constituted by a plurality of conducting portions 36 formed in accordance with the pattern corresponding to the pattern of the electrode 7 to be inspected in one electrode region formed on the wafer 6 which is the circuit device to be inspected and extended in a direction of a thickness respectively and an insulating portion 37 for insulating the conducting portions 36 from each other.

In the example shown in the drawing, in a place in which the conducting portion 36 and a peripheral portion thereof are positioned, a projected portion 38 projected from the other surface is formed on both sides of the anisotropically conductive sheet 35.

In each of the conducting portions 36 in the anisotropically conductive sheet 35, conductive particles P exhibiting a magnetism are densely contained in a state in which they are oriented to be arranged in a direction of a thickness. On the other hand, the insulating portion 37 does not contain the conductive particles P at all or rarely contains them.

A total thickness of the anisotropically conductive sheet 35 (a thickness in the conducting portion 36 in the example of the drawing) is preferably 50 to 2000 μm, is more preferably 70 to 1000 μm, and is particularly preferably 80 to 500 μm.

If the thickness is equal to or greater than 50 μm, the anisotropically conductive sheet 35 can have a sufficient strength.

On the other hand, if the thickness is equal to or smaller than 2000 μm, the conducting portion 36 having a predetermined conductive characteristic can be obtained reliably.

A total projection height of the projected portion 38 is preferably equal to or greater than 10% of a thickness in the projected portion 38 and is more preferably equal to or greater than 15%.

By forming the projected portion 38 having such a projection height, the conducting portion 36 is sufficiently compressed by a small pressurizing force. Therefore, it is possible to reliably obtain a high conductivity.

Moreover, the projection height of the projected portion 38 is preferably equal to or smaller than 100% of the smallest width or diameter of the projected portion 38 and is more preferably equal to or smaller than 70%.

By forming the projected portion 38 having the projection height, the projected portion 38 can be prevented from being buckled in a pressurization. Therefore, it is possible to reliably obtain a predetermined conductivity.

For an elastic polymer substance for forming the anisotropically conductive sheet 35, a heat-resistant polymer substance having a crosslinking structure is preferable.

For a curing polymeric substance forming material which can be used for obtaining the crosslinked polymeric substance, various materials can be used and the liquid silicone rubber is preferable.

It is preferable that a magnetic core particle for obtaining the conductive particle P should have a number average particle diameter of 3 to 40 μm.

The number average particle diameter of the magnetic core particle is measured by a laser diffraction scattering method.

If the number average particle diameter is equal to or greater than 3 μm, it is possible to easily obtain the conducting portion 36 which can easily be pressurized and deformed and has a low resistance value and a high connecting reliability.

On the other hand, if the number average particle diameter is equal to or smaller than 40 μm, the minute conducting portion 36 can easily be formed, and furthermore, the conducting portion 36 thus obtained can easily have a stable conductivity.

For a material for constituting the magnetic core particle, it is possible to use iron, nickel, cobalt, a substance obtained by coating these metals with copper or a resin, or the like. A material which can be used preferably has a saturation magnetization of 0.1 Wb/m$^2$ or more, more preferably 0.3 Wb/m$^2$ or more and particularly preferably 0.5 Wb/m$^2$ or more, and specifically, includes iron, nickel, cobalt, their alloy or the like.

For a high conductive metal to be coated over a surface of the magnetic core particle, it is possible to use gold, silver, rhodium, platinum, chromium or the like. In particular, the gold is preferably used in that it is chemically stable and has a high conductivity.

The conductive particle P has a rate of a high conductive metal to a core particle [(a mass of a high conductive metal/a mass of a core particle)×100] which is equal to or greater than 15% by mass and is preferably 25 to 35% by mass.

In the case in which the rate of the high conducive metal is lower than 15% by mass, the conductivity of the conductive particle P is remarkably reduced when the anisotropically conductive connector 30 which is obtained is used repetitively in a high temperature environment. As a result, a predetermined conductivity cannot be maintained.

Moreover, the number average particle diameter of the conductive particle P is preferably 3 to 40 μm and is more preferably 6 to 25 μm.

By using such a conductive particle P, the anisotropically conductive sheet 35 which is obtained can easily be pressurized and deformed, and furthermore, a sufficient electrical contact can be obtained between the conductive particles P in the conducting portion 36.

Although a shape of the conductive particle P is not particularly restricted, moreover, it preferably takes the shape of a sphere, a star or a lump formed by a secondary particle obtained by aggregating them in that they can easily be dispersed in a polymeric substance forming material.

A rate of content of the conductive particle P in the conducting portion 36 has a volume fraction of 10 to 60% and preferably 15 to 50%.

In some cases in which the rate is lower than 10%, the conducting portion 36 having a sufficiently small electric resistance value cannot be obtained.

On the other hand, in some cases in which the rate is higher than 60%, the conducting portion 36 which is obtained is apt to be fragile and a necessary elasticity for the conducting portion 36 cannot be obtained.

The anisotropically conductive connector 30 described above can be manufactured by the method described in Japanese Laid-Open Patent Publication No. 2002-324600, for example.

In the inspecting apparatus described above, the wafer 6 to be an inspecting object is mounted on the wafer mounting table 4, and subsequently, the probe card 1 is pressurized downward by means of the pressurizing plate 3. Consequently, each of the surface electrode portions 16 in the electrode structure 15 of the sheet-like probe 10 comes in contact with each of the electrodes 7 to be inspected in the wafer 6. Furthermore, each of the electrodes 7 to be inspected in the wafer 6 is pressurized by each of the surface electrode portions 16.

In this state, each of the conducting portion 36 in the anisotropically conductive sheet 35 of the anisotropically conductive connector 30 is interposed between the inspection electrode 21 of the circuit board 20 for an inspection and the back electrode portion 17 of the electrode structure 15 in the sheet-like probe 10 and is compressed in a direction of a thickness.

For this reason, a conducting path is formed in the conducting portion 36 in the direction of the thickness. As a result, an electrical connection of the electrode 7 to be inspected in the wafer 6 and the inspection electrode 21 of the circuit board 20 for an inspection can be achieved.

Then, the wafer 6 is heated to have a predetermined temperature through the wafer mounting table 4 and the pressurizing plate 3 by means of the heater 5. In this state, a necessary electrical inspection is executed for each of the integrated circuits in the wafer 6.

According to the probe card 1, the sheet-like probe 10 shown in FIG. 1 is provided. For the wafer 6 on which the electrode 7 to be inspected is formed at a small pitch, therefore, it is also possible to reliably achieve a stable electrical connecting state. In addition, the electrode structure 15 in the sheet-like probe 10 can be prevented from slipping off and the insulating layer 18B has a great thickness. Consequently, a high durability can be obtained.

According to the inspecting apparatus, the probe card 1 having the sheet-like probe 10 shown in FIG. 1 is provided. For the wafer 6 on which the electrode 7 to be inspected is formed at a small pitch, therefore, it is also possible to reliably achieve a stable electrical connecting state. In addition, the probe card 1 has a high durability. Also in the case in which a large number of wafers 6 are to be inspected, therefore, it is possible to execute an inspection having a high reliability for a long period of time.

The apparatus for inspecting a circuit device according to the present invention is not restricted to the above example but various changes can be made as described below.

(1) The probe card 1 shown in FIGS. 23 and 24 collectively achieves an electrical connection to the electrodes 7 to be inspected in all of the integrated circuits formed on the wafer 6 and may be electrically connected to the electrodes 7 to be inspected in the integrated circuits selected from all of the integrated circuits formed on the wafer 6.

The number of the integrated circuits to be selected is properly selected in consideration of the size of the wafer 6, the number of the integrated circuits formed on the wafer 6, the number of the electrodes 7 to be inspected in each of the integrated circuits and the like, and is 16, 32, 64 and 128, for example.

In the inspecting apparatus having the probe card 1, there is repetitively executed the step of electrically connecting the probe card 1 to the electrodes 7 to be inspected in the integrated circuits selected from all of the integrated circuits formed on the wafer 6, thereby carrying out an inspection, and then, electrically connecting the probe card 1 to the electrodes 7 to be inspected in the integrated circuits selected from the other integrated circuits, thereby carrying out the inspection. Thus, it is possible to execute the electrical inspection for all of the integrated circuits formed on the wafer 6.

According to such an inspecting apparatus, in the case in which the electrical inspection is to be carried out for the integrated circuits formed at a high degree of integration on the wafer 6 having a diameter of 8 inches or 12 inches, it is possible to more reduce the numbers of the inspection electrodes and the wirings in the circuit board 20 for an inspection to be used as compared with a method of collectively inspecting all of the integrated circuits. Consequently, it is possible to reduce a manufacturing cost of the inspecting apparatus.

(2) In addition to a conducting portion 36 formed in accordance with a pattern corresponding to a pattern of the electrode 7 to be inspected, a conducting portion 36 for non connection which is not electrically connected to the electrode 7 to be inspected can be formed in the anisotropically conductive sheet 35 of the anisotropically conductive connector 30.

(3) The circuit device to be the inspecting object of the inspecting apparatus according to the present invention is not restricted to the wafer 6 in which a large number of integrated circuits are formed but can be constituted as an apparatus for inspecting a circuit formed in a semiconductor integrated circuit device such as a semiconductor chip, a package LSI, for example, a BGA or a CSP, or a CMC.

(4) The sheet-like probe 10 can also be fixed and integrated with the anisotropically conductive sheet 35 and the circuit board 20 for an inspection through the guide pin 50 or the like, for example, in a state in which it is held by a holding member such as cylindrical ceramic.

(5) In the method of manufacturing the sheet-like probe 10 according to the present invention, the second back side metal layer 17A is not indispensable but may be omitted to fill a metal in the concave portion 18K for forming a short circuit portion and the pattern hole 17H, thereby forming the back electrode portion 17 integrated with the short circuit portion 18.

In this case, the support material 25 can be laminated and integrated on a support material 25 and the manufactured sheet-like probe 10 which are prepared separately with an adhesive or the like.

(6) The sheet-like probe 10 according to the present invention may be set in a state in which a plurality of contact films 9 constituted by the insulating layer 18B having the electrode structure 15 shown in FIG. 11(*a*) is disposed in the opening portions 26 of the support material 25 and is supported by the support material 25, for example. Furthermore, one contact film 9 may be disposed to cover the opening portions 26 of the support material 25 as shown in FIG. 11(*b*).

Thus, the sheet-like probe 10 is constituted by the independent contact films 9. In the case in which the sheet-like probe 10 for inspecting a wafer having a diameter of 8 inches or more is constituted, for example, the expansion and contraction of the contact films 9 with a change in a temperature is reduced so that a positional shift of the electrode structure 15 is decreased, which is preferable.

Such a sheet-like probe 10 is obtained by dividing the insulating layer 18B into the contact films 9 having an optional shape through the execution of patterning and etching with a resist over the insulating layer 18B in a state shown in FIG. 21(*c*) in the method of manufacturing the sheet-like probe 10 according to the present invention.

EXAMPLES

While specific examples of the present invention will be described below, the present invention is not restricted to these examples.

<Fabrication of Wafer for Test>

Figure 29:
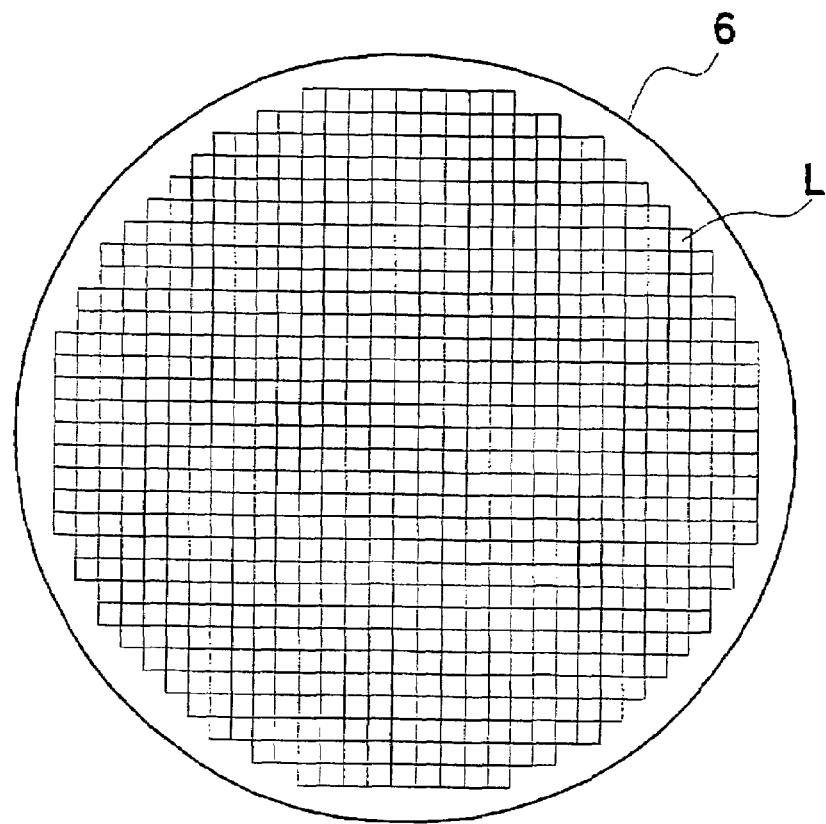
FIG. 29 is a plan view showing a wafer for a test which is fabricated in the example.

As shown in FIG. 29, 483 square integrated circuits L having a dimension of 6.85 mm×6.85 mm in total were formed on the wafer 6 made of silicon having a diameter of 8 inches (a coefficient of linear thermal expansion of $3.3 \times 10^{-6}$/K).

Figure 30:
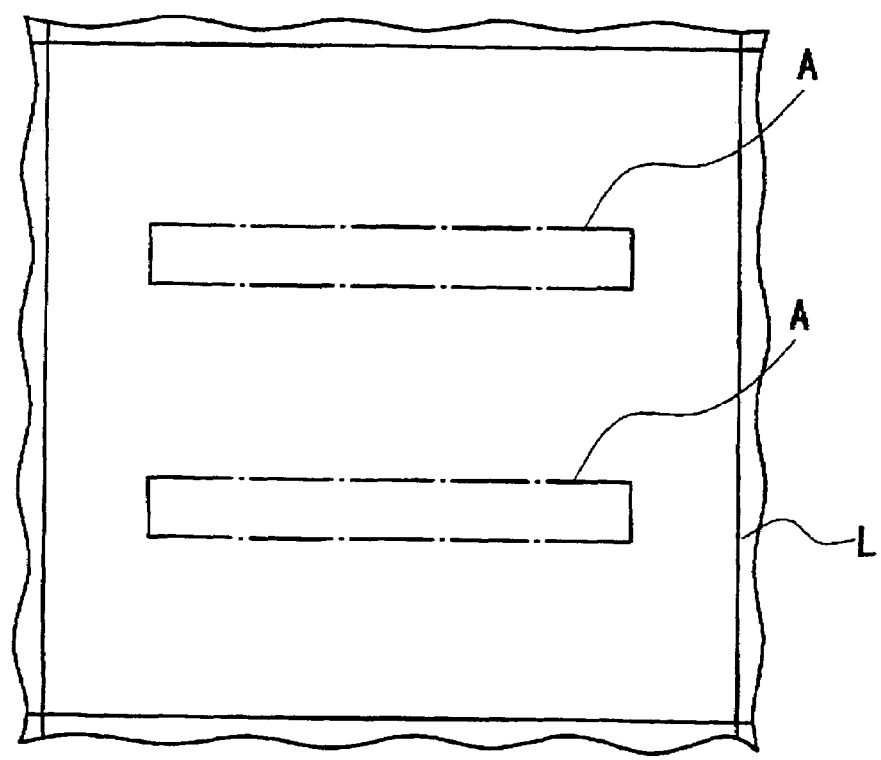
FIG. 30 is an explanatory view showing a position of an electrode region to be inspected in an integrated circuit formed on the wafer for a test illustrated in FIG. 29.
Figure 31:
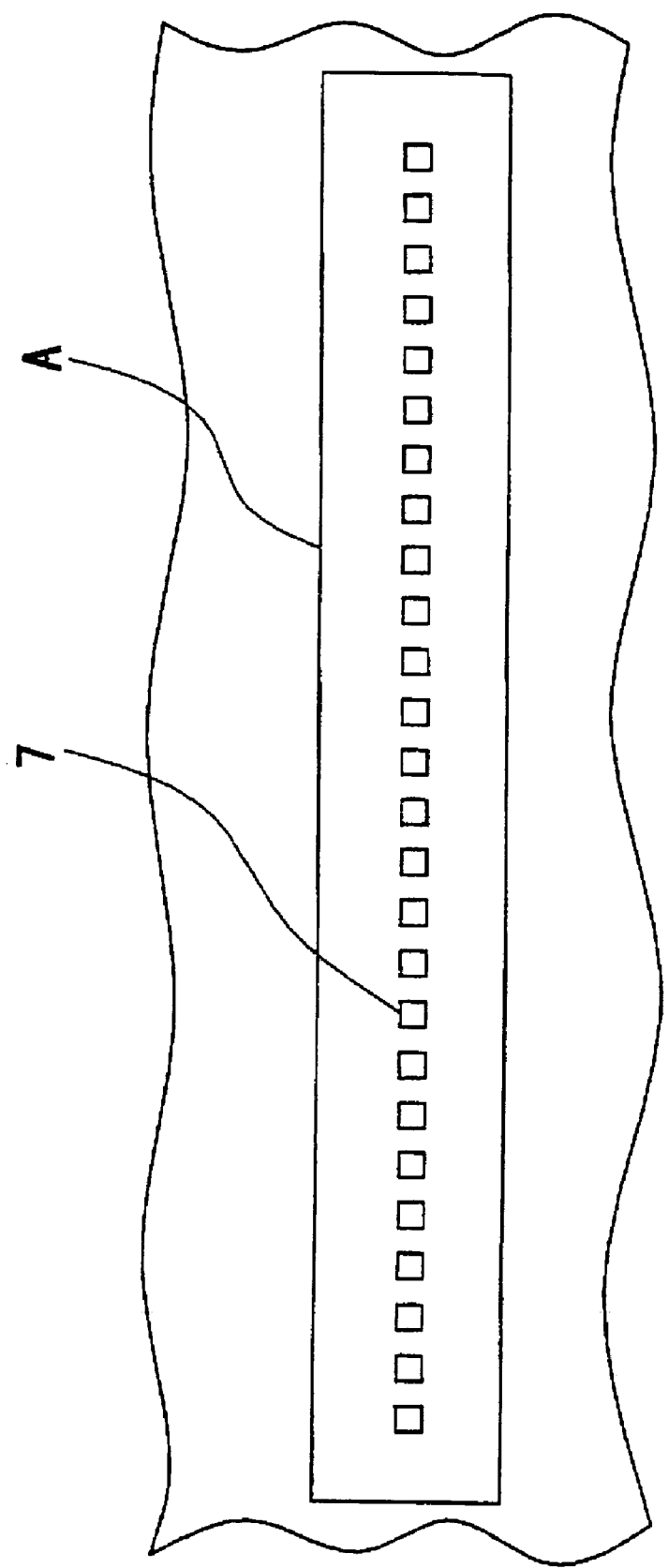
FIG. 31 is an explanatory view showing an arrangement pattern of an electrode to be inspected in an integrated circuit formed on the wafer for a test illustrated in FIG. 30.

Each of the integrated circuits L formed on the wafer 6 has an electrode region A to be inspected on a center thereof in two lines at an interval of 2500 μm as shown in FIG. 30. Furthermore, the electrode region A to be inspected is provided with 26 rectangular electrodes 7 to be inspected having a dimension in a longitudinal direction (a vertical direction in FIG. 31) of 90 μm and a dimension in a transverse direction (a lateral direction in FIG. 31) of 90 μm in a line in the transverse direction at a pitch of 120 μm as shown in FIG. 31.

The total number of the electrodes 7 to be inspected in the whole wafer 6 is 26116 and all of the electrodes 7 to be inspected are electrically insulated from each other. The wafer 6 will be hereinafter referred to as "a wafer W1 for a test".

Moreover, 483 integrated circuits L having the same structure as the structure of the wafer W1 for a test were formed on the wafer 6 except that every two electrodes 7 to be inspected from an outermost one of the 26 electrodes to be inspected in the integrated circuit L were electrically connected to each other in place of the mutually electrical insulation of all of the electrodes 7 to be inspected.

The wafer will be hereafter referred to as "a wafer W2 for a test".

Example 1

Figure 14:
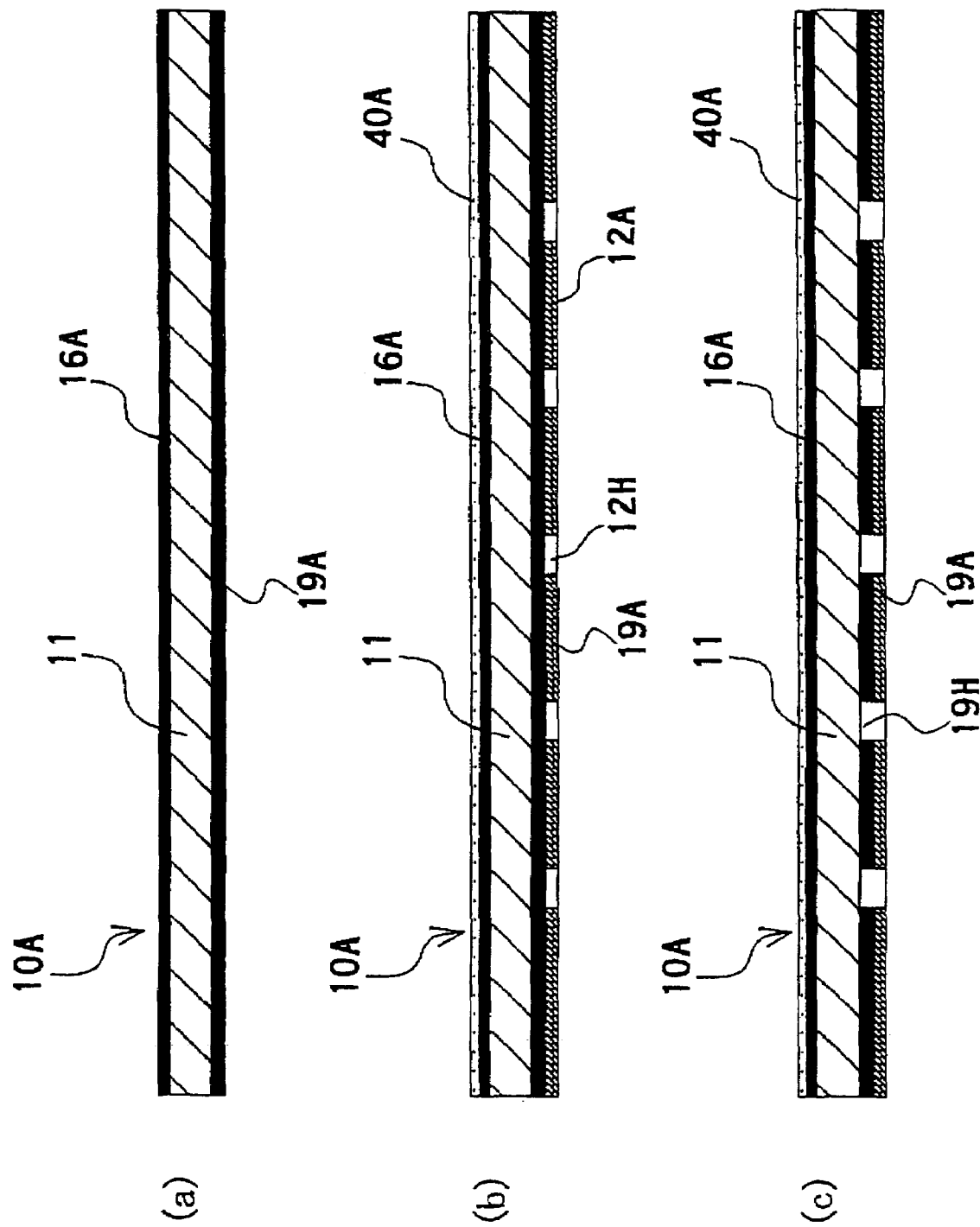
FIG. 14 is an explanatory sectional view showing the structure of a laminate material for manufacturing the sheet-like probe according to the present invention.

There was prepared a laminated polyimide sheet in which a metal layer formed of copper having a diameter of 20 cm and a thickness of 4 μm is laminated on both sides of a polyimide sheet having a diameter of 20 cm and a thickness of 25 μm (which will be hereinafter referred to as "a laminate material 10A" (see FIG. 14(*a*)).

The laminate material 10A has a first back side metal layer 19A formed of copper having a thickness of 4 μm on one of surfaces of an insulating sheet 11 formed by a polyimide sheet having a thickness of 25 μm and has a surface side metal layer 16A formed of copper having a thickness of 4 μm on the other surface.

For the laminate material 10A, a protective film 40A was formed over a whole surface of the surface side metal layer 16A through a protective seal formed of polyethylene terephthalate having a thickness of 25 μm. Furthermore, a resist film 12A provided with 26116 circular pattern holes 12H having a diameter of 55 μm was formed on a whole back face of the first back side metal layer 19A in accordance with a pattern corresponding to a pattern of an electrode 7 to be inspected which is formed in the wafer W1 for a test (see FIG. 14(*b*)).

In the formation of the resist film 12A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Subsequently, the first back side metal layer 19A was subjected to an etching treatment at 50° C. for 30 seconds by using an iron(III) chloride type etchant, thereby forming 26116 pattern holes 19H communicating with the pattern holes 12H of the resist film 12A (see FIG. 14(*c*)).

Figure 15:
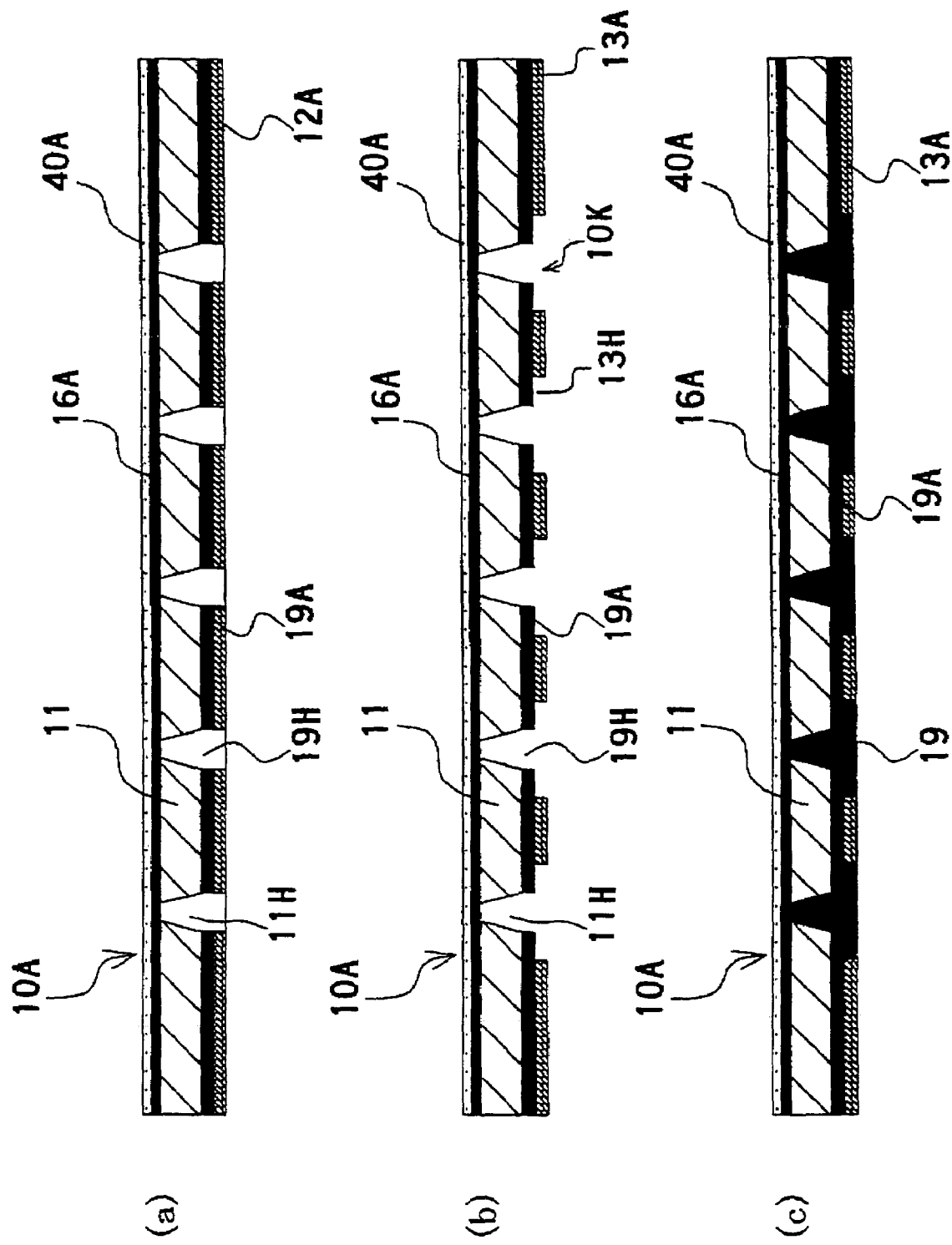
FIG. 15 is an explanatory sectional view showing the structure of the laminate material for manufacturing the sheet-like probe according to the present invention.

Then, the insulating sheet 11 was subjected to the etching treatment at 80° C. for 10 minutes by using an amine type polyimide etchant ("TPE-3000" prepared by TORAY ENGINEERING CO., LTD.), thereby forming, on the insulating sheet 11, 26116 through holes 11H communicating with the pattern holes 19H of the first back side metal layer 19A respectively (see FIG. 15(*a*)).

Each of the through holes 11H took a tapered shape having a diameter which is gradually reduced from the back face of the insulating sheet 11 toward the surface thereof, and had an opening diameter on the back side of 55 μm and an opening diameter on the surface side of 20 μm (an average value).

Subsequently, the laminate material 10A was immersed in a sodium hydroxide solution at 45° C. for 2 minutes, thereby removing the resist film 12A from the laminate material 10A. For the laminate material 10A, then, a resist film 13A was formed in order to cover a whole surface of the first back side metal layer 19A by a dry film resist (prepared by HITACHI CHEMICAL CO., LTD.; PHOTEK RY-3210) having a thickness of 10 μm. Furthermore, 26116 rectangular pattern holes 13H having a lateral width of 60 μm and a longitudinal width of 200 μm which communicate with the through holes 11H of the insulating sheet 11 were formed on the resist film 13A (see FIG. 15(*b*)).

In the formation of the resist film 13A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Thus, the back face of the insulating sheet 11 was provided with 26116 concave portions 10K for forming a surface electrode portion with which the through holes 11H of the insulating sheet 11, the pattern holes 19H of the first back side metal layer 19A and the pattern holes 13H of the resist film 13A communicate, respectively.

Subsequently, the laminate material 10A was immersed in a plating bath containing nickel sulfamate, and was subjected to an electrolytic plating treatment by using the surface side metal layer 16A as an electrode, thereby filling a metal in each of the concave portions 10K for forming a surface electrode portion. Consequently, there were formed a surface electrode portion 16 and holding portions 19 coupled to each other through the first back side metal layer 19A (see FIG. 15(*c*)).

Figure 16:
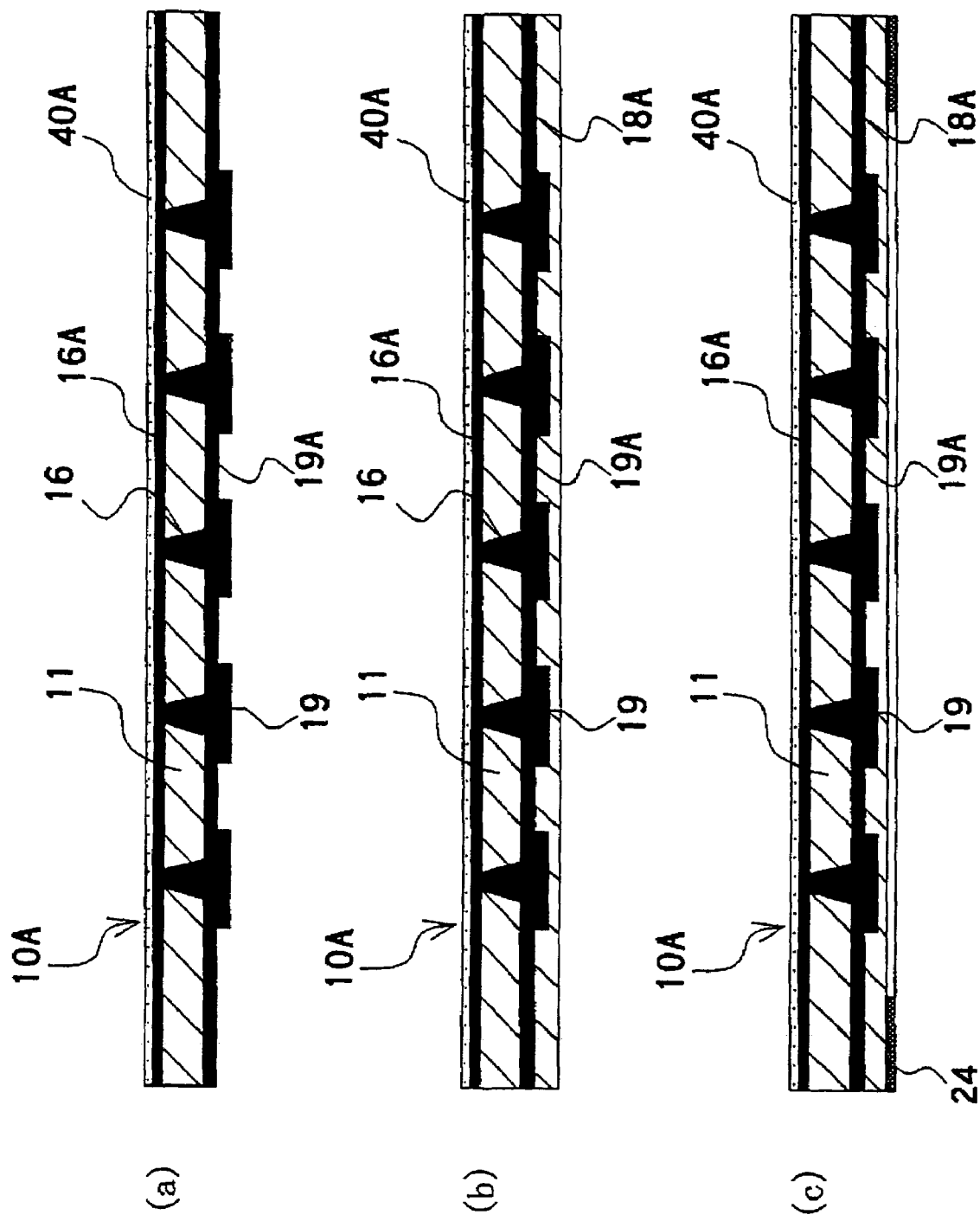
FIG. 16 is an explanatory sectional view showing the structure of the laminate material for manufacturing the sheet-like probe according to the present invention.

Then, the laminate material 10A provided with the surface electrode portion 16 was immersed in the sodium hydroxide solution at 45° C. for 2 minutes, thereby removing the resist film 12A from the laminate material 10A (see FIG. 16(*a*)).

Thereafter, a liquid polyimide layer having a thickness of 12 μm was formed on a surface of the first back side metal layer 19A in the laminate material 10A (see FIG. 16(*b*)).

Subsequently, there was prepared a support material 24 in which the 966 through holes having a dimension of 3600 μm in a transverse direction by 1000 μm in a longitudinal direction were formed by punching processing at the positions corresponding to each of the region A to be inspected of the integrated circuits L on the wafer W1 for a test for a mesh made of a polyacrylate fiber with a diameter of 24 cm ("V Screen" prepared by NBC Inc., product number: V380, thickness: 43 μm, wire diameter: 23 μm, number of meshes: 150/cm, numerical aperture: 43%) and in which a protective tape made of polyethylene terephthalate having an inside diameter of 20.4 cm and an outside diameter of 24 cm is formed on the both sides in the peripheral edge portion of the support material 24.

The support material 24 in which the through holes were formed was then aligned and overlaid on a surface of the liquid polyimide layer 18A in the laminate material 10A in such a manner that the holding portions 19 formed in the laminate material 10A were disposed in the through holes of the support material 24 (see FIG. 16(c)).

Subsequently, the liquid polyimide was coated on the surface of the support material, thereby forming a liquid polyimide layer 18A with a thickness of 50 μm (see FIG. 17(a)).

Subsequently, a polyimide film having a thickness of 12.5 μm and provided with a metal foil layer made of copper having a thickness of 4 μm on one face was laminated on a surface of the liquid polyimide layer 18A in the laminate material 10A, in such a manner that the metal foil layer side face thereof comes into contact with the liquid polyimide layer 18A in the laminate material 10A. The polyimide film is then pressurized and heated to be cured to form the insulating layer 18B, and the polyimide film is removed by an etching, thereby fabricating the laminate material 10B as shown in FIG. 17(b).

In the laminate material 10B, the insulating layer 18B formed of a polyimide sheet having a thickness of 48 μm is laminated on one of the surfaces of the laminate material 10A provided with the surface electrode portion 16 and the second back side metal layer 17A made of copper having a thickness of 4 μm is formed on the surface of the insulating layer 18B (see FIG. 17(b)).

For the laminate material 10B, subsequently, a resist film 28A provided with 26116 circular pattern holes 28H having a diameter of 60 μm was formed on a whole surface of the second back side metal layer 17A in accordance with a pattern corresponding to a pattern of the electrode to be inspected which is formed in the wafer W1 for a test by using a dry film resist with a thickness of 25 μm (see FIG. 17(c)).

In the formation of the resist film 28A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Subsequently, the second back side metal layer 17A was subjected to an etching treatment at 50° C. for 30 seconds by using an iron(III) chloride type etchant, thereby forming, on the second back side metal layer 17A, 26116 pattern holes 17H communicating with the pattern holes 28H of the resist film 28A respectively (see FIG. 18(a)).

Then, the insulating layer 18B was subjected to the etching treatment at 80° C. for 15 minutes by using an amine type polyimide etchant ("TPE-3000" prepared by TORAY ENGINEERING CO., LTD.), thereby forming, on the insulating layer 18B, 26116 through holes 18H communicating with the pattern holes 17H of the second back side metal layer 17A respectively (see FIG. 18(b)).

Each of the through holes 18H took a tapered shape having a diameter which is gradually reduced toward the surface of the insulating layer 18B and had a bottom face from which the back electrode portion 17 is exposed, and had an opening diameter on the back side of 80 μm and an opening diameter on the surface side of 25 μm.

Subsequently, the laminate material 10B provided with the through holes 18H was immersed in a sodium hydroxide solution at 45° C. for 2 minutes, thereby removing the resist film 28A from the laminate material 10B. For the laminate material 10B, then, a resist film 29A was formed in order to cover a whole surface of the second back side metal layer 17A by a dry film resist having a thickness of 25 μm. Furthermore, 26116 rectangular pattern holes 29H having a dimension of 200 μm×80 μm which communicate with the through holes 18H of the insulating layer 18B were formed on the resist film 29A (see FIG. 18(c)).

In the formation of the resist film 29A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Thus, the back face of the laminate material 10B was provided with 26116 concave portions 18K for forming a short circuit portion with which the through hole 18H of the insulating layer 18B, the pattern holes 17H of the second back side metal layer 17A and the pattern holes 29H of the resist film 29A communicate, respectively.

Subsequently, the laminate material 10B was immersed in a plating bath containing nickel sulfamate, and was subjected to an electrolytic plating treatment by using the surface side metal layer 16A as an electrode, thereby filling a metal in each of the concave portions 18K for forming a short circuit portion. Consequently, there were formed the back electrode portions 17 coupled to the surface electrode portion 16 and coupled to each other through the short-circuit portion 18 and the second back side metal layer 17A (see FIG. 19(a)).

Subsequently, the laminate material 10C was immersed in a sodium hydroxide solution at 45° C. for 2 minutes, thereby removing the resist film 29A from the laminate material 10A (see FIG. 19(b)).

Then, the laminate material 10C provided with a resist film 29B was formed by a dry film resist having a thickness of 25 μm through patterning in order to cover the back electrode portion 17 in the second back side metal layer 17A (see FIG. 19(c)).

In the formation of the resist film 29B, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Then, the protective film 40A was removed from the laminate material 10C. Thereafter, the surface side metal layer 16A and the second back side metal layer 17A were subjected to the etching treatment at 50° C. for 30 seconds by using an ammonium type etchant, thereby removing the whole surface side metal layer 16A and a part of the second back side metal layer 17A (see FIG. 20(a)).

Subsequently, after removing the resist film 29B, a resist film 29C was formed on the whole surface of the insulating layer 18B and the back electrode portion 17 in the laminate material 10C by a dry film resist having a thickness of 25 μm, and a protective film 40B was laminated over the whole surface of the resist film 29C (see FIG. 20(b)).

Thereafter, the laminate material 10B was subjected to the etching treatment at 80° C. for 10 minutes by using an amine type polyimide etchant ("TPE-3000" prepared by TORAY ENGINEERING CO., LTD.), thereby removing the insulating sheet 11 (see FIG. 20(c)).

Subsequently, a patterned resist film 14A was formed by a dry film resist having a thickness of 25 μm in order to cover the surface electrode portion 16 and a portion of the first back side metal layer 19A which is to be the holding portion 19 (see FIG. 21(a)).

In the formation of the resist film 14A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Thereafter, the first back side metal layer 19A was subjected to the etching treatment at 50° C. for 30 seconds by using an iron(III) chloride type etchant, thereby forming the circular plate ring-shaped holding portion 19 extended radially outward along the surface of the insulating layer 18B continuously from a peripheral surface of a base end portion of the surface electrode portion 16. Thus, an electrode structure 15 was formed.

Subsequently, after removing the protective film 40B, the resist film 14A was removed from the surface electrode portion 16 and the holding portion 19 by an immersion in a sodium hydroxide solution at 45° C. for 2 minutes. The resist film 29C was then removed from the surface of the insulating layer 18B and the back electrode portion 17 (see FIG. 21(b)).

Then, patterned resist films 14B and 17E were formed on the both faces of the laminate material 10C by a dry film resist having a thickness of 25 μm in order to cover a portion to be a contact film 9 (FIG. 21(c)).

Each of the resist films 14B and 17E has a dimension of 4600 μm in a transverse direction by 2000 μm in a longitudinal direction.

In this state, the etching treatment was carried out at 80° C. for 10 minutes by using an amine type polyimide etchant ("TPE-3000" prepared by TORAY ENGINEERING CO., LTD.), thereby obtaining a laminate material 10C comprising the contact film 9 having the electrode structure 15 formed in each of the through holes of the support material 24 (see FIG. 22(a)).

Next, the resist films 14B and 17E were removed from both sides of the contact film 9 by an immersion in the sodium hydroxide solution at 45° C. for 2 minutes (see FIG. 22(b)).

Then, the protective tape was removed from a peripheral edge portion of the support material 24, and the laminate material 10B was aligned and disposed on a support member 2 having an outside diameter of 22 cm, an inside diameter of 20.5 cm and a thickness of 2 mm and formed of silicon nitride in such a manner that the peripheral edge portion of the support material comes in contact with the laminate material 10B. Thereafter, while extending the support material in a peripheral direction, an adhesive layer was formed by dropping a cyanoacrylate type adhesive (product name: Aron Alpha, product number: #200, manufactured by Toagosei Co., Ltd.) on the surface of the support member 2 from the above of the support material formed of a perforated film. Subsequently, the adhesive layer was hardened by being held at 25° C. for 30 minutes, thereby manufacturing the sheet-like probe 10 according to the present invention.

In the foregoing, H-K350 manufactured by HITACHI CHEMICAL CO., LTD. was used for the dry film resist.

The sheet-like probe 10 thus obtained has 966 contact films 9 having a dimension of 4600 μm in a transverse direction by 2000 μm in a longitudinal direction. Furthermore, the insulating layer 18B in the contact film 9 has a thickness d of 48 μm. In addition, the surface electrode portion 16 of the electrode structure 15 takes a shape of a truncated cone, a base end thereof has a radius R1 of 55 μm, a tip thereof has a radius R2 of 20 μm and a projection height h is 25 μm. Moreover, the short circuit portion 18 takes a shape of a truncated cone, one of ends on a surface side thereof has a radius R3 of 25 μm, the other end on a back side thereof has a radius R4 of 80 μm. Furthermore, the back electrode portion 17 takes a shape of a rectangular plate and has a lateral width (radius R5) of 80 μm, a longitudinal width of 200 μm and a thickness d2 of 14 μm. In addition, the holding portion 19 takes a rectangular shape and has a lateral width (R6) of 60 μm, a longitudinal length of 200 μm and a thickness d1 of 14 μm.

Thus, four sheet-like probes in total were manufactured.

These sheet-like probes are set to be "a sheet-like probe M1" to "a sheet-like probe M4".

Example 2

From the Example 1, the support material 24 was changed to one in which the 966 through holes having a dimension of 3600 μm in a transverse direction by 1000 μm in a longitudinal direction were formed by the punching processing at the positions corresponding to each of the region A to be inspected of the integrated circuits L on the wafer W1 for a test for a mesh made of a polyacrylate fiber with a diameter of 24 cm and a thickness of 53 μm ("V Screen" prepared by NBC Inc., product number: V300, thickness: 53 μm, wire diameter: 30 μm, number of meshes: 118/cm, numerical aperture: 42%). Thus, four sheet-like probes in total were manufactured similarly to the Example 1 except for a thickness of the liquid polyimide layer that was changed to 60 μm.

The sheet-like probe 10 thus obtained has 966 contact films 9 having a dimension of 4600 μm in a transverse direction by 2000 μm in a longitudinal direction. Furthermore, the insulating layer 18B in the contact film 9 has a thickness d of 58 μm. In addition, the surface electrode portion 16 of the electrode structure 15 takes a shape of a truncated cone, a base end thereof has a radius R1 of 55 μm, a tip thereof has a radius R2 of 20 μm and a projection height h is 25 μm. Moreover, the short circuit portion 18 takes a shape of a truncated cone, one of ends on a surface side thereof has a radius R3 of 12 μm, the other end on a back side thereof has a radius R4 of 80 μm. Furthermore, the back electrode portion 17 takes a shape of a rectangular plate and has a lateral width (radius R5) of 80 μm, a longitudinal width of 200 μm and a thickness d2 of 14 μm. In addition, the holding portion 19 takes a rectangular shape and has a lateral width (R6) of 60 μm, a longitudinal length of 200 μm and a thickness d1 of 14 μm.

These sheet-like probes are set to be "a sheet-like probe N1" to "a sheet-like probe N4".

Comparative Example 1

Figure 41:
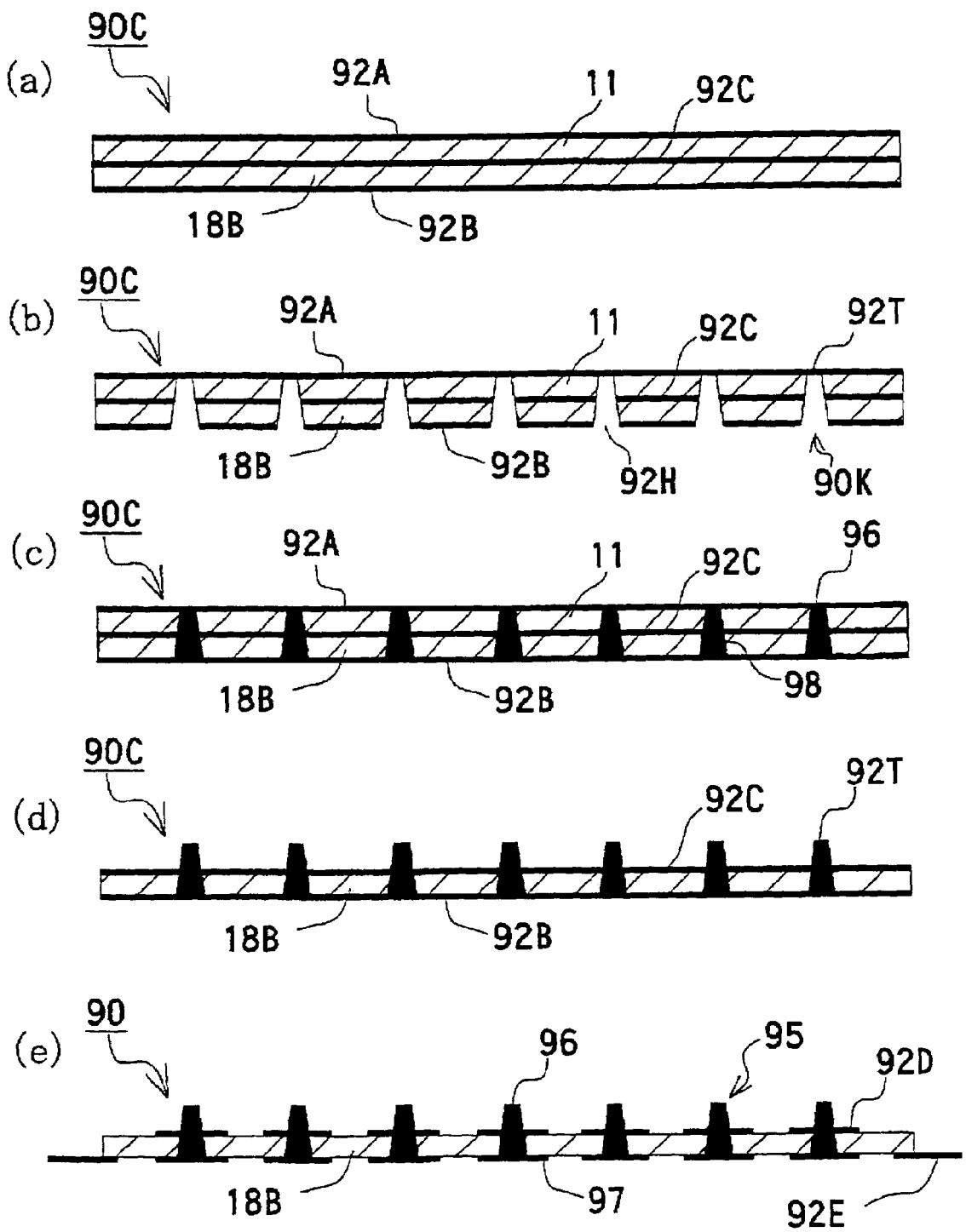
FIG. 41 is a schematic sectional view showing a method of bonding a ring-shaped support plate to the conventional sheet-like probe.

There was prepared a laminate material 90C having a surface side metal layer 92A, a second back side metal layer 92B, a first back side metal layer 92C and formed of an insulating sheet 11 and an insulating layer 18B as shown in FIG. 41(a).

The laminate material 90C is configured by the surface side metal layer 92A formed of copper having a thickness of 4 μm, the insulating sheet 18B formed of polyimide having a thickness of 12.5 μm, the first back side metal layer 92C formed of copper having a thickness of 4 μm, the insulating layer 91B formed of polyimide having a thickness of 37.5 μm, and the second back side metal layer 92B formed of a 42-alloy having a thickness of 10 μm.

For the laminate material 90C, in accordance with the method described in Japanese Laid-Open Patent Publication No. 2004-172589, a pattern hole having a diameter of 90 μm was formed on the second back side metal layer 92B, and a through hole linked sequentially to the insulating layer 18B, the first back side metal layer 92C, and the insulating sheet 11 was formed, and the surface side metal layer 92A was exposed from a bottom face of the through hole. Consequently, a concave portion 90K for forming an electrode structure in which a short circuit portion and a surface electrode portion are collectively formed was fabricated (see FIG. 41(b)).

Subsequently, the laminate material 90C was immersed in a plating bath containing nickel sulfamate, and was subjected to an electrolytic plating treatment by using the surface side metal layer 92A as an electrode, thereby filling a metal in each of the concave portions 90K for forming a short circuit portion (see FIG. 41(c)).

Next, the insulating sheet 11 was removed by etching (see FIG. 41(d)).

Then, the first back side metal layer was subjected to the etching to form a holding portion, and the second back side metal layer was subjected to the etching to remove a part thereof, thereby forming a back electrode portion and a support portion 92E, and the insulating layer 18B was subjected to the etching to divide the insulating layer into each contact film (see FIG. 41(e)).

Thereafter, an adhesive layer was formed by dropping a cyanoacrylate type adhesive (product name: Aron Alpha, product number: #200, manufactured by Toagosei Co., Ltd.) on the surface of a support member 2 formed of ring-shaped silicon nitride having an outside diameter of 22 cm, an inside diameter of 20.5 cm and a thickness of 2 mm. A laminate material in which the contact film was formed was then laminated on the support member 2. Subsequently, the adhesive layer was hardened by being held at 25° C. for 30 minutes, thereby manufacturing a sheet-like probe.

In a sheet-like probe thus obtained, the insulating layer has a thickness d of 37.5 μm, the surface electrode portion of the electrode structure takes a shape of a truncated cone, a base end thereof has a radius of 37 μm, a tip thereof has a radius of 13 μm (average value) and a projection height is 12.5 μm, the holding portion has a lateral width of 60 μm, a longitudinal width of 200 μm and a thickness of 4 μm, the short circuit portion takes a shape of a truncated cone, one of ends on a surface side thereof has a radius of 37 μm, and the other end on a back side thereof has a radius of 90 μm, the back electrode portion takes a shape of a rectangular plate and has a lateral width of 90 μm, a longitudinal width of 200 μm and a thickness of 20 μm.

Thus, four sheet-like probes in total were manufactured. These sheet-like probes are set to be "a sheet-like probe O1" to "a sheet-like probe O4".

Comparative Example 2

In the Comparative Example 2, the laminate material 90C was changed to the surface side metal layer 92A formed of copper having a thickness of 4 μm, the insulating sheet 11 formed of polyimide having a thickness of 17.5 μm, the first back side metal layer 92C formed of copper having a thickness of 4 μm, the insulating film 18B formed of polyimide having a thickness of 48 μm, and the second back side metal layer 92 formed of a 42-alloy having a thickness of 10 μm from the Comparative Example 1.

Similarly to the Comparative Example 1, a concave portion 90K for forming an electrode structure was fabricated, and the laminate material 90C was immersed in a plating bath containing nickel sulfamate, and was subjected to an electrolytic plating treatment by using the surface side metal layer 92A as an electrode, in order to try to fill a metal in each of the concave portions 90K for forming a short circuit portion.

However, a metal was hardly filled in each of the concave portions 90K for forming a short circuit portion.

In addition, the concave portions 90K for forming a short circuit portion of the laminate material 90C were observed. As a result, the surface side metal layer 92A was hardly exposed at the bottom of the concave portions 90K for forming a short circuit portion.

<Fabrication of Anisotropically Conductive Connector>
(1) Preparation of Magnetic Core Particle By using a nickel particle ("FC1000" manufactured by Westaim Co., Ltd.) put on the market, a magnetic core particle was prepared in the following manner.

By an air classifier "TURBO-CLASSIFIER TC-15N" manufactured by NISSHIN ENGINEERING CO., LTD., 2 kg of nickel particles were subjected to a classifying treatment at a specific gravity of 8.9, a gas quantity of 2.5 m$^3$/min, a rotor speed of 2250 rpm, a classifying point of 15 μm, and a nickel particle feeding speed of 60 g/min, and 0.8 kg of nickel particles having a particle diameter of 15 μm or less were collected. Furthermore, 0.8 kg of nickel particles were subjected to the classifying treatment at a specific gravity of 8.9, a gas quantity of 2.5 m$^3$/min, a rotor speed of 2930 rpm, a classifying point of 10 μm, and a nickel particle feeding speed of 30 g/min so that 0.5 kg of nickel particles were collected.

The nickel particle thus obtained had a number-average particle diameter of 7.4 μm, a coefficient of variance of the particle diameter of 27%, a BET specific surface area of 0.46×10$^3$ m$^2$/kg and a saturation magnetization of 0.6 Wb/m$^2$.

The nickel particle is set to be a magnetic core particle Q.

(2) Preparation of Conductive Particle 100 g of magnetic core particles Q were put in a treating bath of a powder plating device, and furthermore, 2L of a 0.32N hydrochloric acid solution was added thereto and they were stirred so that a slurry containing the magnetic core particle Q was obtained. The slurry was stirred at an ordinary temperature for 30 minutes to carry out an acid treatment for the magnetic core particle Q, and was then put stationarily for one minute to precipitate the magnetic core particle Q, thereby removing a supernatant solution.

Subsequently, 2L of pure water was added to the magnetic core particle Q subjected to the acid treatment and they were stirred for two minutes at an ordinary temperature and were then put stationarily for one minute to precipitate the magnetic core particle Q, thereby removing a supernatant solution. This operation was further repeated twice and a treatment for washing the magnetic core particle Q was carried out.

Thereafter, 2L of a gold plating solution having a content of gold of 20 g/L was added to the magnetic core particle Q subjected to the acid treatment and the washing treatment, and a temperature in the treating bath was raised to 90° C. and they were stirred so that a slurry was prepared. In this state, gold substitution plating was carried out over the magnetic core particle Q while the slurry was stirred. Subsequently, the slurry was left and cooled, and at the same time, was put stationarily to precipitate the particle, thereby removing a supernatant solution. Thus, a conductive particle P was prepared.

2L of pure water was added to the conductive particle thus obtained and they were stirred for two minutes at an ordinary temperature and were then put stationarily for one minute to precipitate the conductive particle, thereby removing a supernatant solution. This operation was further repeated twice and 2L of pure water heated to 90° C. was then added, and they were stirred. A slurry thus obtained was filtrated through a filter paper, thereby recovering the conductive particle. Thereafter, the conductive particle was subjected to a drying treatment by a drier set to 90° C.

The conductive particle thus obtained had a number-average particle diameter of 7.3 μm, a BET specific surface area of $0.38 \times 10^3$ m²/kg, and a value of (mass of gold forming a covered layer)/(a mass of a magnetic core particle [A]) of 0.3.

The conductive particle is set to be "a conductive particle (a)".

(3) Fabrication of Frame Plate

Figure 32:
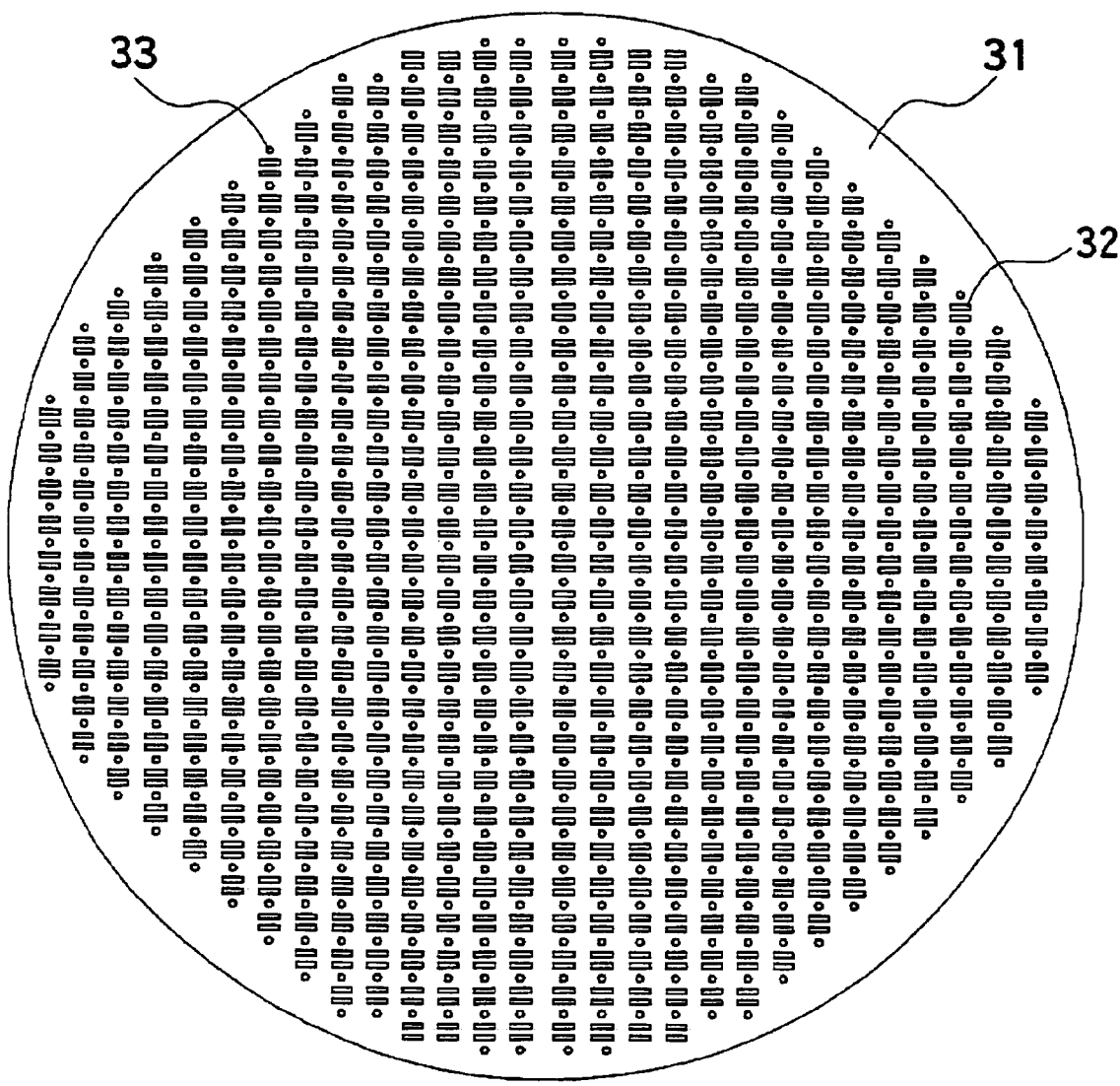
FIG. 32 is a plan view showing a frame plate in the anisotropically conductive connector fabricated in the example.
Figure 33:
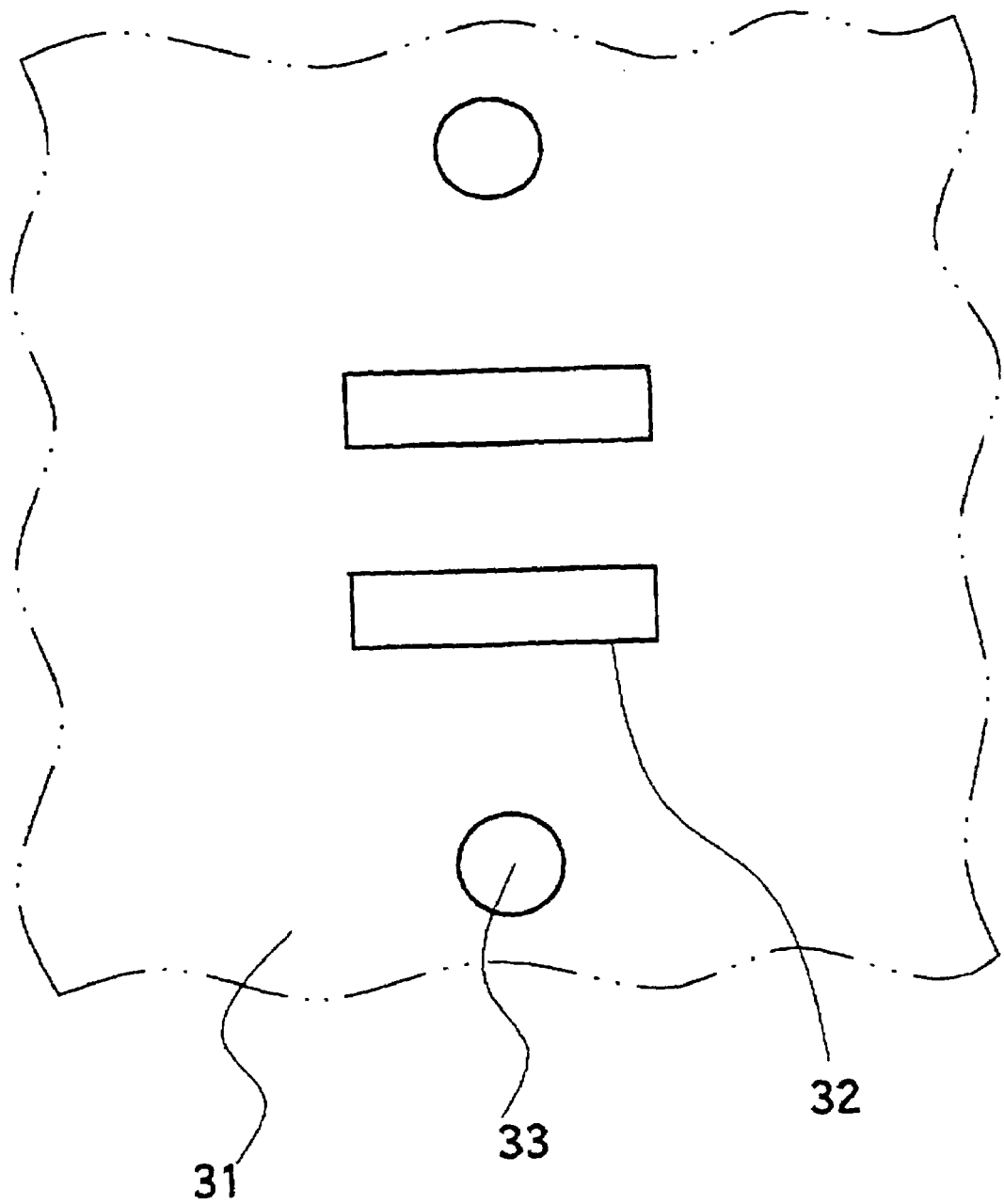
FIG. 33 is an explanatory view showing an enlarged part of the frame plate illustrated in FIG. 32.
Figure 34:
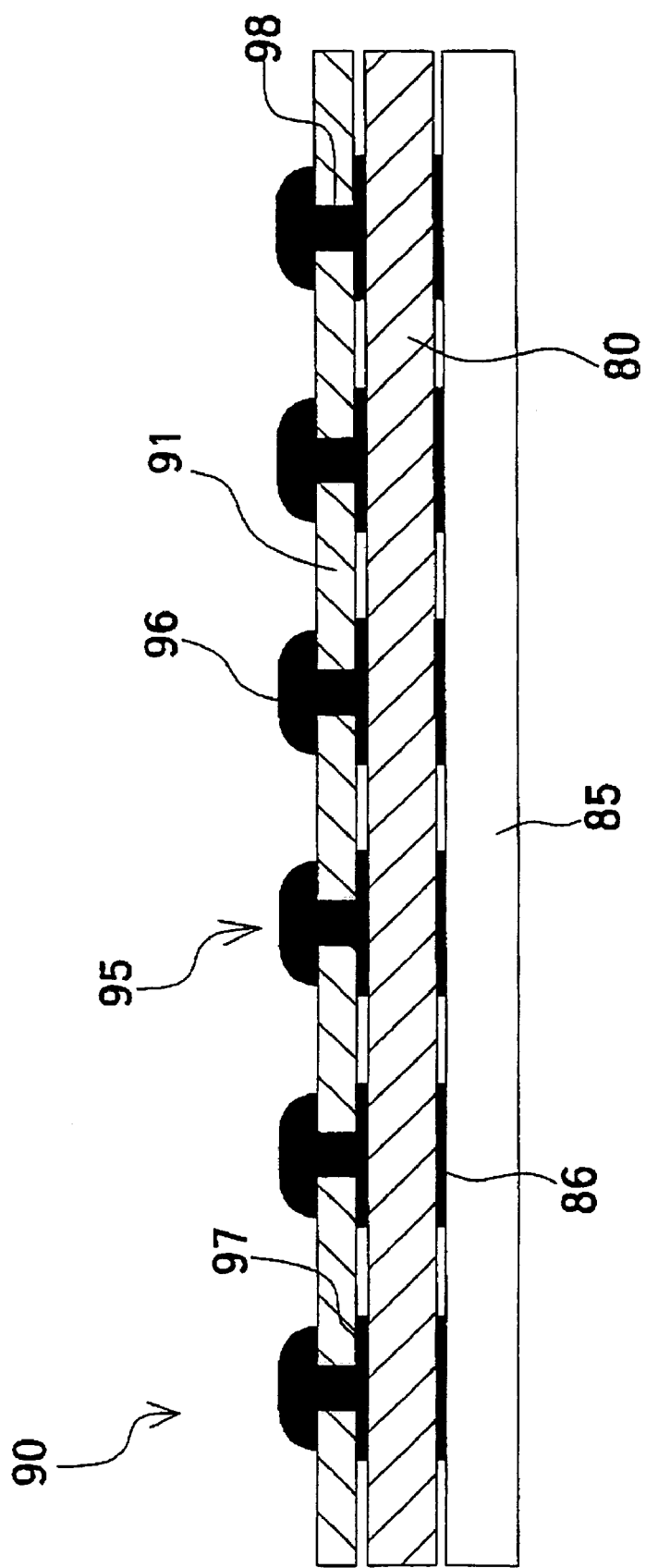
FIG. 34 is an explanatory sectional view showing a structure according to an example of a conventional probe card.
Figure 35:
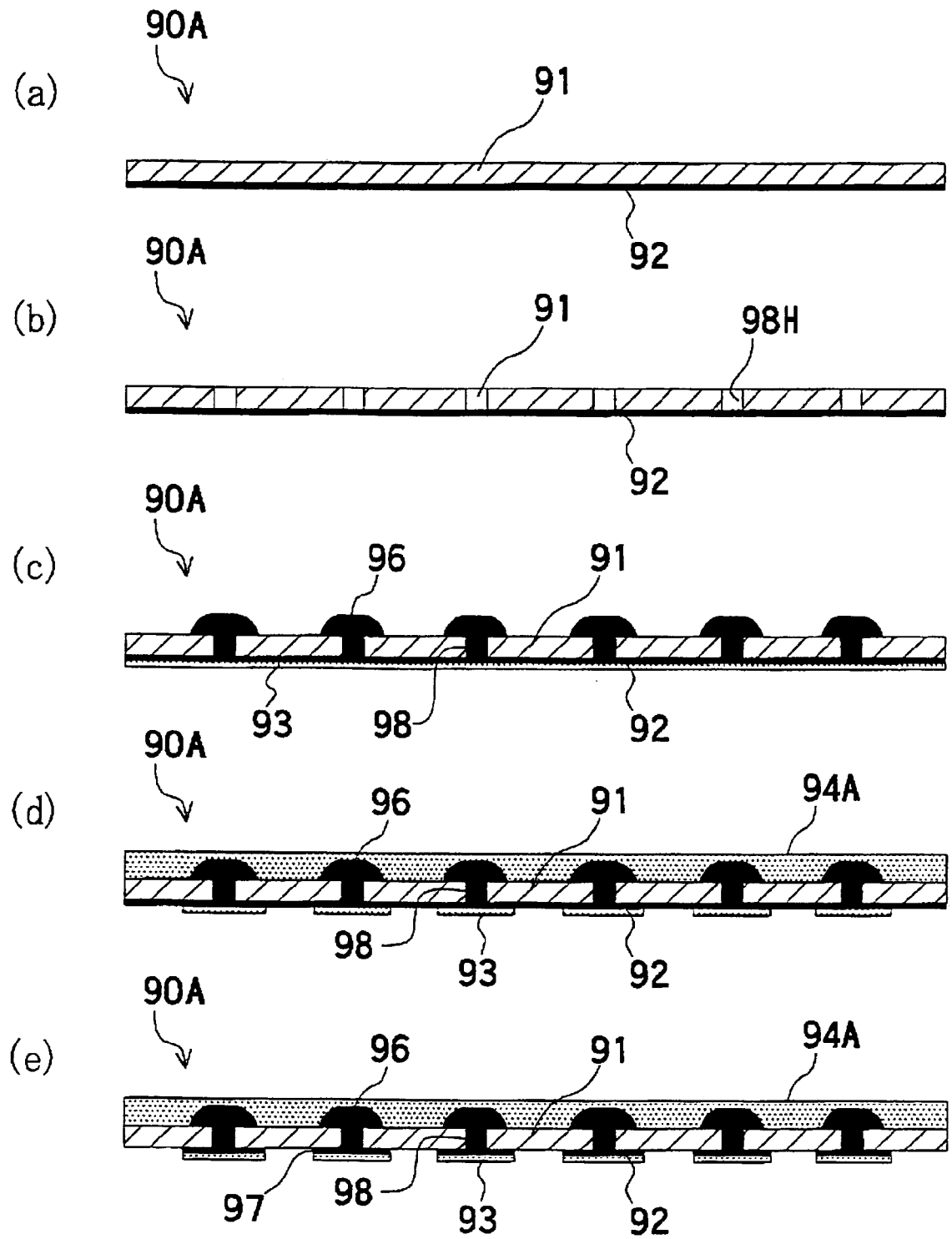
FIG. 35 is an explanatory sectional view showing an example of the manufacture of the conventional sheet-like probe.
Figure 36:
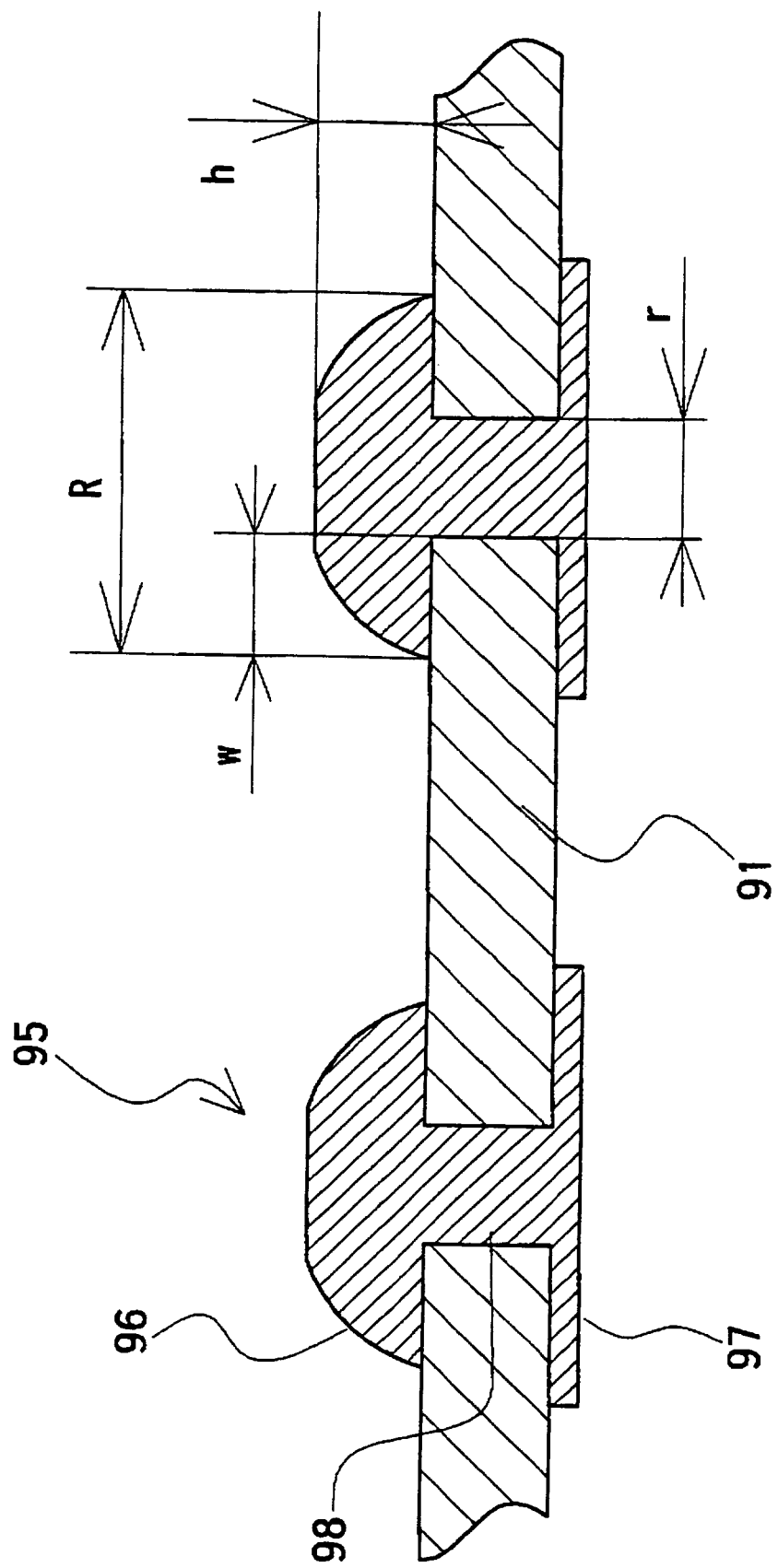
FIG. 36 is an explanatory sectional view showing an enlarged sheet-like probe in the probe card illustrated in FIG. 35.
Figure 37:
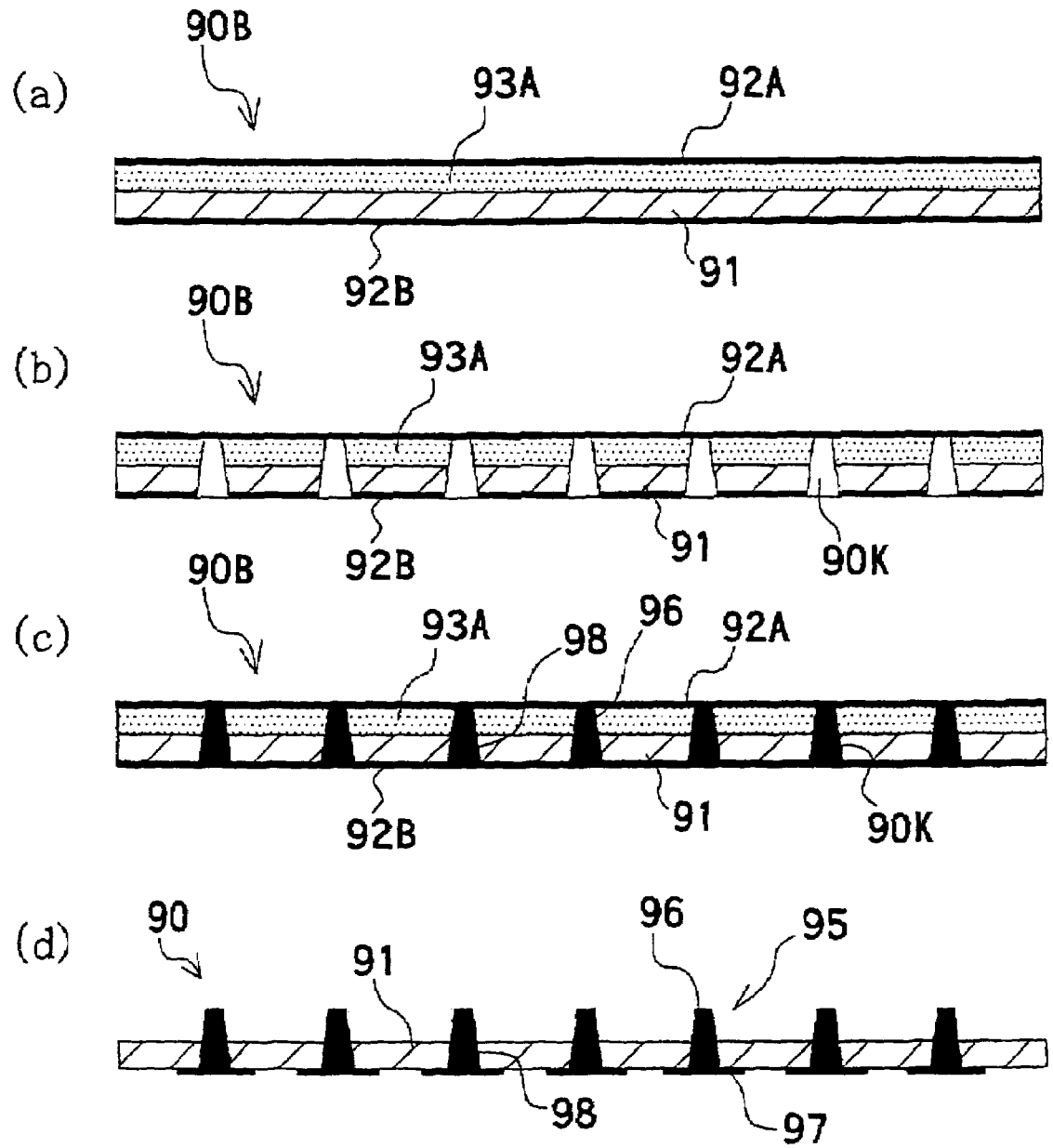
FIG. 37 is an explanatory sectional view showing another example of the manufacture of the conventional sheet-like probe.
Figure 38:
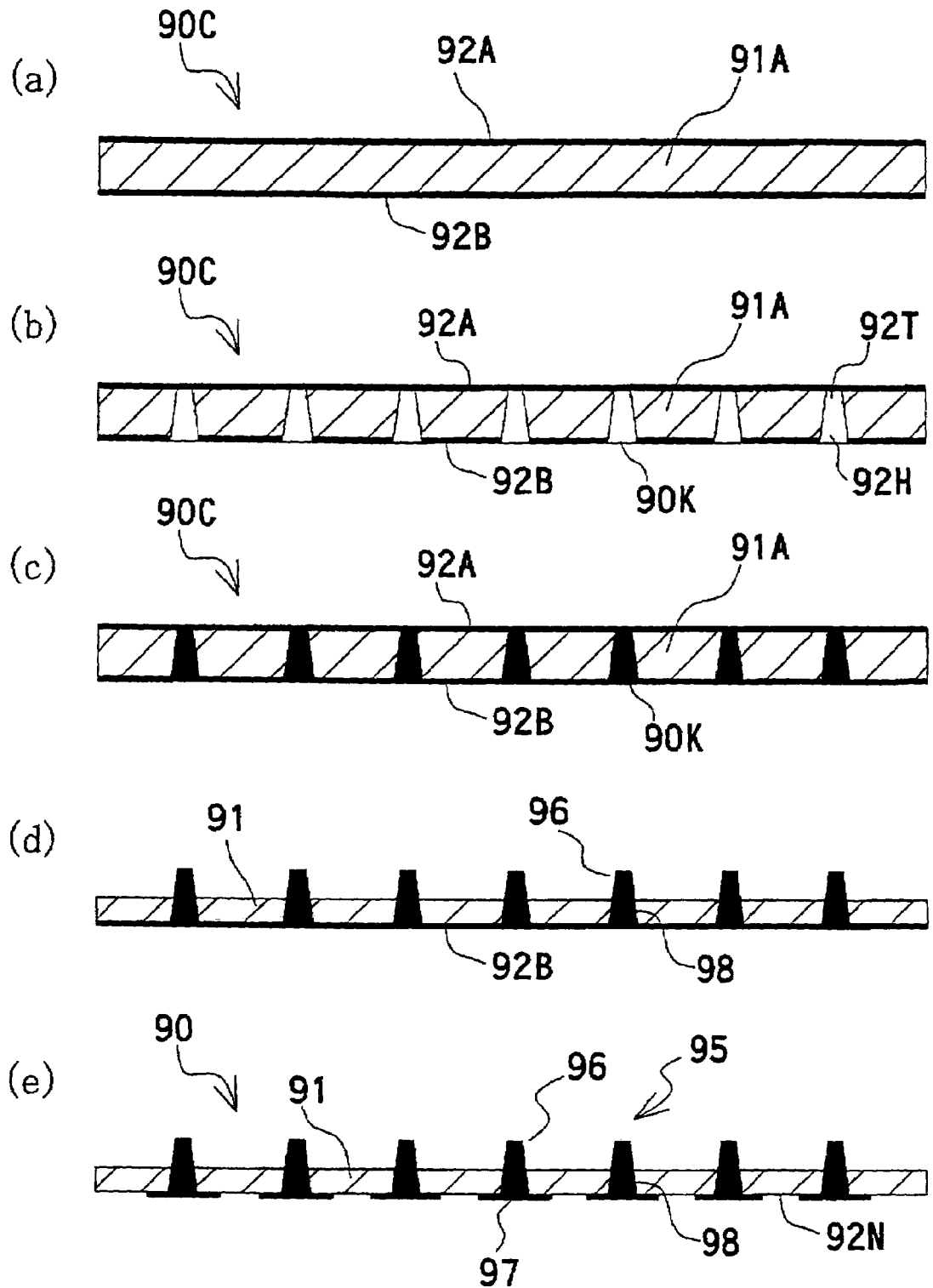
FIG. 38 is an explanatory sectional view showing a further example of the manufacture of the conventional sheet-like probe.
Figure 39:
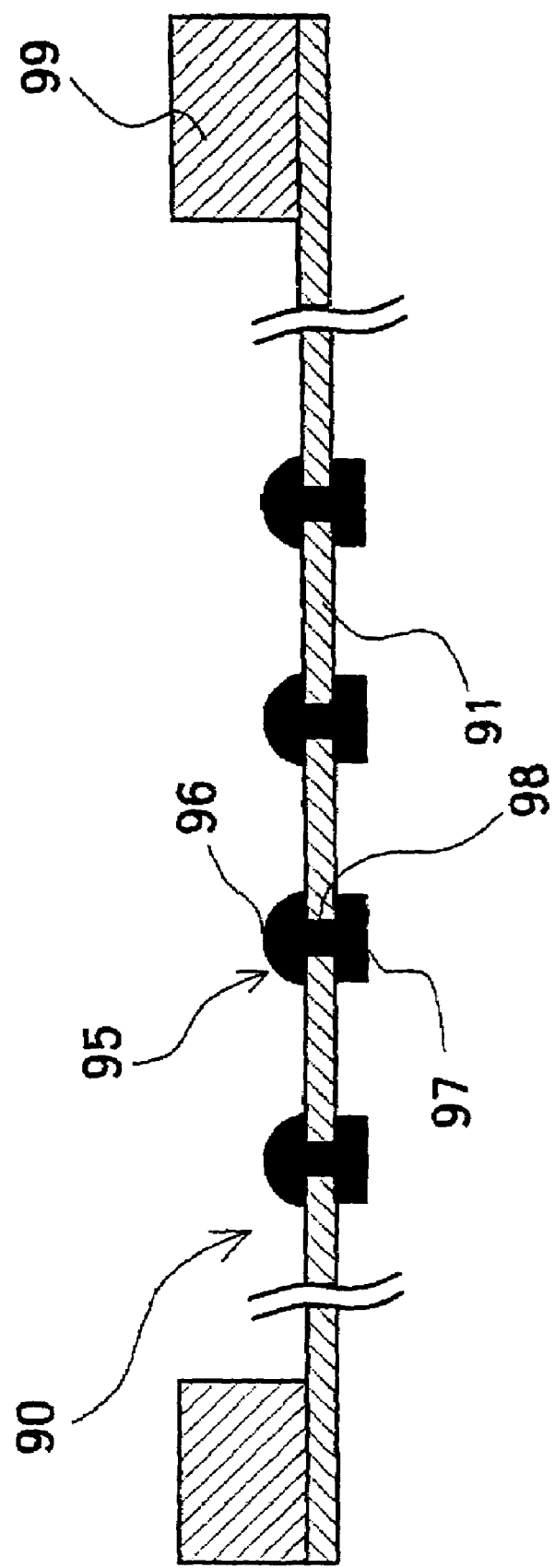
FIG. 39 is a sectional view showing the conventional sheet-like probe using a ring-shaped support plate.
Figure 40:
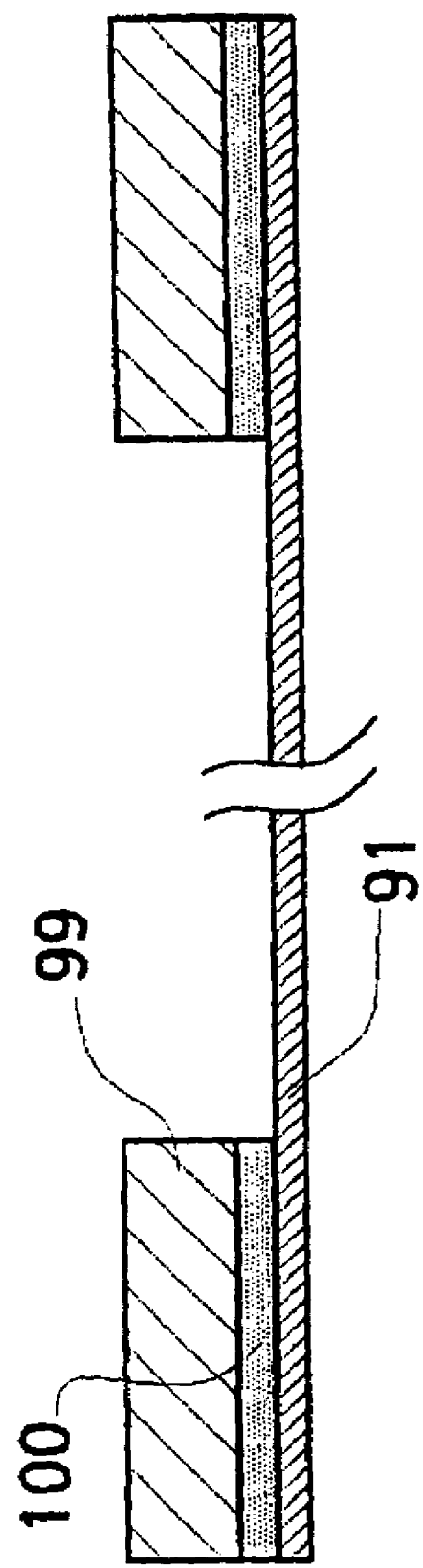
FIG. 40 is a schematic sectional view showing a method of bonding a ring-shaped support plate to the conventional sheet-like probe.

In accordance with structures shown in FIGS. 32 and 33, there was fabricated a frame plate 31 having a diameter of 8 inches which includes 966 openings 32 formed corresponding to each electrode region to be inspected in the wafer W1 for a test by the following conditions.

The material of the frame plate 31 is cover (a coefficient of linear thermal expansion of $5 \times 10^{-6}$/K) and has a thickness of 60 μm.

Each of the openings 32 has a dimension of 3600 μm in a transverse direction (a lateral direction in FIGS. 32 and 33) and a dimension of 900 μm in a longitudinal direction (a vertical direction in FIGS. 32 and 33).

Two openings 32 of the frame plate 31 are formed for one integrated circuit L formed on the wafer for a test as shown in FIG. 33 and the openings 32 of the frame plate 31 provided for the same integrated circuit L are disposed in a pitch of 2000 μm at a distance between centers (the vertical direction in FIG. 33).

A circular air inflow hole 33 is formed in a central position between the openings 32 which are adjacent to each other in a longitudinal direction and has a diameter of 1000 μm.

(4) Preparation of Molding Material for Anisotropically Conductive Sheet:

30 parts by weight of conductive particles were added to and mixed with 100 parts by weight of the addition type liquid silicone rubber. Thereafter, the resultant mixture was subjected to a defoaming treatment by a pressure reduction, thereby preparing a molding material for an anisotropically conductive sheet.

In the above-described process, the addition type liquid silicone rubber which was used is of a two-liquid type containing liquids A and B having a viscosity of 250 Pa·s respectively, and a cured product thereof has a compression set of 5%, a durometer A hardness of 32 and a tear strength of 25 kN/m.

The characteristics of the addition type liquid silicone rubber and the cured product were measured in the following manner.

(i) For the viscosity of the addition type liquid silicone rubber, a value at 23±2° C. was measured by means of a Brookfield type viscometer.

(ii) The compression set of the cured product of the silicone rubber was measured in the following manner.

The liquids A and B in the addition type liquid silicone rubber of the two-liquid type were stirred and mixed in proportions that their amounts are equal to each other. After this mixture was then poured into a mold and was subjected to a defoaming treatment by a pressure reduction, a curing treatment was conducted under conditions of 120° C. for 30 minutes, thereby producing a columnar body formed of a cured product of the silicone rubber which has a thickness of 12.7 mm and a diameter of 29 mm. The columnar body was post-cured under conditions of 200° C. for 4 hours. The columnar body thus obtained was used as a specimen to measure a compression set at 150±2° C. in accordance with JIS K 6249.

(iii) A tear strength of the cured product of the silicone rubber was measured in the following manner.

The curing treatment and post curing for the addition type liquid silicone rubber was conducted under the same conditions as in (ii), thereby producing a sheet having a thickness of 2.5 mm.

A crescent type specimen was prepared by punching this sheet to measure a tear strength at 23±2° C. in accordance with the JIS K 6249.

(iv) For a durometer A hardness, five sheets produced in the same manner as in (iii) were stacked on one another, and the resultant laminate body was used as a specimen to measure a value at 23±2° C. in accordance with the JIS K 6249.

(5) Fabrication of Anisotropically Conductive Connector

The frame plate 31 fabricated in the (3) and the molding material prepared in the (4) were used to form 966 anisotropically conductive sheets 35 having such a structure as to be disposed to close the respective openings 32 of the frame plate 31 and to be fixed and supported onto an opening edge portion of the frame plate 31 as shown in FIG. 28 in accordance with the method described in the Japanese Laid-Open Patent Publication No. 2002-324600. Thus, the anisotropically conductive connector 30 was manufactured.

A treatment for curing the molding material layer was carried out for one hour at 100° C. while a magnetic field of 2T acts in the direction of a thickness by means of an electromagnet.

More specific description will be given to the anisotropically conductive sheet 35 thus obtained. Each of the anisotropically conductive sheets 35 has a dimension in a transverse direction of 6000 μm and a dimension in a longitudinal direction of 2000 μm, and 26 conducting portions 36 are arranged in a line in a transverse direction at a pitch of 120 μm. In addition, each of the conducting portions 36 has a dimension in a transverse direction of 60 μm, a dimension in a longitudinal direction of 200 μm, and a thickness of 150 μm. Moreover, the projected portion 38 has a projection height of 25 μm and the insulating portion 37 has a thickness of 100 μm.

Moreover, the conducting portion 36 for non-connection is disposed between the conducting portion 36 positioned on an outermost side in the transverse direction and an opening edge of the frame plate 31.

Each of the conducting portions 36 for non-connection has a dimension in a transverse direction of 60 μm, a dimension in a longitudinal direction of 200 μm, and a thickness of 150 μm.

Furthermore, the content rate of the conductive particles in the conducting portion 36 in each anisotropically conductive sheet 35 was examined. All of the conducting portions 36 had a volume fraction of approximately 25%.

Thus, 12 anisotropically conductive connectors in total were manufactured.

These anisotropically conductive connectors are set to be "an anisotropically conductive connector C1" to "an anisotropically conductive connector C12".

<Fabrication of Circuit Board for Inspection>

Alumina ceramics (a coefficient of linear thermal expansion of $4.8 \times 10^{-6}$/K) was used as a board material and a circuit board 20 for inspection which is provided with an inspection electrode 21 was fabricated in accordance with a pattern corresponding to a pattern of an electrode to be inspected in the wafer W1 for a test.

The circuit board 20 for an inspection takes a rectangular shape having a whole dimension of 30 cm×30 cm, and the inspection electrode has a dimension in a transverse direction of 60 μm and a dimension in a longitudinal direction of 200 μm. The circuit board for an inspection thus obtained is set to be "a circuit board T1 for an inspection".

<Evaluation of Sheet-Like Probe>

(1) Test 1 (Insulating Property between Adjacent Electrode Structures)

For each of sheet-like probes M1 and M2, sheet-like probes N1 and N2, and sheet-like probes O1 and O2, an insulating property between adjacent electrode structures was evaluated in the following manner.

At a room temperature (25° C.), the wafer W1 for a test was disposed on a test table and the sheet-like probe was provided on a surface of the wafer W1 for a test in such a manner that each of the surface electrode portions 16 was aligned to be positioned on the electrode 7 to be inspected in the wafer W1 for a test. Moreover, the anisotropically conductive connector 30 was disposed on the sheet-like probe in such a manner that each of the conducting portions 36 was aligned to be positioned on the back electrode portion 17 of the sheet-like probe. In addition, a circuit board T1 for an inspection was disposed on the anisotropically conductive connector 30 in such a manner that each of the inspection electrodes 21 was aligned to be positioned on the conducting portion 36 of the anisotropically conductive connector 30. Furthermore, the circuit board T1 for an inspection was pressurized downward at a load of 130 kg (a load to be applied per electrode structure is approximately 5 g on average).

The anisotropically conductive connector 30 shown in the following Table 1 was used.

A voltage was sequentially applied to each of 2611-6 inspection electrodes 21 in the circuit board T1 for an inspection. Furthermore, an electric resistance between the inspection electrode having the voltage applied thereto and another inspection electrode was measured as an electric resistance between the electrode structures 15 in the sheet-like probe (which will be hereinafter referred to as an "insulating resistance") As a result, a rate of any of all measuring points on which the insulating resistance is equal to or lower than 10 MΩ (which will be hereinafter referred to as an "insulating failure rate") were obtained.

In the case in which the insulating resistance is equal to or lower than 10 MΩ, it is hard to practically carry out use in an electrical inspection for an integrated circuit formed on a wafer.

The above results are shown in the following Table 1.

TABLE 1

|  | Sheet-like probe | Anisotropically conductive connector | Insulating failure rate |
| --- | --- | --- | --- |
| Example 1 | M1 | C1 | 0% |
|  | M2 | C2 | 0% |
| Example 2 | N1 | C3 | 0% |
|  | N2 | C4 | 0% |
| Comparative example 1 | O1 | C5 | 0% |
|  | O2 | C6 | 0% |

(2) Test 2 (Connecting Stability of Electrode Structure):

For each of sheet-like probes M3 and M4, sheet-like probes N3 and N4, and sheet-like probes O3 and O4, the connecting stability of the electrode structure 15 to the electrode to be inspected was evaluated in the following manner.

At a room temperature (25° C.), a wafer W2 for a test was disposed on a test table having an electric heater and the sheet-like probe was provided on a surface of the wafer W2 for a test in such a manner that each of the surface electrode portions 16 was aligned to be positioned on the electrode 7 to be inspected in the wafer W2 for a test. Furthermore, the anisotropically conductive connector 30 was disposed on the sheet-like probe in such a manner that each of the conducting portions 36 was aligned to be positioned on the back electrode portion 17 of the sheet-like probe. Moreover, the circuit board T1 for an inspection was disposed on the anisotropically conductive connector 30 in such a manner that each of the inspection electrodes 21 was aligned to be positioned on the conducting portion 36 of the anisotropically conductive connector 30. Furthermore, the circuit board T1 for an inspection was pressurized downward at a load of 130 kg (a load to be applied per electrode structure is approximately 5 g on average).

The anisotropically conductive connector 30 shown in the following Table 2 was used.

Referring to the 26116 inspection electrodes 7 in the circuit board T1 for an inspection, an electric resistance was sequentially measured between two inspection electrodes 21 connected electrically to each other through the sheet-like probe, the anisotropically conductive connector 30 and the wafer W2 for a test. In addition, a value to be a half of the electric resistance value thus measured was recorded as an electric resistance between the inspection electrode 21 of the circuit board T1 for an inspection and the electrode 7 to be inspected in the wafer W2 for a test (which will be hereinafter referred to as "a conducting resistance"). As a result, a rate of any of all measuring points on which the conducting resistance is equal to or higher than 1Ω (which will be hereinafter referred to as "a connection failure rate") were obtained.

This operation is set to be "an operation (1)".

Subsequently, the pressurization for the circuit board T1 for an inspection was released and the temperature of the test table was then raised to 125° C. and was left until the temperature was stabilized. Thereafter, the circuit board T1 for an inspection was pressurized downward at a load of 130 kg (a load to be applied per electrode structure is approximately 5 g on average). As a result, a connecting failure rate in the same manner as in the operation (1) described above were obtained. This operation is set to be "an operation (2)".

Next, the test table was cooled to a room temperature (25° C.) and the pressurization for the circuit board T1 for a inspection was released. This operation is set to be "an operation (3)".

The operations (1), (2) and (3) were set to be one cycle and 200 cycles in total were carried out continuously.

In the case in which the conducting resistance is equal to or higher than 1Ω, it is hard to practically carry out use in an electrical inspection for an integrated circuit formed on a wafer.

The above results are shown in the following Table 2.

TABLE 2

|  | Sheet-like probe | Anisotropically conductive connector | Temperature | Connection failure rate Number of cycles | | | | |
| --- | --- | --- | --- | --- | --- | --- | --- | --- |
|  |  |  |  | Once | 10 times | 50 times | 100 times | 200 times |
| Example 1 | M3 | C7 | 25° C. | 0% | 0% | 0% | 0% | 0% |
|  |  |  | 125° C. | 0% | 0% | 0% | 0% | 0% |
|  | M4 | C8 | 25° C. | 0% | 0% | 0% | 0% | 0% |
|  |  |  | 125° C. | 0% | 0% | 0% | 0% | 0% |

TABLE 2-continued

| | Sheet-like probe | Anisotropically conductive connector | Temperature | Connection failure rate Number of cycles | | | | |
|---|---|---|---|---|---|---|---|---|
| | | | | Once | 10 times | 50 times | 100 times | 200 times |
| Example 2 | N3 | C9 | 25° C. | 0% | 0% | 0% | 0% | 0% |
| | | | 125° C. | 0% | 0% | 0% | 0% | 0% |
| | N4 | C10 | 25° C. | 0% | 0% | 0% | 0% | 0% |
| | | | 125° C. | 0% | 0% | 0% | 0% | 0% |
| Comparative example 1 | O3 | C11 | 25° C. | 1% | 2% | 2% | 5% | 10% |
| | | | 125° C. | 5% | 6% | 8% | 15% | 19% |
| | O4 | C12 | 25° C. | 0% | 1% | 1% | 8% | 11% |
| | | | 125° C. | 5% | 7% | 10% | 18% | 21% |

After the test 2 was ended, moreover, the sheet-like probe M3 (of the example and comparative example) was observed. Consequently, each electrode structure 15 did not slip from the insulating film 51, and a deformation of the surface electrode portion was hardly observed, thereby finding a high durability obtained.

The invention claimed is:

1. A sheet-like probe comprising: a contact film including an insulating layer, and a plurality of electrode structures disposed on the insulating layer apart from each other in a planar direction thereof and extended to penetrate in a direction of a thickness of the insulating layer; and a perforated film,
    wherein the contact film is supported to penetrate in each position of a plurality of through holes formed in the perforated film, the perforated film and a peripheral edge portion of the contact film are integrated with each other in such a manner that the insulating layer made of a flexible resin is included in a fine hole of the perforated film,
    and wherein each of the electrode structures include: a surface electrode portion exposed from a surface of the insulating layer and projected from the surface of the insulating layer, a back electrode portion exposed from a back face of the insulating layer, a short circuit portion extended to penetrate through the insulating layer in a direction of a thickness thereof continuously from a base end portion of the surface electrode portion and coupled to the back electrode portion, and a holding portion extended outward along the surface of the insulating layer continuously from the base end portion of the surface electrode portion, and
    wherein the perforated film is provided with a ring-shaped support plate bonded and fixed to a peripheral edge portion thereof, and the perforated film and the ring-shaped support plate are bonded and fixed by an adhesive impregnated into the perforated film in a contact state thereof with each other.

2. The sheet-like probe according to claim 1, wherein the perforated film is a mesh or a non woven fabric made of an organic fiber.

3. The sheet-like probe according to claim 1, wherein the sheet-like probe is used for carrying out an electrical inspection for a plurality of integrated circuits formed on a wafer in a state of the wafer.

4. A probe card for electrically connecting a circuit device to be an inspecting object to a tester, comprising: a circuit board for an inspection which has a plurality of inspection electrodes formed thereon corresponding to an electrode to be inspected in the circuit device to be the inspecting object; an anisotropically conductive connector disposed on the circuit board for an inspection; and
    the sheet-like probe according to any of claims 1 or 2-3 in which is disposed on the anisotropically conductive connector.

5. The probe card according to claim 4, wherein the circuit device to be the inspecting object is a wafer having a large number of integrated circuits formed thereon, and
    the anisotropically conductive connector includes:
    a frame plate having a plurality of openings formed thereon corresponding to an electrode region on which electrodes to be inspected in all or a part of integrated circuits formed on a wafer to be the inspecting object are disposed; and
    an anisotropically conductive sheet disposed to close each of the openings of the frame plate.

6. An apparatus for inspecting a circuit device comprising the probe card according to claim 4.

7. A method of inspecting a wafer comprising the steps of:
    electrically connecting each of the integrated circuits of a wafer having a plurality of integrated circuits formed thereon to a tester through the probe card according to claim 4; and
    electrically inspecting each of the integrated circuits.

* * * * *